(12) United States Patent
Hashimoto et al.

(10) Patent No.: US 9,075,319 B2
(45) Date of Patent: Jul. 7, 2015

(54) MASK BLANK AND TRANSFER MASK

(75) Inventors: Masahiro Hashimoto, Tokyo (JP); Hiroyuki Iwashita, Tokyo (JP); Yasushi Okubo, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 179 days.

(21) Appl. No.: 13/260,295

(22) PCT Filed: Mar. 30, 2010

(86) PCT No.: PCT/JP2010/002300
§ 371 (c)(1),
(2), (4) Date: Nov. 7, 2011

(87) PCT Pub. No.: WO2010/113475
PCT Pub. Date: Oct. 7, 2010

(65) Prior Publication Data
US 2012/0100466 A1 Apr. 26, 2012

(30) Foreign Application Priority Data
Mar. 31, 2009 (JP) ................................. 2009-085090

(51) Int. Cl.
G03F 1/46 (2012.01)
G03F 1/50 (2012.01)
G03F 1/58 (2012.01)

(52) U.S. Cl.
CPC .. G03F 1/46 (2013.01); G03F 1/50 (2013.01); G03F 1/58 (2013.01)

(58) Field of Classification Search
CPC ................ G03F 1/46; G03F 1/50; G03F 1/58
USPC ......................................................... 430/4–5
See application file for complete search history.

(56) References Cited

U.S. PATENT DOCUMENTS

| 2007/0020534 A1* | 1/2007 | Yoshikawa et al. ................ 430/5 |
| 2007/0259276 A1* | 11/2007 | Yoshikawa et al. ................ 430/5 |
| 2008/0063950 A1* | 3/2008 | Yoshikawa et al. ................ 430/5 |

FOREIGN PATENT DOCUMENTS

| JP | 2006-048033 A | 2/2006 |
| JP | 2006-078825 A | 3/2006 |
| JP | 2006-146152 A | 6/2006 |
| JP | 2007-033470 A | 2/2007 |
| JP | 2007-233179 A | 9/2007 |
| JP | 2007-241136 A | 9/2007 |

OTHER PUBLICATIONS

Azpiroz, Jaione Tirapu, et al., "Massively-Parallel FDTD Simulations to Address Mask Electromagnetic Effects in Hyper-NA Immersion Lithography," Proc. of SPIE, 2008, pp. 69240Y1-69240Y15, vol. 6924.

* cited by examiner

Primary Examiner — Christopher Young
(74) Attorney, Agent, or Firm — Sughrue Mion, PLLC

(57) ABSTRACT

A mask blank and transfer mask that overcomes problems caused by an electromagnetic field (EMF) effect when a DRAM half pitch (hp) is 32 nm or less specified in semiconductor device design specifications. The mask blank is used in manufacturing a transfer mask to which ArF exposure light is applied, and includes a light shielding film 10 having a multilayer structure. The multilayer structure includes a light shielding layer 11 and a surface anti-reflection layer 12 formed on a transparent substrate 1. An auxiliary light shielding film 20 is formed on the light shielding film 10. The light shielding film 10 has a thickness of 40 nm or less and an optical density of 2.0 or more to 2.7 or less for exposure light. The optical density is 2.8 or more for exposure light in the multilayer structure of the light shielding film 10 and the auxiliary light shielding film 20.

14 Claims, 30 Drawing Sheets

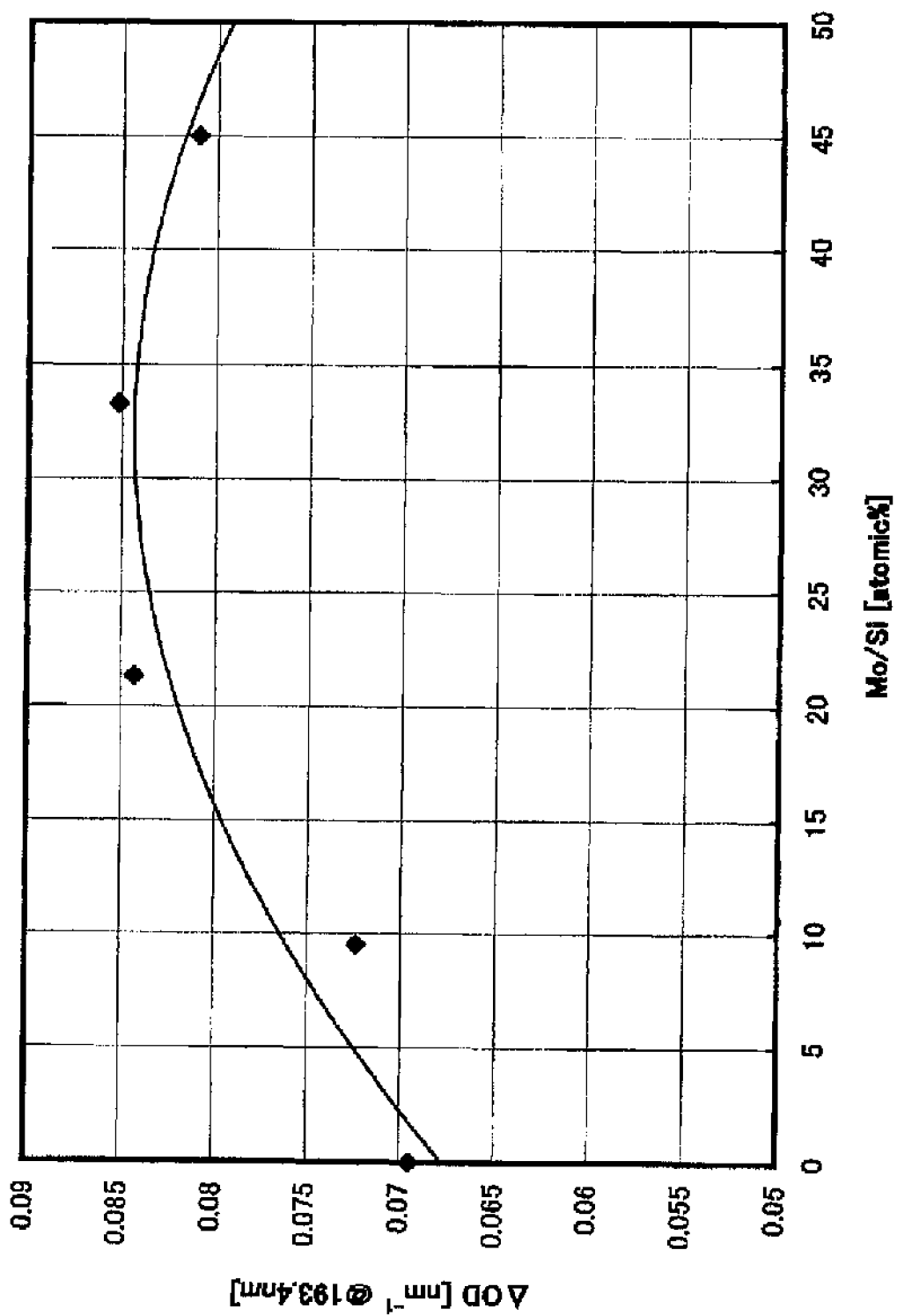

Example 4-1

FIG. 17 Example 4-2

Example 4-2

Example 4-3

Example 6-2

MASK BLANK AND TRANSFER MASK

CROSS REFERENCE TO RELATED APPLICATIONS

This application is a 35 U.S.C §371 national stage filling of International Application No. PCT/JP2010/002300, filed Mar. 30, 2010, the entire contents of which are incorporated by reference herein, which claims priority to Japanese Patent Application No. 2009-085090, filed on Mar. 31, 2009, the entire contents of which are incorporated by reference herein.

TECHNICAL FIELD

The present disclosure relates to mask blanks and a transfer masks for use in the manufacture of devices such as semiconductor devices.

BACKGROUND

Miniaturization of devices such as semiconductor devices is being accelerated because of improved performance and functionality (high speed operation, low power consumption and so on) and low cost. Lithography supports such miniaturization, whereas transfer mask technology is the key technology along with exposure devices and resist materials.

In recent years, the DRAM half pitch (hp) 45 nm to 32 nm generation in semiconductor device design specifications is being developed. This corresponds to ¼ to ⅙ of a wavelength of 193 nm of ArF excimer laser exposure light. In particular, the generations after the hp 45 nm generation is insufficient when used only with the application of conventional resolution enhancement technology (RET) such as phase shift, oblique incidence illumination and pupil filtering, and an optical proximity correction (OPC) technology, and accordingly requires a super high numerical aperture (NA) technology (immersion lithography).

However, circuit patterns required for semiconductor manufacture are sequentially exposed to semiconductor wafers through a plurality of photomasks (reticles). For example, a reduction projection type exposing device (exposurer) set with a certain reticle mainly includes a type of projectively exposing repeated patterns by displacing regions to be projected on a wafer being displaced from each other in turn (step and repeat type) or a type of projectively exposing repeated patterns by synchronously scanning reticles and wafers to a projection optical system (step and scan type). These types are used to form a predetermined number of integrated circuit chip regions in a semiconductor wafer.

A photomask (reticle) has a region where transfer patterns are formed and also peripheral regions. The peripheral regions, which are surrounding areas along the four sides of the photomask (reticle), are exposed and transferred in a superimposed manner in order to increase the number of integrated circuit chips to be formed when transfer patterns on the photomask (reticle) are sequentially exposed with regions to be projected on a wafer while being displaced from each other in turn. Typically, a mask stage of an exposurer is provided with a shielding plate to shield irradiation of exposure light to the peripheral regions. However, shielding by exposure light using the shielding plate has problems in that it limits position precision and light diffraction effects, thus making it difficult to avoid leakage of exposure light (being referred to as "light leakage") into the peripheral regions. If the light leakage into the peripheral regions transmits through the photomask, there is a fear of sensitizing resists on the wafer. For the purpose of preventing the resists on the wafer from being sensitized due to such superimposing exposure, a light shielding band (a band of light shielding material or a ring of light shielding material) is formed in the peripheral regions of the photomask during mask manufacturing. In addition, in an area where the light shielding band of the peripheral regions is formed, a typical optical density (OD) value is preferably 3 or more, necessarily at least 2.8 or so in order to suppress sensitization of the resists on the wafer due to the superimposing exposure.

In the case of a binary mask, a light shielding film has high light shieldability and accordingly has a light shielding film pattern formed in a transfer pattern area while playing a role of a light shielding band in peripheral regions of the transfer pattern area.

Thinning the light shielding film decreases an optical density (OD) value. For a chromium-based light shielding film, a minimum total film thickness is required to be 60 nm or so in order to achieve OD=3 that is generally required, thus making it difficult to significantly thin the film (for example, see paragraph [0005] in Patent Document 1).

Even in the case of a so-called binary type photomask including a light shielding film having a multilayer structure composed of MoSi-based materials, for example, a light shielding film having a multilayer structure composed of main MoSiN light shielding layer/MoSiON anti-reflection layer formed on a substrate, a minimum total film thickness of 60 nm or so is required in order to achieve OD=2.8 which is typically required, thus making it difficult to significantly thin the film (for example, see Patent Document 2).

Lithographic techniques of forming minute and highly-dense transfer patterns on one transfer mask have begun to reveal limitations. A double patterning/double exposure technique has been developed as one of solution to the problems of the lithographic techniques. The double patterning/double exposure technique divides one minute and highly-dense transfer pattern into two relatively sparse patterns (first pattern and second pattern) and prepares a transfer mask for each of the two patterns. This double patterning/double exposure technique is a lithographic technology of transferring minute and highly-dense transfer patterns onto resists on a wafer using a set of two transfer masks.

RELATED TECHNICAL DOCUMENT

Patent Document

Patent Document 1: Japanese Patent Publication Laid-Open No. 2007-241136
Patent Document 2: Japanese Patent Publication Laid-Open No. 2006-78825

SUMMARY

The binary mask (that is the generation after the DRAM half pitch (hp) 32 nm generation mentioned in semiconductor device design specifications) has problems in that i) the line width of the transfer patterns on the transfer mask is smaller than a wavelength of 193 nm of the ArF exposure light, and ii) the large film thickness of the light shielding film pattern of the transfer pattern area (main pattern area) increases a bias due to an electromagnetic field (EMF) effect when the resolution enhancement technology (RET) is adopted to cope with such line width. Such a bias due to the EMF effect has a great effect on CD precision of the transfer pattern line width of the resists on the wafer. Accordingly, there is a need to correct the transfer pattern formed in the transfer mask to suppress an effect by the EMF bias through simulation of the EMF effect. Correction of the transfer pattern becomes complicated with an increase in the EMF bias. Furthermore, a corrected transfer pattern becomes complicated with an increase in the EMF bias, which may impose a great load on manufacture of the transfer mask. This increase in the EMF bias has caused such new problems.

On the other hand, for the double patterning/double exposure technique, since line width of a transfer pattern formed in one transfer mask is relatively large, the above problems due to the EMF effect are unlikely to occur. However, in particular, when using the double exposure technique, the same resists on the wafer is exposed twice using two transfer masks. For exposure of resists on a wafer using one transfer mask (which is called "single exposure") in the conventional reduction projection exposurer, superimposing exposure portions on the wafer due to light leakage into peripheral regions of transfer patterns are exposed up to four times. Accordingly, even when these portions are exposed four times by light passing through the light shielding band, it was sufficient if a level of optical density in the light shielding band can be high enough as not to sensitize the resists on the wafer. On the other hand, when using double exposure, since the resists are exposed using two transfer masks, the superimposing exposure portions on the wafer are exposed up to eight times. Accordingly, a transfer mask used in the double exposure technique needs to have a light shielding band that secures a level of optical density high enough as not to sensitize the resists on the wafer even when these portions are exposed eight times to exposure light passing through the light shielding band. In addition, it is considered that optical density required for the light shielding band is at least 3.1.

In order to secure an optical density of 3.1 or more, there is a need to set the thickness of the light shielding film to be larger than conventional. In the double exposure technique, since it is to realize line width of a transfer pattern, which was difficult to be achieved before then, the transfer pattern line width has little margin even when the transfer pattern is divided into two relatively sparse transfer patterns. Increase in the thickness of the light shielding film cannot overcome the EMF effect. Although a conventional film thickness could secure optical density required for a light shielding band used for the double exposure technique, as it is expected that transfer patterns continues to be miniaturized and highly-densified in the future, it is easily envisaged that the line width of the two relatively sparse transfer patterns will cause the same problem as the EMF effect that is problematic in the transfer mask for the current single exposure.

Optical simulation in a binary mask design has the main purpose of calculating an amount of correction (bias amount) of shape of correction patterns or pattern line width of OPC or SRAF to be further arranged since a designed transfer pattern is exposed and transferred onto an object (for example, a resist on a wafer). TMA (Thin Mask Analysis) is a type of optical simulation of this mask design. TMA is to calculate an amount of correction of shape of correction patterns or pattern line width on the presumption that a light shielding film of a transfer mask is an ideal film having a thickness of zero and a predetermined optical density. Since TMA is a simple simulation performed for the ideal film, TMA has a great advantage of small simulation computational load. However, since this simulation does not consider an EMF effect, using only the results of the TMA simulation is insufficient for recent fine patterns that are increasingly affected by the EMF effect.

The present inventors have carefully reviewed the problem of the electromagnetic field (EMF) effect. First, the inventors noted that a light shielding film that is insignificantly affected by the EMF effect facilitates TMA simulation and hence may decrease a load of correction computation of an EMF bias. In addition, from studies on the light shielding film that is insignificantly affected by the EMF effect, we have found through a simulation that a light shielding film having a thickness of 40 nm or less in a binary mask shows an effect of noticeable improvement in reduction of the EMF bias. That is, if the thickness of the light shielding film is 40 nm or less, a transfer pattern correction computational load spent to correct an effect of the EMF bias is reduced and accordingly the load to manufacture a transfer mask is reduced. In addition through a simulation, it has been proven that a light shielding film having a thickness of 35 nm can significantly reduce the EMF bias. However, although metal silicide-based (MoSi-based, WSi, etc.) material that is considered to have a high optical density at the same film thickness is selected, we have found that it is not easy to satisfy conditions where an optical density is 2.8 and the film thickness is 40 nm or less. In addition, materials having a high optical density including the metal silicide-based material have high reflectivity for exposure light. There is a need for a light shielding film to have low reflectivity of a predetermined value or less (for example, 40% or less) for exposure light to an exposed surface of the light shielding film as a transfer pattern after a transfer mask is manufactured. For the purpose of thinness of the film, the light shielding film needs to have at least a two-layer structure of a light shielding layer and a surface anti-reflection layer. The surface anti-reflection layer makes an insignificant contribution to an optical density since this layer is required to secure certain transmittance in order to reduce surface reflection.

The present inventors have examined, through experiments and simulations, the practicality of a light shielding film having an optical density of 2.8 or more required for light shielding films of conventional binary transfer masks, desirable surface reflectivity of 30% or less for exposure light, and a film thickness of 40 nm or less. The examination proved that it is difficult for existing film materials to satisfy all conditions. However, it also has been found that, if the lower limit of an optical density of a light shielding film can be lower than conventional (for example, 2.0 or more), a light shielding film having desirable surface reflectivity of 30% or less for exposure light and a film thickness of 40 nm or less can be realized. However, when an optical density of a light shielding film of a binary transfer mask is lowered, no examination has been conducted to determine whether or not an object to be transferred (for example, a resist on a wafer, etc.) can obtain a sufficient contrast comparable to those in the past when the transfer mask is exposed and transferred onto the object. It is believed that this is because conventional binary transfer masks have little necessity of a light shielding film so thin as to force an optical density (OD) to be reduced or it is the simplest to use a light shielding film that forms a transfer pattern, as it is, to form a light shielding band in consideration of mask manufacturing processes. In this respect, the present inventors have discovered through experiments and simulations that a considerable contrast can be obtained even when the lower limit of an optical density is lowered than before.

The present disclosure provides some embodiments of a practical mask blank and transfer mask that shows an effect of sufficiently overcoming the problem of the electromagnetic field (EMF) effect, which can be a problem for the generation in which the DRAM half pitch (hp) is 32 nm specified in semiconductor device design specifications and later generations. The present inventors have discovered that the problem of the electromagnetic field (EMF) effect, which can be a problem for the generation in which the DRAM half pitch (hp) is 32 nm specified in semiconductor device design specifications and the later generations, can be sufficiently overcome and a desired level of film thickness and optical density can be achieved (realized) by providing a light shielding film for forming a transfer pattern in a transfer pattern area and an auxiliary light shielding film (not formed in the transfer pattern area) for assisting in forming a light shielding band (light shielding ring) in peripheral regions of the transfer pattern area, wherein the light shielding film for forming the transfer pattern in the transfer pattern area is formed to have a thickness to overcome the problem and meet the desired level and an optical density required for transfer.

The inventors have also discovered that the auxiliary light shielding film in the peripheral regions of the transfer pattern area can be used to form a light shielding band (light shielding ring) having a sufficient optical density (for example, 2.8 or more, preferably 3.0 or more) by stacking the light shielding film with the auxiliary light shielding film, and the inventors have made the present invention based on such discoveries.

(Aspect 1) According to one embodiment of the present disclosure, there is provided a mask blank for use in manufacturing a transfer mask to which ArF exposure light is applied, the mask blank includes a light shielding film having a multilayer structure. The multilayer structure includes a light shielding layer and a surface anti-reflection layer formed on a transparent substrate. An auxiliary light shielding film is formed on the light shielding film, wherein the light shielding film has a thickness of 40 nm or less and an optical density of 2.0 or more to 2.7 or less for exposure light. The light shielding layer has a thickness of 15 nm or more to 35 nm or less, and an optical density is 2.8 or more for exposure light in the multilayer structure of the light shielding film and the auxiliary light shielding film.

(Aspect 2) According to another embodiment of the present disclosure, the surface anti-reflection layer may have a thickness of 5 nm or more to 20 nm or less and a surface reflectivity of 30% or less for exposure light.

(Aspect 3) According to another embodiment of the present disclosure, the optical density for exposure light in the multilayer structure of the light shielding film and the auxiliary light shielding film may be 3.1 or more.

(Aspect 4) According to another embodiment of the present disclosure, the light shielding layer may contain transition metal silicide of 90% or more.

(Aspect 5) According to another embodiment of the present disclosure, the transition metal silicide in the light shielding layer may be molybdenum silicide and the content of molybdenum may be 9 atom % or more to 40 atom % or less.

(Aspect 6) According to another embodiment of the present disclosure, the surface anti-reflection layer may be made of material mainly containing a transition metal silicide.

(Aspect 7) According to another embodiment of the present disclosure, the auxiliary light shielding film may have a resistance to etching gas used to etch the light shielding film.

(Aspect 8) According to another embodiment of the present disclosure, the auxiliary light shielding film may contain at least one of nitrogen and oxygen in addition to chromium, the content of chromium in the film may be 50 atom % or less, and a thickness of the film may be 20 nm or more.

(Aspect 9) According to another embodiment of the present disclosure, there is provided a transfer mask manufactured using a mask blank of any one of the above-described embodiments.

According to the present disclosure in some embodiments, it is possible to provide a mask blank and transfer mask manufactured using lithography applying ArF exposure light, which is capable of sufficiently overcoming many problems of the electromagnetic field (EMF) effect, which can be a problem for the generation in which the DRAM half pitch (hp) is 32 nm specified in semiconductor device design specifications and the later generations, and further problems of light leakage due to superimposing exposure, by securing a minimal optical density of a light shielding film to be thinned, the minimal optical density being required to form a transfer pattern in an object to be transferred (for example, a resist on a wafer, etc.), and securing an optical density of a light shielding band required to reduce an effect of light leakage due to superimposing exposure, the optical density being required depending on a multilayer structure of a light shielding film and an auxiliary light shielding film.

BRIEF DESCRIPTION OF THE DRAWINGS

FIG. 6 is a view showing a relationship between the content of molybdenum and optical density per unit film thickness in a thin film made of molybdenum silicide metal.

EXPLANATION OF REFERENCE NUMERALS

1: transparent substrate, 10: light shielding film, 11: light shielding layer, 12: surface anti-reflection layer, 20: auxiliary light shielding film, 30: etching mask film, 40: second etching mask film, 50: etching stopper and mask layer, 60: adhesion enhancement layer, 70: etching mask film, 100: resist film

DETAILED DESCRIPTION

The present disclosure will now be described in detail.

A mask blank of the present disclosure is a mask blank used for manufacturing a transfer mask to which ArF exposure light is applied. The mask blank is provided with a light shielding film having a multilayer structure composed of a light shielding layer and a surface anti-reflection layer, which are formed on a transparent substrate, and an auxiliary light shielding film formed on the light shielding film, in which the thickness of the light shielding film is 40 nm or less, its optical density for the exposure light is 2.0 or more to 2.7 or less, the thickness of the light shielding layer is 15 nm or more to 35 nm or less, and the optical density is 2.8 or more for the exposure light of the multilayer structure of the light shielding film and the auxiliary light shielding film.

In addition, in the mask blank of the present disclosure, it is preferable in some embodiments that the thickness of the surface anti-reflection layer is 5 nm or more to 20 nm or less and its surface reflectivity for the exposure light is 30% or less.

Such configuration shows an effect of sufficiently overcoming the problem of the electromagnetic field (EMF) effect, which can be a problem for the generation in which the DRAM half pitch (hp) is 32 nm specified in semiconductor device design specifications, and the later generations and provides a mask blank and a transfer mask that are capable of sufficiently overcoming the problem of light leakage in superimposing exposure.

Figure 1:
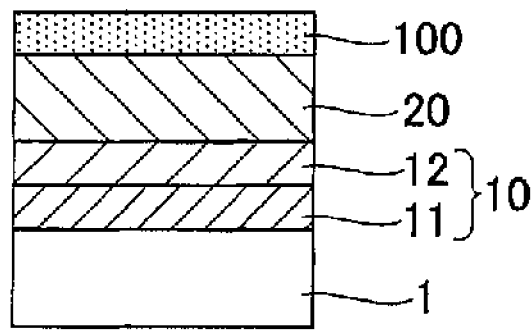
FIG. 1 is a schematic sectional view showing a first embodiment of a mask blank of the present invention.

For example, as shown in FIG. 1, the mask blank of the present disclosure includes a light shielding film 10 having a multilayer structure composed of a light shielding layer 11 and a surface anti-reflection layer 12, which are formed on a transparent substrate 1, an auxiliary light shielding film 20 formed on the light shielding film 10, and a resist film 100.

In the present disclosure, in lithography to which ArF exposure light is applied, the light shielding film 10 is a film having both of film thickness and optical density to satisfy a demand level by overcoming the problem of the electromagnetic field (EMF) effect, which can be a problem for the DRAM half pitch (hp) is 32 nm generation and later generations. In this case, it is important to determine the film thickness and optical density of the light shielding film 10 while considering contributions due to small film thickness in overcoming the problem of the electromagnetic field (EMF) effect and an effect of low optical density on transfer.

In considering the contribution of small film thickness to overcome the problem of the electromagnetic field (EMF) effect and optical density required for transfer pattern regions, an upper limit of the thickness of the light shielding film 10 is in some embodiments preferably 40 nm or less.

In considering the contribution of small film thickness to overcome the problem of the electromagnetic field (EMF) effect, the thickness of the light shielding film 10 is in other embodiments preferably 35 nm or less, more preferably 30 nm or less.

In consideration of an effect of low optical density on transfer, a lower limit of the optical density of the light shielding film 10 is in some embodiments preferably 2.0 or more, more preferably 2.3 (0.05% in terms of transmittance) or more.

Since the optical density of the light shielding film 10 increases with an increase in the film thickness (i.e., is substantially proportional to the film thickness), the optical density of the light shielding film 10 cannot be set independent of the film thickness. That is, there is a trade-off between the film thickness and the optical density. Although it is desirable that the optical density of the light shielding film 10 should be high with the same film thickness, the optical density of the light shielding film 10 is in some embodiments preferably 2.7 or less, more preferably 2.5 or less, even more preferably 2.3 or less from the viewpoint that priority is given to a contribution of small film thickness in overcoming the problem of the electromagnetic field (EMF) effect and keeping the optical density fully restrained.

The total optical density of the light shielding film 10 is substantially attributed to the light shielding layer 11. The surface anti-reflection layer 12 is provided to prevent some exposure light reflected by a lens of a contraction optical system of an exposurer from being further reflected toward the light shielding film 10 and is adjusted to transmit some degree of the exposure light. This allows suppression of total reflection of the exposure light on the surface of the light shielding film 10 and attenuation of the exposure light using an interference effect or the like. Since the surface anti-reflection layer 12 is designed to obtain such certain transmittance, it makes little contribution on the total optical density of the light shielding film 10. In this respect, the optical density of the light shielding film 10 is essentially adjusted by the light shielding layer 11. That is, it is in some embodiments preferable to secure an optical density of 2.0 or more in the light shielding layer 11.

There is a high need in some embodiments to secure a surface reflectivity of 40% or less of the light shielding film 10 for the ArF exposure light. The surface reflectivity is preferably 30% or less, more preferably 25%, most preferably 20% or less if the total thickness of the light shielding film 10 is within an allowable range.

In order to limit the surface reflectivity to a certain value (for example, 30%) or less, the thickness of the surface anti-reflection layer 12 is needs to be 5 nm or more. In order to limit the surface reflectivity to 25% or less, the thickness of the surface anti-reflection layer 12 is preferably greater than 5 nm. In order to provide lower surface reflectivity (for example, 20% or less), the thickness of the surface anti-reflection layer 12 is preferably 7 nm or more. From a viewpoint of production stability and in consideration of reduction in the thickness of the surface anti-reflection layer 12 due to repeated transfer mask cleaning after preparation of the transfer mask, the thickness of the surface anti-reflection layer 12 is preferably 10 nm or more. In addition, the thickness of the surface anti-reflection layer 12 is preferably 20 nm or less, more preferably 17 nm or less. The thickness of the surface anti-reflection layer 12 is most preferably 15 nm or less in consideration of the thinness of the entire light shielding film 10.

In the present disclosure, in some embodiments the auxiliary light shielding film 20 should secure light shieldability of optical density of at least 2.8 or more in the multilayer structure with the light shielding film 10. For example, if the light shielding film 10 has an optical density of 2.0, the auxiliary light shielding film 20 needs to have an optical density of 0.8 or more. This is to secure the total optical density of 2.8 or more, which is a combination of the optical density of the light shielding film 10 and the optical density of the auxiliary light shielding film 20 in a light shielding band.

FIG. 1 shows one example of a mask blank according to a first embodiment of the present invention. As shown in FIG. 1, the first embodiment includes a light shielding film 10 having a multilayer structure composed of a light shielding layer 11 and a surface anti-reflection layer 12, which are formed on a transparent substrate 1, an auxiliary light shielding film 20 formed on the light shielding film 10, and a resist film 100.

Figure 2:
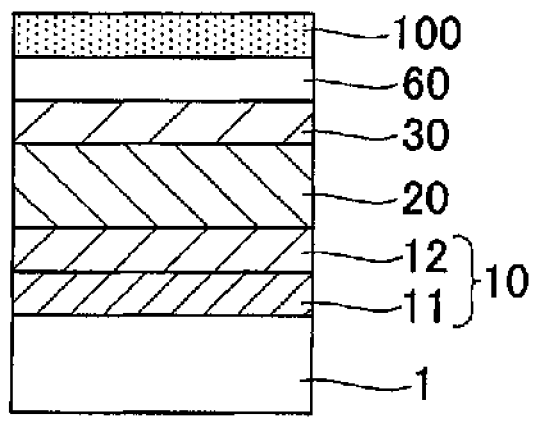
FIG. 2 is a schematic sectional view showing a second embodiment of a mask blank of the present invention.

FIG. 2 shows one example of a mask blank according to a second embodiment of the present invention. As shown in FIG. 2, the second embodiment includes a light shielding film 10 having a multilayer structure composed of a light shielding layer 11 and a surface anti-reflection layer 12, which are formed on a transparent substrate 1, an auxiliary light shielding film 20 formed on the light shielding film 10, an etching mask film (hereinafter also referred to as a "hard mask") 30 formed on the auxiliary light shielding film 20, an adhesion enhancement layer 60 formed on the etching mask film 30, and a resist film 100.

Figure 3:
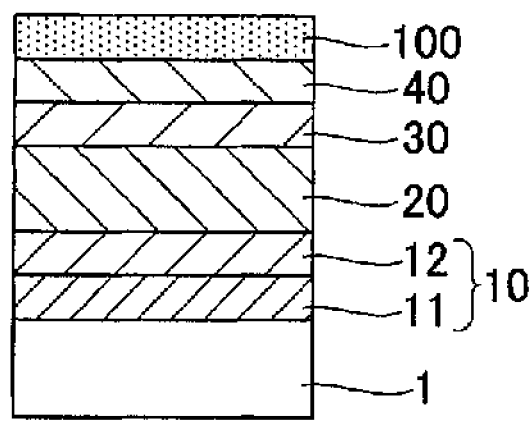
FIG. 3 is a schematic sectional view showing a third embodiment of a mask blank of the present invention.

FIG. 3 shows one example of a mask blank according to a third embodiment of the present invention. As shown in FIG. 3, the third embodiment includes a light shielding film 10 having a multilayer structure composed of a light shielding layer 11 and a surface anti-reflection layer 12, which are formed on a transparent substrate 1, an auxiliary light shielding film 20 formed on the light shielding film 10, an etching mask film 30 formed on the auxiliary light shielding film 20, a second etching mask film 40 formed on the etching mask film 30, and a resist film 100.

Figure 4:
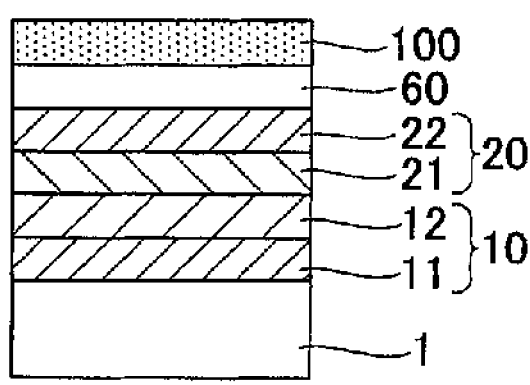
FIG. 4 is a schematic sectional view showing a fourth embodiment of a mask blank of the present invention.

FIG. 4 shows one example of a mask blank according to a fourth embodiment of the present invention. As shown in FIG. 4, the fourth embodiment includes a light shielding film 10 having a multilayer structure composed of a light shielding layer 11 and a surface anti-reflection layer 12, which are formed on a transparent substrate 1, an auxiliary light shielding film 20 having a multilayer structure composed of an etching stopper and mask layer 21 formed on the light shielding film 10 and an auxiliary light shielding layer 22 formed on the etching stopper and mask layer 21, an adhesion enhancement layer 60 formed on the auxiliary light shielding film 20, and a resist film 100.

Figure 5:
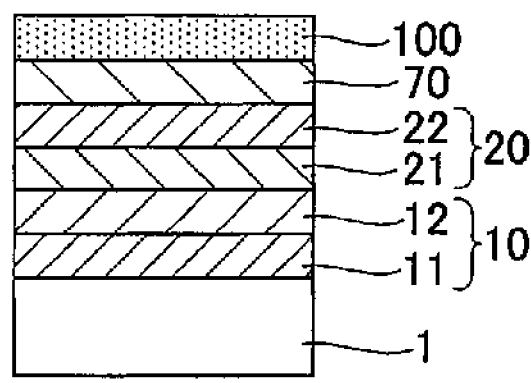
FIG. 5 is a schematic sectional view showing a fifth embodiment of a mask blank of the present invention.

FIG. 5 shows one example of a mask blank according to a fifth embodiment of the present invention. As shown in FIG. 5, the fifth embodiment includes a light shielding film 10 having a multilayer structure composed of a light shielding layer 11 and a surface anti-reflection layer 12, which are formed on a transparent substrate 1, an auxiliary light shielding film 20 having a multilayer structure composed of an etching stopper and mask layer 21 formed on the light shielding film 10 and an auxiliary light shielding layer 22 formed on the etching stopper and mask layer 21, an etching mask film 70 formed on the auxiliary light shielding film 20, and a resist film 100.

In the present disclosure, the optical density for the exposure light in the multilayer structure of the light shielding film and the auxiliary light shielding film is preferably 3.1 or more.

The above first to fifth embodiments may be applied to a binary mask blank and a transfer mask that are used for single exposure, double patterning and double exposure.

If the transfer mask is used for single exposure and double patterning, the optical density in a light shielding band constituted by the light shielding film and the auxiliary light shielding film is in some embodiments preferably 2.8 or more (0.16% or less in terms of transmittance), more preferably 3.0 or more (0.1% or less in terms of transmittance). For example, if the optical density of the light shielding film 10 is 2.0, the optical density of the auxiliary light shielding film 20 is preferably 0.8 or more, more preferably 1.0.

On the other hand, in the case of a transfer mask used in double exposure, the optical density in the light shielding band in some embodiments is preferably 3.1 or more (0.08% or less in terms of transmittance). For example, if the optical density of the light shielding film 10 is 2.0, the optical density of the auxiliary light shielding film 20 is preferably 1.1 or more. If the optical density required for the light shielding band is more securely 3.3 or more (0.05% or less in terms of transmittance), the optical density of the auxiliary light shielding film 20 is preferably 1.3 or more. If the optical density required for the light shielding band is 3.5 or more (0.03% or less in terms of transmittance), the optical density of the auxiliary light shielding film 20 is preferably 1.5 or more.

In the present disclosure, since the light shielding film 10 is separated from the auxiliary light shielding film 20, it is possible to cope with the high optical density required for a region where the light shielding band is to be formed, such as in double exposure, while having no effect on a light shielding pattern (hence an EMF property).

As used herein, the double patterning refers to patterning a wafer by twice performing a series of processes including resist coating, exposure, development and resist stripping. That is, exposure of a transfer pattern is performed once for a resist on the wafer, like the conventional single exposure, and exposure is performed for superimposing exposure portions by light leakage at a maximum of four times.

In the present disclosure, the light shielding layer 11 is preferably made in some embodiments of material having light shieldability higher than that of chromium.

The light shielding layer 11 can also be made of transition metal silicide-based or Ta-based material having light shieldability higher than that of chromium. Materials developed to further increase the optical density of the light shielding layer 11 may also be used.

In the present disclosure, examples of the transition metal used may include molybdenum (Mo), tantalum (Ta), chromium (Cr), tungsten (W), titanium (Ti), zirconium (Zr), vanadium (V), niobium (Nb), nickel (Ni), palladium (Pb), hafnium (Hf), ruthenium (Ru), rhodium (Rh), platinum (Pt), and an alloy thereof.

The light shielding layer 11 can be made of material having extreme light shieldability (high MoSi-based material). The light shielding layer 11 may employ Ta-based material (such as TaN, TaB, TaBN or the like).

In the present disclosure, the light shielding layer 11 may be made of transition metal, transition metal silicide, or compounds thereof added with nitrogen, oxygen, carbon, hydrogen, inert gas (such as helium, argon, xenon or the like). In this case, the light shielding layer 11 should satisfy the conditions that its thickness is 40 nm or less and a combination of its optical density and the optical density of the surface anti-reflection layer 12 is 2.0 or more.

In the present disclosure, the light shielding layer can be made of material containing transition metal silicide of 90% or more.

This is to obtain high light shieldability of an optical density of 2.0 or more even when the total thickness of the light shielding film 10 including the surface anti-reflection layer 12 is 40 nm or less. In addition, in order to secure this light shieldability, there is a need to set the total content of material [carbon, hydrogen, oxygen, nitrogen, inert gas (such as helium, argon, xenon or the like), and so on] other than the transition metal silicide to be less than 10% in the light shielding layer 11, which has little effect on light shieldability.

For example, if the light shielding layer 11 is made of MoSi-based material, its thickness may be 34 to 30 nm and its optical density may be 2.3 to 2.0. If the light shielding layer 11 is made of TaN-based material, its thickness may be 34 to 30 nm and its optical density may be 2.3 to 2.0. In the multilayer structure of the light shielding layer 11 made of the MoSi-based material and the surface anti-reflection layer 12, if the thickness of the light shielding film is 40 nm or less, the thickness of the light shielding layer 11 may be 15 nm or more and its optical density may be 2.0 or more. In the multilayer structure of the light shielding layer 11 made of the Ta-based material and the surface anti-reflection layer 12, if the thickness of the light shielding film is 40 nm or less, the thickness of the light shielding layer 11 may be 21 nm or more and its optical density may be 2.0 or more.

At this point in time (where material having the highest light shieldability that has been developed so far is used), for example, if the allowable optical density concerning an effect of low optical density on transfer is set to 2.0, the thickness of the light shielding film 10 making a full contribution to overcoming the problem of the electromagnetic field (EMF) effect is 30 nm.

In the mask blank of the present disclosure, the surface anti-reflection layer can be made of material consisting essentially of transition metal silicide.

The surface anti-reflection layer 12 can be made of the same material as the light shielding layer 11 although it may basically employ any material if only the multilayer structure of the surface anti-reflection layer 12 and the light shielding layer 11 can achieve surface reflectivity of a certain value or more. If the light shielding layer 11 is made of the transition metal silicide-based material, the surface anti-reflection layer 12 can be made of material (MSiO, MSiN, MSiON, MSiOC, MSiCN, MSiOCN or the like) consisting essentially of transition metal silicide (MSi). If the light shielding layer 11 is made of the Ta-based material, the surface anti-reflection layer 12 can be made of material (TaO, TaON, TaBO, TaBON or the like) consisting essentially of Ta.

In the present disclosure, the light shielding film 10 or the light shielding layer 11 can contain material including at least one of carbon (C) and hydrogen (H) in addition to transition metal (M) and silicon (Si).

The light shielding film 10 containing material including at least one of carbon (C) and hydrogen (H) in addition to transition metal (M) and silicon (Si) provides high light resistance by forming silicon carbide (Si—C bonding), transition metal carbide (M-C bonding, for example, Mo—C bonding) and silicon hydride (Si—H bonding), which are hard to be oxidized in the film when the film is sputtered. The light shielding film 10 further includes chemical bonding such as M (transition metal)-Si bonding, Si—Si bonding, M-M bonding, M-C bonding, Si—C bonding and Si—H bonding.

In the present disclosure, the use of material including at least one of carbon (C) and hydrogen (H) in addition to transition metal (M) and silicon (Si) for the light shielding film 10 or the light shielding layer 11 can achieve the following operation and effects.

(1) Even when the light shielding film 10 or the light shielding layer 11 is continuously irradiated with an ArF excimer laser with the total amount of irradiation of 30 kJ/cm$^2$ (i.e., when accumulatively irradiated with the laser in excess of conventional mask repeated use time), a thickness (or CD variation) of line width of a light shielding film pattern that occurs due to this continuous irradiation may be limited to 10 nm or less, and in some cases 5 nm or less. This may result in improvement of light resistance and hence durability of the transfer mask.

(2) Since an etching rate is increased under the existence of C and/or H (silicon carbide, transition metal carbide and silicon hydride), a resist film will not be get thick and a resolution or a pattern precision will not be get deteriorated. In addition, since etching time can be shortened, if an etching mask film is formed on the light shielding film, the etching mask may be less damaged, which may result in higher precise patterning.

(3) Since extraction of transition metal (for example, Mo) that occurs due to the accumulative irradiation of the ArF excimer laser can be reduced, it is possible to decrease deposition that may be formed on a glass substrate or film due to the extraction of the transition metal (for example, Mo). Accordingly, it is possible to suppress defects due to the deposits.

In the present disclosure, by performing sputtering film deposition using a target containing carbon or atmospheric gas containing carbon, it is possible to form a thin film containing transition metal, silicon and carbon and made of silicon carbide and/or transition metal carbide.

As used herein, examples of hydrocarbon gas may include methane ($CH_4$), ethane ($C_2H_6$), propane ($C_3H_8$), butane ($C_4H_{10}$) and so on.

Using the hydrocarbon allows introduction of carbon and hydrogen (silicon carbide, transition metal carbide and silicon hydride) in the film.

Using the target containing carbon allows introduction of only carbon (silicon carbide and transition metal carbide) in the film. This case may include using a MoSiC target, using a target containing C in one or both of a Mo target and a Si target, and using a MoSi target and a C target.

In the present disclosure, by performing sputtering film deposition using atmospheric gas containing hydrogen, it is possible to form a thin film containing transition metal, silicon and hydrogen and made of silicon hydride.

This method may allow introduction of only hydrogen (silicon hydride) in the film.

This method includes using a MoSi target and using a Mo target and a Si target. If carbon (silicon carbide and transition metal carbide) is further contained in the film, this method includes using a MoSiC target, using a target containing C in one or both of a Mo target and a Si target, and using a MoSi target and a C target.

In the present disclosure, the thin film is preferably formed by controlling a pressure of the atmospheric gas and/or power in the sputtering film deposition.

If the pressure of the atmospheric gas is low (in this case a film formation speed is low), it is considered that carbide (silicon carbide and transition metal carbide) is easily produced. In addition, if power is decreased, it is also considered that carbide (silicon carbide and transition metal carbide) is easily produced.

In the present disclosure, the carbide (silicon carbide and transition metal carbide) is produced in this manner and further the pressure of the atmospheric gas and/or power in the sputtering film deposition is controlled to obtain the above-described operation and effects of the present disclosure.

In addition, in the present disclosure, the stable Si—C bonding and/or the stable transition metal M-C bonding are formed in the sputtering film deposition and further the pressure of the atmospheric gas and/or power in the sputtering film deposition is controlled to obtain the above-described operation and effects of the present disclosure.

On the other hand, if the pressure of the atmospheric gas is high (in this case a film formation speed is high), that the production of carbide (silicon carbide and transition metal carbide) is deemed to be hard. In addition, if power is decreased, that the production of carbide (silicon carbide and transition metal carbide) is deemed to be hard.

In addition, the content of carbon in the light shielding layer 11 can be larger than 1 atom % and less than 10 atom %. If the content of carbon in the light shielding layer 11 is 1 atom % or less, the production of silicon carbide and/or transition metal carbide is difficult. If the content of carbon is 10 atom % or more, it is hard to thin the light shielding layer.

The content of hydrogen in the light shielding layer 11 can be larger than 1 atom % and less than 10 atom %. If the content of hydrogen in the light shielding layer 11 is 1 atom % or less, the production of silicon hydride is difficult. If the content of hydrogen is 10 atom % or more, it is hard to form the film.

In the present disclosure, transition metal silicide in the light shielding layer 11 is molybdenum silicide and the content of molybdenum in the light shielding layer 11 can be 9 atom % or more to 40 atom % or less.

This is because in some embodiments it is preferable to use MoSi-based material having optical density higher than that of chromium-based material.

The present inventors have discovered that the light shielding layer 11 containing molybdenum silicide having a content of molybdenum of 9 atom % or more to 40 atom % or less has high optical density per unit film thickness and provides relatively large light shieldability for the ArF excimer laser exposure light, as shown in FIG. 6, and even the light shielding film 10 having the total thickness of 40 nm or less [i.e. the thickness of the light shielding layer 11 of 35 nm or less if the thickness of the surface anti-reflection layer 12 is 5 nm or more], which is significantly smaller than conventional used, provides a certain degree of light shieldability (and optical density of 2.0 or more).

If the content of molybdenum in the light shielding layer 11 containing the molybdenum silicide is 9 atom % or more, $\Delta OD$ may be 0.075 $nm^{-1}$@193.4 nm or more. If the content of molybdenum is 15 atom % or more, $\Delta OD$ can be 0.08 $nm^-$@193.4 nm or more. If the content of molybdenum is 20 atom % or more, $\Delta OD$ can be 0.082 $nm^-$@193.4 nm or more.

The content of molybdenum in the light shielding layer 11 containing the molybdenum silicide can be 15 atom % or more to 40 atom % or less, and can in some instances be 19 atom % or more to 40 atom % or less.

Molybdenum silicide has a problem that a high content of molybdenum may lower chemical resistance and washing resistance (in particular, against alkali washing or warm water washing). In some instances the content of molybdenum can be set to be 40 atom % or less, which can secure the minimum of chemicals resistance and washing resistance required for use as the transfer mask. In addition, as can be clearly seen from FIG. 6, light shieldability of molybdenum silicide has a limit at a certain point of the content of molybdenum. The upper limit of the content of molybdenum can be 40 atom %, which provides certain width at a stable stoichiometric rate of molybdenum silicide. If the content of molybdenum is beyond the upper limit, the chemicals resistance and washing resistance are lowered.

In addition, the content of Mo in the light shielding layer 11 can be 9 atom % or more to 40 atom % or less since the content of Mo out of this range may relatively increase an etching rate in dry etching using fluorine-based gas.

In addition, the light shielding layer containing the molybdenum silicide may contain other elements [carbon, oxygen, nitrogen, hydrogen, inert gas (such as helium, argon, xenon or the like) and so on] within a range of content (less than 10 atom %) where the above-mentioned features, operation and effects are not damaged.

In the present disclosure, the lower limit of thickness of the light shielding layer 11 made of molybdenum silicide can be 24 nm or more, and in some instances 27 nm or more, and its upper limit can be less than 40 nm, and in some instances less than 35 nm. In addition, in order to secure an optical density of 2.0 or more in the multilayer structure of the light shielding layer 11 made of molybdenum silicide and the surface anti-reflection layer 12, the lower limit of thickness of the light shielding layer 11 may be 15 nm.

In the present disclosure, a tensile stress and a compressive stress of the MoSi-based light shielding layer 11 can be freely controlled using an internal gas pressure of a sputter and heating treatment. For example, by controlling a film stress of the MoSi-based light shielding layer 11 to be a tensile stress, the tensile stress may be in harmony with a compressive stress of the surface anti-reflection layer 12 (made of, for example, MoSiON). That is, since the stresses of both layers constituting the light shielding film 10 can cancel each other, the film stress of the light shielding film 10 can be minimized (substantially zero).

In the present disclosure, examples of a molybdenum silicide compound containing at least one of oxygen and nitrogen in the surface anti-reflection layer 12 may include MoSiON, MoSiO, MoSiN, MoSiOC, MoSiOCN and the like. Among these, MoSiO and MoSiON can be used from a viewpoint of chemical resistance and heat resistance and MoSiON can be used from a viewpoint of blank defect quality. In addition, more Mo provides lower washing resistance, particularly lower resistance to alkaline water (such as ammonia water) or warm water. In this respect, the content of Mo in the surface anti-reflection layer 12 can be minimized.

In addition, it has been found that a high content of Mo causes an effect of turbidly whitening a surface of the film (turbidity effect) when heat treatment (annealing) is carried out at high temperature for the purpose of stress control. It is considered that this is because MoO is extracted from the surface of the film. To avoid such a turbidity effect, the content of Mo in the surface anti-reflection layer 12 can be less than 10 atom %. However, too low content of Mo may cause noticeable abnormal discharging in DC sputtering, which may result in increased frequency of defects. Accordingly, the content of Mo is can be within a range to allow normal sputtering. In some cases, the film may be formed using other film formation techniques with no content of Mo.

In the present disclosure, the light shielding film 10 can be made of Ta-based material.

This is because use of a Ta-based material having optical density higher than that of chromium-based material may allow for a total thickness of 40 nm or less, which is decreasingly affected by EMF, and a density of 2.0 or more of the light shielding film 10.

The Ta-based light shielding film 10 may have a multilayer structure of the light shielding layer 11 and the surface anti-reflection layer 12, both layers being made of tantalum or a compound thereof. Examples of the tantalum compound may include tantalum nitride, tantalum oxide, tantalum boride, tantalum carbide and so on.

In the present disclosure, the light shielding film 10 has a two-layer structure including the light shielding layer 11 made of tantalum nitride and the surface anti-reflection layer 12 that is formed in contact with the light shielding layer 11 and is made of tantalum oxide.

Nitridization of tantalum of the light shielding layer 11 allows prevention of oxidization of transfer pattern side walls of the light shielding film 10 after the transfer mask is prepared. On the other hand, in order to secure high light shieldability, the content of nitrogen is required to be as low as possible. In these respects, the content of nitrogen in the light shielding layer can be 1 atom % or more to 20 atom %, and in some cases 5 atom % or more to 10 atom %.

The surface anti-reflection layer 12 made of tantalum oxide containing oxygen of 50 atom % or more can be used because of its excellent anti-reflection effect.

The above configuration promotes anti-reflection at a front surface of the light shielding film 10. In this manner, further thinness by a structure with no rear surface anti-reflection layer is effective in overcoming the problem of the electromagnetic field (EMF) effect.

In the present disclosure, the total thickness of the light shielding film 10 having a multilayer structure of the light shielding layer 11 and the surface anti-reflection layer 12 can be 40 nm or less, its optical density for ArF exposure light can be at least 2.0 or more, and its surface reflectivity can be a predetermined value or less (for example, 30% or less).

In design of this light shielding film 10, although in many cases contribution to optical density depends substantially on the light shielding layer 11, the surface anti-reflection layer 12 may be configured to make some contribution to the optical density. Here, the conventional film configuration where the contribution to optical density depends substantially on the light shielding layer 11 has a varying appropriate range of refractive index (n) and extinction coefficient (k) of the light shielding layer 11 and the surface anti-reflection layer 12. The following refractive index (n) and extinction coefficient (k) are numerical values for ArF exposure light (having a wavelength of 193 nm), which is equally applied to the following description.

If the surface anti-reflection layer 12 is configured to make some contribution to the optical density, the extinction coefficient (k) of the light shielding layer 11 may be somewhat lowered. For example, the extinction coefficient (k) of the light shielding layer 11 may be 1.8 or more, and in some cases 1.9 or more, and in other cases 2.0 or more. The extinction coefficient (k) of the light shielding layer 11 may be 2.4 or less, in some cases 2.3 or less, and in other cases 2.2 or less.

On the other hand, the refractive index (n) of the light shielding layer 11 for this case is can be somewhat low. For example, the refractive index (n) of the light shielding layer 11 may be 1.5 or more, in some cases 1.6 or more, and in other cases 1.7 or more. In addition, the extinction coefficient (k) of the light shielding layer 11 may be 2.4 or less, in some cases 2.0 or less, an in other cases 1.8 or less.

If the surface anti-reflection layer 12 is configured to make some contribution to the optical density, the extinction coefficient (k) of the surface reflection layer 12 increases somewhat. For example, the extinction coefficient (k) of the surface reflection layer 12 may be 0.7 or more, in some cases 0.8 or more, and in other cases 0.9 or more. The extinction coefficient (k) of the surface reflection layer 12 may be 1.5 or less, in some cases 1.4 or less, and in other cases 1.3 or less.

On the other hand, the refractive index (n) of the surface anti-reflection layer 12 for this case can be somewhat lower than usual in order to provide low reflection. For example, the refractive index (n) of the surface anti-reflection layer 12 may be 1.7 or more, in some cases 1.8 or more, and in other cases 1.9 or more. The refractive index (n) of the surface anti-reflection layer 12 may be 2.4 or less, in some cases 2.2 or less, and in other cases 2.0 or less.

In the present disclosure, the auxiliary shielding film can have resistance to etching gas used in etching the light shielding film.

For example, this is to manufacture a transfer mask in which a transfer pattern is formed by only the light shielding film 10 and a light shielding band is formed in the periphery of a transfer pattern area, as in the first to third embodiments shown in FIG. 1 to FIG. 3, respectively, where the auxiliary light shielding film 20 is formed in contact with the light shielding film 10. In addition, this is also to etch the light shielding film 10 using the auxiliary light shielding film 20 as an etching mask.

In one aspect of the present disclosure, the auxiliary light shielding film 20 can be made of material mainly containing one of chromium, chromium nitride, chromium oxide, chromium oxynitride and chromium oxide/carbide/nitride.

Material (metal silicide-based and Ta-based) that can be adopted for the light shielding film 10 is mostly material that can be dry-etched using fluorine-based gas. Accordingly, material resistant to the fluorine-based gas can be used for the auxiliary light shielding film 20. Chromium-based material is material that is highly resistant to the fluorine-based gas and can be basically dry-etched using a mixture of chlorine and oxygen, and accordingly, the underlying light shielding film 10 may function as an etching stopper when a transfer pattern formed on an upper layer (for example, the resist film 100 or the like) of the auxiliary light shielding film 20 is dry-etched to be transferred onto the auxiliary light shielding film 20. As a result, the underlying light shielding film 10 can be dry-etched to transfer the transfer pattern using the auxiliary light shielding film 20 as an etching mask, which allows formation of the transfer pattern on the light shielding film 10 with high precision.

In the present disclosure, the auxiliary light shielding film 20 may be made of material that comprises unitary chromium or a compound of chromium and at least one of oxygen, nitrogen, carbon and hydrogen. The auxiliary light shielding film 20 may have a single layer or multilayer structure made of the above film material. The multilayer structure may be a multilayer structure having different compositions formed step by step or a film structure having continuously varying compositions.

In one aspect of the present disclosure, the auxiliary light shielding film 20 can contain at least one of nitrogen and oxygen in addition to chromium and has a thickness of 20 nm and the content of chromium in the film is 50 atom % or less.

For example, in the first to third embodiments shown in FIG. 1 to FIG. 3, if the light shielding film 10 is made of MoSi-based material, the auxiliary light shielding film 20 may contain at least one of nitrogen and oxygen in addition to chromium, resist film thickness may be reduced with an increased etching rate of the auxiliary light shielding film 20 by setting the content of chromium in the film to be 50 atom % or less, in some cases 45 atom % or less, and an optical density of 0.8 or more for the auxiliary light shielding film 20 may be secured by setting the film thickness to 20 nm or more.

In the present disclosure, the thickness of the auxiliary light shielding film 20 made of chromium-based material can be 20 nm to 40 nm.

In the present disclosure, an etching mask film resistant to etching gas used in etching the auxiliary light shielding film can be formed on the auxiliary light shielding film.

For example, in the second and third embodiments shown in FIG. 2 and FIG. 3, if the auxiliary light shielding film 20 is made of a chromium-based material, material resistant to dry etching in a mixture of chlorine and oxygen can be selected for the etching mask film 30. For example, the etching mask film 30 can be made of silicon oxide, silicon nitride, silicon oxynitride, or material containing a low percentage (8% or less) of transition metal in addition thereto. The transition metal can be the same as that applied to the light shielding layer 11.

In addition, as in the second embodiment shown in FIG. 2, the adhesion enhancement layer 60 may be formed to increase adhesion between the resist film 100 and the etching mask 30. For example, the adhesion enhancement layer 60 may be formed by subjecting a hexamethyldisilazane (HMDS) layer on a surface of the etching mask 30 to an evaporating and scattering process. In addition, the adhesion enhancement layer 60 may be formed of a resin layer, which is etched along with the etching mask 30 when the etching mask 30 is dry-etched using a resist pattern as a mask without being dissolved in a developing solution used in forming the resist pattern on the resist film 100 and which is removed along with the resist pattern when the resist pattern is removed (for example, in solvent removal or oxygen plasma ashing).

In addition, as in the third embodiment shown in FIG. 3, the second etching mask film 40 may be formed on the etching mask 30 (corresponding to the etching mask 30 of FIG. 2). The second etching mask 40 can be made of a chromium-based material if the etching mask 30 is made of the silicon-based material or the transition metal-based material.

In the present disclosure, the auxiliary light shielding film can include an auxiliary light shielding layer and an etching stopper and mask layer, which is interposed between the light shielding film and the auxiliary light shielding layer and is resistant to both of etching gas used to etch the auxiliary light shielding layer and etching gas used to etch the light shielding film.

In one aspect of the present disclosure, the etching stopper and mask layer can contain at least one of nitrogen and oxygen, in addition to chromium. The content of chromium in the layer is 50 atom % or less and its thickness is 5 nm or more to 20 nm or less.

In one aspect of the present disclosure, the auxiliary light shielding layer is made of material consisting essentially of transition metal silicide.

For example, as in the fourth embodiment of FIG. 4, since the etching stopper and mask layer 21 of the auxiliary light shielding film 20 formed on the light shielding layer 10 can be used as an etching mask when the light shielding film 10 is etched to form a transfer pattern, the etching mask can be further thinned as compared to when the auxiliary light shielding film 20 having limited optical density is used as an etching mask, which may result in formation of a transfer pattern with high precision by the light shielding film 10.

The auxiliary light shielding layer 22 may be made of material to be etched by etching gas used to etch the light shielding film 10. The auxiliary light shielding layer 22 may be made of the same material as the light shielding film 10.

In the present disclosure, the auxiliary light shielding layer 22 may be formed of a metal film containing metal.

An example of the metal film containing metal may include a film made of tantalum, molybdenum, titanium, hafnium, tungsten or an alloy thereof, or material containing one of these elements or an alloy thereof (for example, a film containing one of these elements or an alloy thereof and at least one of oxygen, nitrogen, silicon and carbon). The metal film may have a multilayer structure having different compositions formed step by step or a multilayer structure having continuously varying compositions.

In the present disclosure, the auxiliary light shielding layer 22 may be made of transition metal silicide or compounds thereof added with nitrogen, oxygen, carbon, hydrogen or inert gas (such as helium, argon, xenon or the like).

In the present disclosure, the metal film may be made of material containing one or two selected from a group consisting of aluminum, titanium, vanadium, chromium, zirconium, niobium, molybdenum, lanthanum, tantalum, tungsten, silicon, and hafnium, or nitride, oxide, oxynitride or carbide thereof.

The auxiliary light shielding layer 22 can be made of MoSi-based material.

For example, this is because the etching stopper and mask layer 21 can be made of chromium-based material and the auxiliary light shielding layer 22 can be made of MoSi-based material if the light shielding film 10 is made of MoSi-based material. Since the MoSi-based material can select a film having high light shieldability, the auxiliary light shielding layer 22 can be further thinned.

In the present disclosure, the thickness of the auxiliary light shielding layer 22 made of the MoSi-based material can be 10 nm to 30 nm if the content of molybdenum in the auxiliary light shielding layer 22 is 20 atom %.

In addition, as in the second embodiment, the adhesion enhancement layer 60 formed of the HMDS layer or the resin layer is formed to enhance adhesion between the resist film 100 and the auxiliary light shielding layer 22.

In the present disclosure, etching mask films such as the second etching mask film 40, the etching mask film 70 and the etching stopper and mask layer 21 may be made of chromium-based material.

As the etching mask films may be formed of the chromium-based material in this manner, it becomes possible to make the etching mask films thin. In addition, such etching mask films provide high processing precision. Further, due to high etching selectivity for a layer formed in vertical contact with an etching mask film, the etching mask film can be removed (if it becomes unnecessary) without doing damage to other layers.

In the present disclosure, the etching mask films may be made of material that comprises unitary chromium or a compound of chromium and at least one of oxygen, nitrogen, carbon and hydrogen. The etching mask films may have a single layer or multilayer structure made of the above film material. The multilayer structure may be a multilayer structure having different compositions formed step by step or a film structure having continuously varying compositions.

In the present disclosure, the thickness of the etching mask films can be 5 nm to 20 nm. This configuration can obtain a transfer mask in which an amount of shift of a CD (Critical Dimension) of an etched film to a CD of the etching mask film (a variation of pattern dimension of the etched film to pattern dimension of the etching mask film) is less than 5 nm.

In the present disclosure, the etching mask film can contain at least one of nitrogen and oxygen in addition to chromium. The content of chromium in the film is 50 atom % and the thickness of the film is 5 nm or more to 20 nm or less.

The present inventors have discovered that, when a process is performed using a mask blank including a MoSi-based light shielding film, a Cr-based etching mask film and a resist film (having thickness of 100 nm or less) formed in order (in contact with each other) on a transparent substrate, (1) there are some cases where the thickness of the resist film cannot be reduced only with simple thinness of the etching mask film, (2) from a viewpoint of reduction in thickness of the resist film, the Cr-based etching mask film may not be preferred since an etching rate of chlorine-based ($Cl_2+O_2$) dry etching is low in Cr-rich material, and accordingly, Cr-based material that contains a low content of Cr and is highly-nitridized/oxidized is can be used for the Cr-based etching mask film from this viewpoint, (3) from a viewpoint of reduction in line edge roughness (LER) of a light shielding film pattern, the Cr-based etching mask film can be used since Cr-rich material has high resistance to fluorine-based dry etching, and accordingly, Cr-based material containing the high content of Cr can be used for the Cr-based etching mask film, (4) in consideration of a trade-off between the above items (2) and (3), the content of chromium in the Cr-based etching mask film is 50 atom % or less, in some cases 45 atom % or less, and in other cases 35 atom % or less, and the lower limit of the content of chromium in the Cr-based etching mask film is in some cases 20 atom % or more, and in other cases 30 atom % or more, and in particular could be 33 atom % or more for a case where the etching mask film is a chromium oxide film, (5) in connection with the items (2) and (4) (that is, in connection with reduction in etching time of the Cr-based etching mask film), the thickness of the Cr-based etching mask can be 20 nm or less from a viewpoint of reduction in the thickness of the resist film, and (6) in connection with the items (3) and (4) (that is, in connection with etching resistance of the Cr-based etching mask film), since an etching mask has to maintain a mask pattern until an etching process to transfer a mask pattern onto an underlying light shielding film is completed, the thickness of the Cr-based etching mask film is can be 5 nm or more.

In the present disclosure, the etching mask film can be made of material consisting essentially of one of chromium oxide/carbide/nitride (CrOCN), chromium oxycarbide (CrOC), chromium oxynitride (CrON) and chromium nitride (CrN).

The Cr-based material is improved in its etching rate for chlorine-based gas as oxidation is proceeding. Although just not as well as in oxidation, proceeding of nitridization may also improve the etching rate for the chlorine-based gas. Accordingly, the content of chromium in the etching mask film can be 35 atom % or less and the etching mask film can be highly-oxidized/nitrided.

In addition, from a viewpoint of high film defect quality, the etching mask film is can be made of chromium oxide/carbide/nitride or chromium oxycarbide. From a viewpoint of stress controllability (formability of a low stress film), the etching mask film can be made of chromium oxide/carbide/nitride (CrOCN).

The etching mask film may have a single layer or multilayer structure made of the above film material. The multilayer structure may be a multilayer structure having different compositions formed step by step or a film structure having continuously varying compositions.

In the present disclosure, the etching mask film can be made of chromium oxide/carbide/nitride or chromium oxycarbide, can use a mixture gas including at least "$CO_2$ gas, $N_2$ gas and rare gas" or "$CO_2$ gas and rare gas" (or selects a gas system having a low hysteresis) using a chromium target, and can be formed under a condition near where transition from a metal mode to a reaction mode begins, or close to the reaction mode.

This is because a film having a high etching rate can be stably fabricated in a DC sputter.

Specifically, FIG. 7 shows a relationship between a voltage [V] (corresponding to a film formation rate) represented by a vertical axis and a gas flow rate represented by a horizontal axis under a condition where plasma is formed in a DC sputter.

A voltage plot (in a running path) when the gas flow rate represented by the vertical axis is increased from 0 to 50 sccm does not coincide with a voltage plot (in a return path) when it is decreased from 50 to 0 sccm, which is referred to as a so-called "hysteresis."

The metal mode indicates an area where a high voltage (for example, 330 to 350 V) is maintained (an area where Cr ions are sputtered into Ar), the transition mode indicates an area where a voltage is suddenly decreased, and the reaction mode indicates an area after the voltage is suddenly decreased (an area where the suddenly-decreased voltage remains at 290 to 310 V or an area where gas is activated to show reactivity).

Figure 7A:
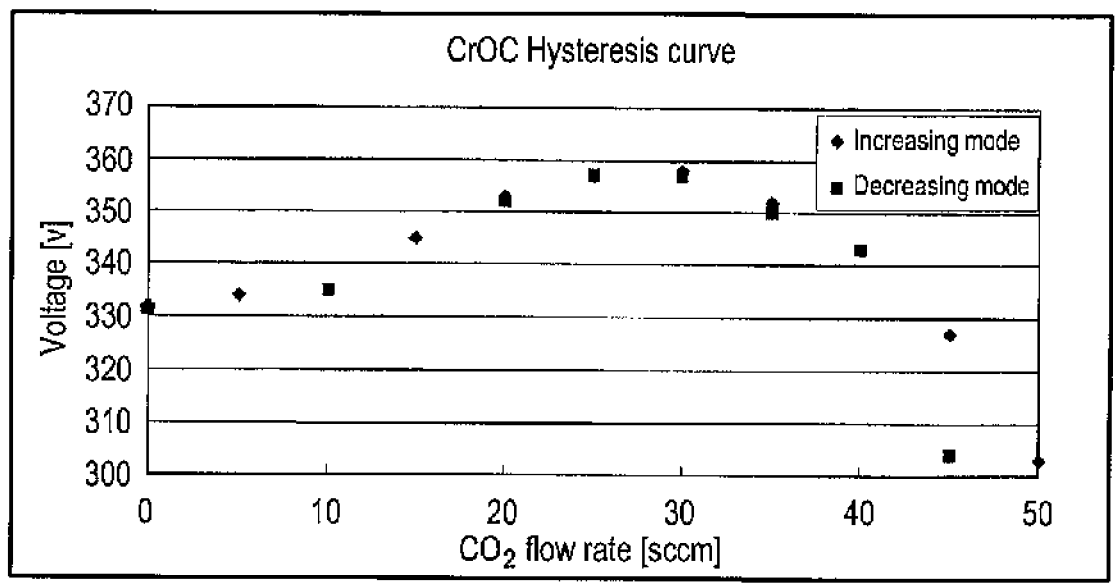
FIG. 7 is a view used to explain a mode in forming an etching mask film.
Figure 7B:
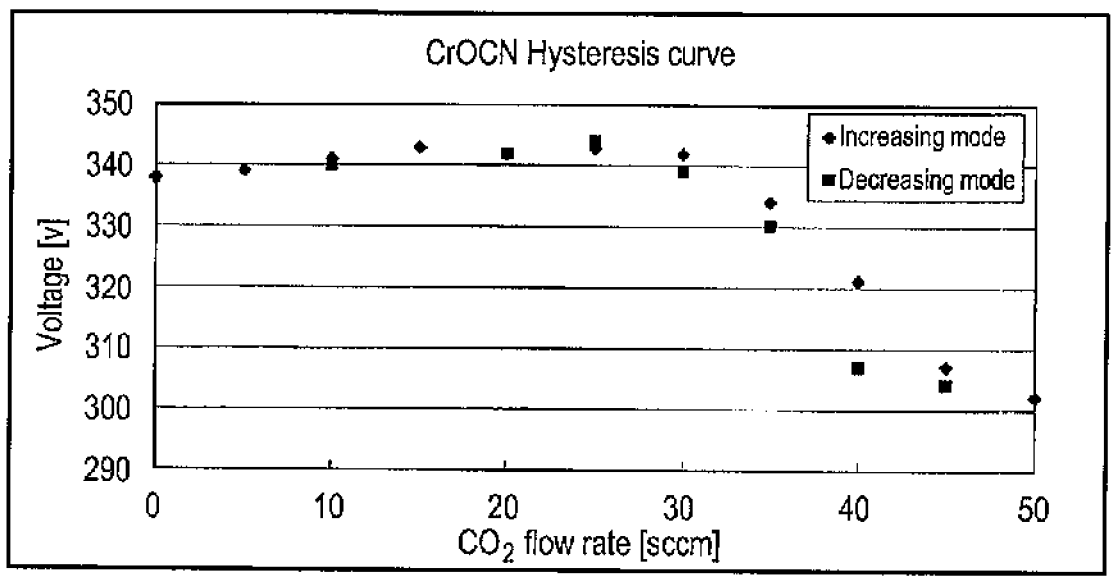
Figure 7C:
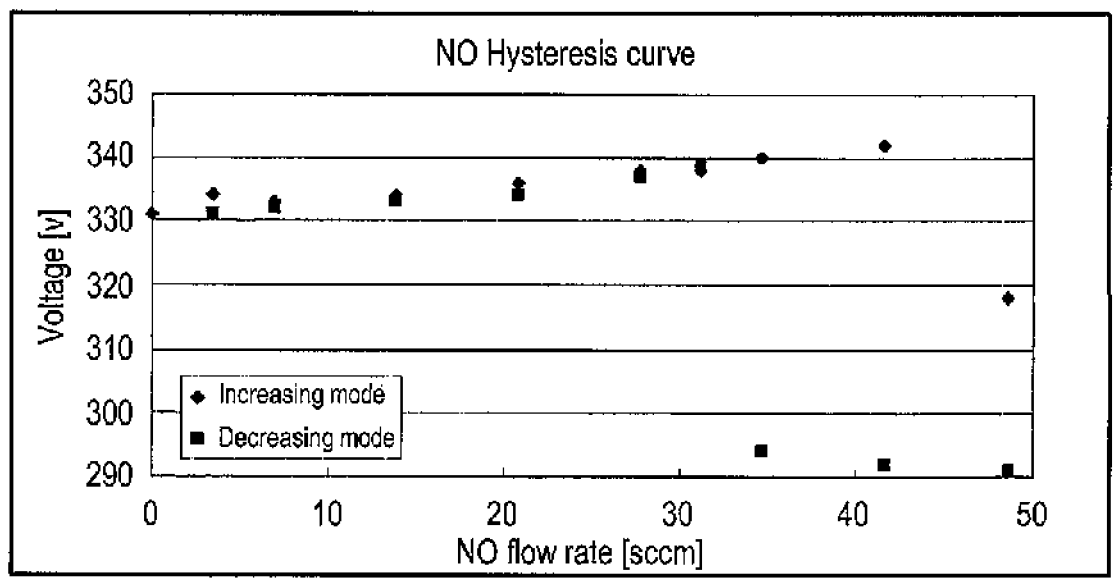

The metal mode corresponds to an area of 0 to 30 sccm in FIG. 7A, an area of 0 to 25 sccm in FIG. 7B, and an area of 0 to 32 sccm in FIG. 7C.

The transition mode corresponds to an area of 35 to 50 sccm in an increasing mode in FIG. 7A, an area of 35 to 50 sccm in the increasing mode in FIG. 7B, and an area of 43 to 50 sccm in the increasing mode in FIG. 7C.

The reaction mode corresponds to an area of 50 to 35 sccm in a decreasing mode in FIG. 7A, an area of 50 to 35 sccm in a decreasing mode in FIG. 7B, and an area of 48 to 32 sccm in a decreasing mode in FIG. 7C.

A chromium film having very low oxidation and nitridization is formed in the metal mode, a chromium film having very high oxidation and nitridization is formed in the reaction mode, and an intermediate mode between the metal mode and the reaction mode (that is, the transition mode from the metal mode to the reaction mode) is not typically used since its conditions are not stable.

A variety of gas systems may be used to oxidize and nitride chromium. For example, as shown in FIG. 7C, if a gas system having high hysteresis (for example, NO gas+rare gas) is used, it is difficult to form an oxidized/nitrided chromium film stably with little defect in the reaction mode using the DC sputter. It may be the same when a gas system of $O_2$ gas+rare gas is applied.

On the other hand, as shown in FIG. 7A and FIG. 7B, if a gas system having low hysteresis (for example, $CO_2$ gas+rare gas in FIG. 7A and $CO_2$ gas+$N_2$gas+rare gas in FIG. 7B) is used, it is possible to form an oxidized/nitrided chromium film with a high etching rate, stably and with little defect in the reaction mode (an area of the decreasing mode of 40 to 30 sccm in FIG. 7A and an area of the decreasing mode of 35 to 25 sccm in FIG. 7B) using the DC sputter. In particular, by performing a film formation process at a place (condition) where the increasing mode near the flow rate of 35 sccm in FIG. 7A or FIG. 7B is slightly deviated from the decreasing mode, that is, under a condition at the start of transition from the metal mode to the reaction [a condition near (immediately before) where the metal mode begins to transition to the reaction mode], it is possible to form an oxidized/nitrided chromium film with an etching rate, which is higher than those of other conditions, stably and with little defect using the DC sputter.

The transfer mask of the present disclosure is manufactured using the above-described mask blank.

Specifically the transfer mask of the present disclosure is a transfer mask to which ArF exposure light is applied and the transfer mask is provided with a light shielding film pattern having a multilayer structure composed of a light shielding layer and a surface anti-reflection layer, which are formed on a transparent substrate, and having a transfer pattern in a transfer pattern area, and an auxiliary light shielding film pattern formed on the light shielding film pattern in a peripheral region of the transfer pattern area and having a pattern of light shielding band, in which the film thickness of the light shielding film pattern is 40 nm or less, its optical density for the exposure light is 2.0 or more to 2.7 or less, and the optical density is 2.8 or more for the exposure light of the multilayer structure of the light shielding film and the auxiliary light shielding film in the light shielding band.

In addition, the thickness of the light shielding layer in the light shielding film pattern can be 15 nm or more to 35 nm or less.

As used herein, the transfer pattern area refers to an area (formed by etching) on a main surface where a transfer pattern is arranged on a light shielding film. A transfer pattern (mask pattern) of a semiconductor device is typically arranged in an area of 132 mm×104 mm and may be, in some cases, rotated by 90° depending on a position of defect on the light shielding film or the transparent substrate when the transfer pattern is exposed and drawn on a resist film of a mask blank. Accordingly, the transfer pattern area can be a 132 mm square area around the center of the substrate. In addition, the light shielding band can be formed in the peripheral region of the transfer pattern area since the zone is to shield the light leakage of the exposure light with which the transfer pattern area is irradiated.

Such configuration shows an effect of sufficiently overcoming the problem of the electromagnetic field (EMF) effect, which can be a problem for the generation in which the DRAM half pitch (hp) is 32 nm specified in semiconductor device design specifications and the later generations and provides a practical transfer mask.

In addition, the transfer mask of the present disclosure may be applied to a transfer mask used for single exposure, double patterning and double exposure.

In the present disclosure, dry etching gas, which is mixture gas including chlorine-based gas and oxygen gas, can be used for dry etching of a chromium-based film. This is because it is possible to achieve a high dry etching rate and hence shortened dry etching time and form a film pattern having a good section by dry etching the chromium-based film made of material containing elements such as chromium, oxygen, nitrogen and so on using the dry etching gas. Examples of the chlorine-based gas included in the dry etching gas may include $Cl_2$, $SiCl_4$, HCl, $CCl_4$, $CHCl_3$ and so on.

In the present disclosure, for example, fluorine-based gas such as $SF_6$, $CF_4$, $C_2F_6$, $CHF_3$ and so on, mixture gas including He, $H_2$, $N_2$, Ar, $C_2H_4$, $O_2$ and so on in addition to the fluorine-based gas, chlorine-based gas such as $Cl_2$, $CH_2Cl_2$ and so on, or mixture gas including He, $H_2$, $N_2$, Ar, $C_2H_4$ and so on in addition to the chlorine-based gas may be used for dry-etching of a metal silicide-based film.

In the present disclosure, a resist forming the resist film 100 can be a chemically-amplified resist since it is adapted to high precision processing.

The present invention is applied to a mask blank of the generation aiming at a resist having thickness of 100 nm or less, 75 nm or less or 50 nm or less.

In the present disclosure, the resist can be a resist for electron beam lithography since it is adapted to high precision processing.

The present invention is applied to a mask blank for electron beam lithography to form a resist pattern using the electron beam lithography.

In the present disclosure, examples of the transparent substrate 1 may include a synthetic quartz substrate, a $CaF_2$ substrate, a soda-lime glass substrate, a non-alkaline glass substrate, a low thermal expansion glass substrate, an alumino silicate glass and so on.

In the present disclosure, the mask blank may include a resist-containing mask blank.

In the present disclosure, the transfer mask may a binary mask (reticle) using no phase shift effect.

EXAMPLES

Hereinafter, examples of the present invention will be described in more detail.

Example (1-1)

(Manufacture of a Mask Blank)

FIG. 1 is a sectional view of a binary mask blank according to Example (1-1). A synthetic quartz glass substrate having a size of 6 inch square and a thickness of 0.25 inches was used as the transparent substrate 1 and a MoSiCH film (the light shielding layer 11) and a MoSiON film (the surface anti-reflection layer 12) were formed as the light shielding film 10 on the transparent substrate 1.

Specifically, a DC magnetron sputter was used, and a target of Mo:Si=21 atom %:79 atom % was used to form a film comprising molybdenum, silicon, carbon and hydrogen (Mo: 19.8 atom %, Si:76.7 atom %, C:2.0 atom % and H:1.5 atom %) at a film thickness of 15 nm under a mixture gas atmosphere of Ar, $CH_4$ and He (a gas flow rate Ar:$CH_4$:He=10:1:

50) under conditions of gas pressure:0.3 Pa and DC power:2.0 kW, thereby forming the MoSiCH film (the light shielding layer 11).

Next, a target of Mo:Si=4 atom %:96 atom % was used to form a film comprising molybdenum, silicon, oxygen and nitrogen (Mo:2.6 atom %, Si:57.1 atom %, O:15.9 atom % and N:24.4 atom %) at a film thickness of 15 nm under a mixture gas atmosphere of Ar, $O_2$, $N_2$ and He (a gas flow rate Ar:$O_2$:$N_2$:He=6:5:11:16) under conditions of gas pressure: 0.1 Pa and DC power:3.0 kW, thereby forming the MoSiON film (the surface anti-reflection layer 12).

The total thickness of the light shielding film 10 was set to 30 nm. The optical density (OD) of the light shielding film 10 was 2.0 at a wavelength of 193 nm of ArF excimer laser exposure light.

Next, the substrate was heated (annealed) at 450° C. for 30 minutes.

Figure 8A:
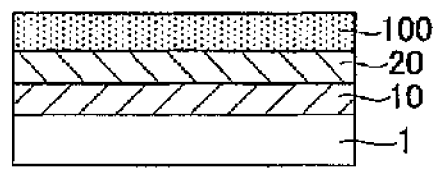
FIG. 8 is a schematic sectional view used to explain a process of manufacturing a transfer mask according to one example of the present invention.

Next, the auxiliary light shielding film 20 was formed on the light shielding film 10 [FIG. 8A].

Specifically, a chromium target was used to form a CrOCN film (the content of Cr in the film:33 atom %) at a film thickness of 30 nm under a mixture gas atmosphere of Ar, $CO_2$, $N_2$ and He (a gas flow rate Ar:$CO_2$:$N_2$:He=21:37:11:31) under a condition (near a $CO_2$ flow rate of 37 sccm) at the start (immediately before) of transition from the metal mode to the reaction mode (see FIG. 7B) under conditions of gas pressure: 0.2 Pa, DC power:1.8 kW and voltage: 334 V. At this time, the CrOCN film was annealed at a temperature lower than an annealing temperature of the light shielding film 10 such that a film stress of the CrOCN film is minimized (preferably substantially zero) without having any effect on a film stress of the light shielding film 10.

Thus, a mask blank having the auxiliary light shielding film 20 and the light shielding film 10 for ArF excimer laser exposure and single exposure was obtained.

In addition, an analysis on elements of the film was made using Rutherford back scattering analysis. This is equally applied to the following Examples and comparative examples.

In the binary mask blank of Example (1-1) shown in FIG. 1, the light shielding film 10 was made to have a multilayer structure including the light shielding layer 11 made of MoSiCH where the content of Mo is 19.8 atom % in the film and the surface anti-reflection layer 12 made of MoSiON where the content of Mo is 2.6 atom % in the film. The thickness of the light shielding film 10 is 30 nm and its optical density is 2.0.

The auxiliary light shielding film 20 is made of CrOCN including the content of Cr of 33 atom % in the film, its thickness is 30 nm and its optical density is 0.8.

(Manufacture of a Transfer Mask)

A chemically-amplified positive resist 100 (PRL009 available from Fuji Film Electronics Material Company) of thickness of 100 nm for electron beam drawing (exposure) was applied on the auxiliary light shielding film 20 of the mask blank using spin coating [FIG. 1 and FIG. 8A].

Figure 8B:
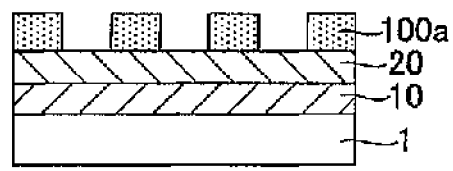

Next, the resist film 100 was drawn to have a desired pattern using an electron beam drawing apparatus and was developed with a developer to form a resist pattern 100a [FIG. 8B].

Figure 8C:
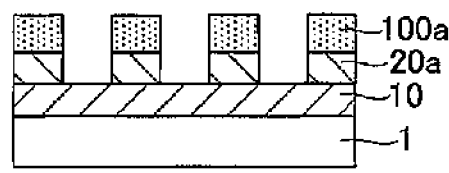

Next, an auxiliary light shielding film pattern 20a was formed by dry etching the auxiliary light shielding film 20 using the resist pattern 100a as a mask [FIG. 8C]. A mixture gas of $Cl_2$ and $O_2$ ($Cl_2$:$O_2$=4:1) was used as a dry etching gas.

Next, a residual resist pattern 100a was stripped away by a chemical solution.

Figure 8D:
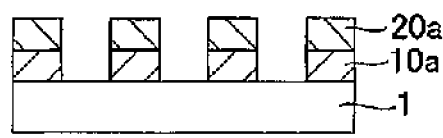

Next, using the auxiliary light shielding film pattern 20a as a mask, the light shielding film 10 is dry-etched using a mixture gas of $SF_6$ and He to form a light shielding film pattern 10a [FIG. 8D].

Figure 8E:
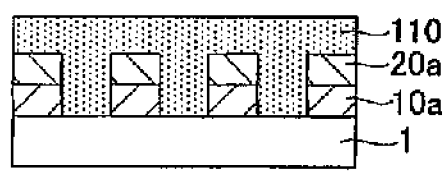

Next, the resist pattern 100a is stripped away and a resist film 110 of a positive resist (FEP171 available from Fuji Film Electronics Material Company) of thickness of 200 nm for electron beam drawing (exposure) was applied on the substrate using spin coating [FIG. 8E].

Figure 8F:
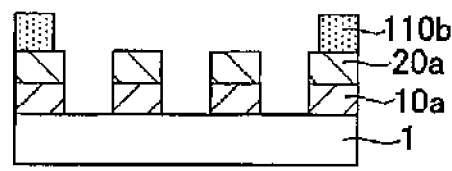
Figure 8G:
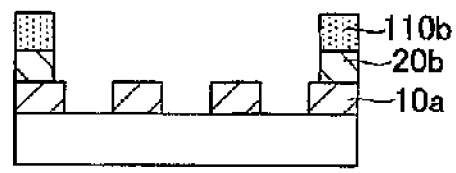

Next, the resist film 110 is drawn and exposed to form a light shielding portion (light shielding band) pattern using an electron beam drawing apparatus and was developed with a developer to form a resist pattern 110b [FIG. 8F], and then, using the resist pattern 110a as a mask, the auxiliary light shielding film pattern 20a is dry-etched using a mixture gas of $Cl_2$ and $O_2$ ($Cl_2$:$O_2$=4:1) to form an auxiliary light shielding film pattern 20b [FIG. 8G].

Figure 8H:
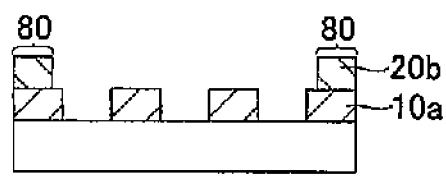

Next, the resist pattern 110b was stripped away and then a washing process was carried out to obtain a binary transfer mask having a light shielding portion (light shielding band) 80 including the auxiliary light shielding film pattern 20b and the underlying light shielding film pattern 10a [FIG. 8H].

It was confirmed that the binary transfer mask of Example (1-1) shows an effect of sufficiently overcoming the problem of the electromagnetic field (EMF) effect, which can be a problem for the generation in which the DRAM half pitch (hp) is 32 nm specified in semiconductor device design specifications and the later generations, with ArF exposure light, and provides a practical transfer mask.

In addition, although in the example of manufacture of the transfer mask the resist pattern 100a is stripped away after forming the auxiliary light shielding film pattern 20a, the resist pattern 100a may be stripped away after the light shielding film pattern 10a is formed.

Example (1-2)

(Manufacture of a Mask Blank)

Example (1-2) is similar to Example (1-1) except that the light shielding layer 11 is prepared under the following conditions and the content of Mo in the MoSiCH film is 32.3 atom %.

A target of Mo:Si=1:2 was used to form a film comprising molybdenum, silicon, carbon and hydrogen (Mo:32.3 atom %, Si:64.6 atom %, C:1.8 atom % and H:1.3 atom %) at a film thickness of 15 nm under a mixture gas atmosphere of Ar, $CH_4$ and He (a gas flow rate Ar:$CH_4$:He=10:1:50) under conditions of gas pressure:0.1 Pa and DC power:2.0 kW, thereby forming the MoSiCH film (the light shielding layer 11).

In the binary mask blank of Example (1-2) shown in FIG. 1, the light shielding film 10 was made to have a multilayer structure including the light shielding layer 11 made of MoSiCH including the content of Mo of 32.3 atom % in the film and the surface anti-reflection layer 12 made of MoSiON including the content of Mo of 2.6 atom % in the film. The thickness of the light shielding film 10 is 30 nm and its optical density is 2.0.

The auxiliary light shielding film 20 is made of CrOCN including the content of Cr of 33 atom % in the film, its thickness is 30 nm and its optical density is 0.8.

(Manufacture of a Transfer Mask)

Like Example (1-1), a binary transfer mask of Example (1-2) was prepared using the binary mask blank of Example (1-2).

It was confirmed that the binary transfer mask of Example (1-2) shows an effect of sufficiently overcoming the problem of the electromagnetic field (EMF) effect, which can be a problem for the generation in which the DRAM half pitch (hp) is 32 nm specified in semiconductor device design specifications and the later generations, with ArF exposure light, and provides a practical transfer mask.

Example (1-3)

(Manufacture of a Mask Blank)

FIG. 1 is a sectional view of a binary mask blank according to Example (1-3). A synthetic quartz glass substrate having a size of 6 inch square and a thickness of 0.25 inches was used as the transparent substrate 1 and a tantalum nitride (TaN) film (the light shielding layer 11) and a tantalum oxide (TaO) film (the surface anti-reflection layer 12) were formed as the light shielding film 10 on the transparent substrate 1.

Specifically, a DC magnetron sputter was used, and a Ta target was used to form a film consisting of tantalum nitride (TaN) (Ta: 93 atom % and N: 7 atom %) at a film thickness of 26 nm under a mixture gas atmosphere of Ar and $N_2$ (a gas flow rate Ar=39.5 sccm and $N_2$=3 sccm) under conditions of DC power:1.5 kW. Next, the same Ta target was used to form a film consisting of tantalum oxide (TaO) (Ta: 42 atom % and O: 58 atom %) at a film thickness of 10 nm under a mixture gas atmosphere of Ar and $O_2$ (a gas flow rate Ar=58 sccm and $O_2$=32.5 sccm) under conditions of DC power:0.7 kW.

The total thickness of the light shielding film 10 was set to 36 nm. The optical density (OD) of the light shielding film 10 was 2.0 at a wavelength of 193 nm of ArF excimer laser exposure light.

Next, the auxiliary light shielding film 20 was formed on the light shielding film 10 (FIG. 1).

Specifically, a DC magnetron sputter was used and a chromium target was used to form a CrOCN film (the content of Cr in the film:33 atom %) at a film thickness of 30 nm under a mixture gas atmosphere of Ar, $CO_2$, $N_2$ and He (a gas flow rate Ar:$CO_2$:$N_2$:He=21:37:11:31) under a condition (near a $CO_2$ flow rate of 37 sccm) at the start (immediately before) of transition from the metal mode to the reaction mode (see FIG. 7B) under conditions of gas pressure:0.2 Pa, DC power:1.8 kW and voltage: 334 V, thereby forming the auxiliary light shielding film 20.

Thus, a mask blank having the auxiliary light shielding film 20 and the light shielding film 10 for ArF excimer laser exposure and single exposure was obtained.

In addition, analysis on elements of the film was made using Rutherford back scattering analysis.

In the binary mask blank of Example (1-3) shown in FIG. 1, the light shielding film 10 was made to have a multilayer structure including the light shielding layer 11 made of TaN where the content of N is 7 atom % in the film and the surface anti-reflection layer 12 made of TaO where the content of O is 58 atom % in the film. The thickness of the light shielding film 10 is 36 nm and its optical density is 2.0.

The auxiliary light shielding film 20 is made of CrOCN including the content of Cr of 33 atom % in the film, its thickness is 30 nm and its optical density is 0.8.

(Manufacture of a Transfer Mask)

A chemically-amplified positive resist 100 (PRL009 available from Fuji Film Electronics Material Company) of thickness of 100 nm for electron beam drawing (exposure) was applied on the auxiliary light shielding film 20 of the mask blank using spin coating [FIG. 1 and FIG. 8A].

Next, the resist film 100 was drawn to have a desired pattern using an electron beam drawing apparatus and was developed with a developer to form a resist pattern 100a [FIG. 8B].

Next, an auxiliary light shielding film pattern 20a was formed by dry etching the auxiliary light shielding film 20 using the resist pattern 100a as a mask [FIG. 8C]. A mixture gas of $Cl_2$ and $O_2$ ($Cl_2$:$O_2$=4:1) was used as a dry etching gas.

Next, a residual resist pattern 100a was stripped away by a chemical solution.

Next, using the auxiliary light shielding film pattern 20a as a mask, the light shielding film 10 was dry-etched to form a light shielding film pattern 10a [FIG. 8D]. At this time, a mixture gas of $CHF_3$ and He was used as a dry etching gas for a tantalum oxide (TaO) layer 12. $Cl_2$ gas was used as a dry etching gas for a tantalum nitride (TaN) layer 11.

Next, the resist pattern 100a is stripped away and a resist film 110 of a positive resist (FEP171 available from Fuji Film Electronics Material Company) of thickness of 200 nm for electron beam drawing (exposure) was applied on the substrate using spin coating [FIG. 8E].

Next, the resist film 110 is drawn and exposed to form a light shielding portion (light shielding band) pattern using an electron beam drawing apparatus and was developed with a developer to form a resist pattern 110b [FIG. 8F], and then, using the resist pattern 110a as a mask, the auxiliary light shielding film pattern 20a is dry-etched using a mixture gas of $Cl_2$ and $O_2$ ($Cl_2$:$O_2$=4:1) to form an auxiliary light shielding film pattern 20b [FIG. 8G].

Next, the resist pattern 110b was stripped away and then a washing process was carried out to obtain a binary transfer mask having a light shielding portion (light shielding band) 80 including the auxiliary light shielding film pattern 20b and the underlying light shielding film pattern 10a [FIG. 8H].

It was confirmed that the binary transfer mask of Example (1-3) shows an effect of sufficiently overcoming the problem of the electromagnetic field (EMF) effect, which can be a problem for the generation in which the DRAM half pitch (hp) is 32 nm specified in semiconductor device design specifications and the later generations, with ArF exposure light, and provides a practical transfer mask.

Although in the example of manufacture of the transfer mask the resist pattern 100a is stri pped away after forming the auxiliary light shielding film pattern 20a, the resist pattern 100a may be stripped away after the light shielding film pattern 10a is formed. In addition, in the dry etching of the light shielding film 10, tantalum oxide of the surface anti-reflection layer 12 and tantalum nitride of the light shielding layer 11 may be etched at the same time.

Examples (1-4) to (1-6)

Examples (1-4) to (1-6) are similar to Examples (1-1) to (1-3) except that an etching mask (hard mask) film 30 is formed on the auxiliary light shielding film 20.

In Examples (1-4) to (1-6), as shown in FIG. 2, a MoSiON film was formed as the etching mask film 30 on the auxiliary light shielding film 20 shown in each of Examples (1-1) to (1-3).

Specifically, the same MoSiON film used for the surface anti-reflection layer 12 was formed at a thickness of 10 nm to form the etching mask film 30.

Next, a very thin adhesion enhancement layer 60 formed of a HMDS layer was formed on the etching mask film 30 by contacting the film 30 to the HMDS that is evaporated and scattered using nitrogen gas. The HMDS layer is a hydrophobic surface layer to enhance adhesion of a resist.

In the binary mask blank of Example (1-4) shown in FIG. 2, the light shielding film 10 was made to have a multilayer structure including the light shielding layer 11 made of MoSiCH where the content of Mo is 19.8 atom % in the film and the surface anti-reflection layer 12 made of MoSiON where the content of Mo is 2.6 atom % in the film. The thickness of the light shielding film 10 is 30 nm and its optical density is 2.0.

The auxiliary light shielding film 20 is made of CrOCN where the content of Cr is 33 atom % in the film, its thickness is 30 nm and its optical density is 0.8.

Thereon are formed the etching mask film 30 made of MoSiON where the content of Mo is 2.6 atom % in the film and having the thickness of 10 nm and a very thin adhesion enhancement layer 60 formed of the HMDS layer.

In the binary mask blank of Example (1-5) shown in FIG. 2, the light shielding film 10 was made to have a multilayer structure including the light shielding layer 11 made of MoSiCH where the content of Mo is 32.3 atom % in the film and the surface anti-reflection layer 12 made of MoSiON where the content of Mo is 2.6 atom % in the film. The thickness of the light shielding film 10 is 30 nm and its optical density is 2.0.

The auxiliary light shielding film 20 is made of CrOCN where the content of Cr is 33 atom % in the film, its thickness is 30 nm and its optical density is 0.8.

Thereon are formed the etching mask film 30 made of MoSiON where the content of Mo is 2.6 atom % in the film and having the thickness of 10 nm and the very thin adhesion enhancement layer 60 formed of the HMDS layer.

In the binary mask blank of Example (1-6) shown in FIG. 2, the light shielding film 10 was made to have a multilayer structure including the light shielding layer 11 made of TaN where the content of N is 7 atom % in the film and the surface anti-reflection layer 12 made of TaO where the content of O is 58 atom % in the film. The thickness of the light shielding film 10 is 36 nm and its optical density is 2.0.

The auxiliary light shielding film 20 is made of CrOCN where the content of Cr is 33 atom % in the film, its thickness is 30 nm and its optical density is 0.8.

Thereon are formed the etching mask film 30 made of MoSiON where the content of Mo is 2.6 atom % in the film and having the thickness of 10 nm and the very thin adhesion enhancement layer 60 formed of the HDMS layer.

In the aspects of Examples (1-4) to (1-6), the light shielding film 10 is thinned to the limit of transfer contrast. The optical density required for the light shielding band is obtained by stacking of the light shielding film 10 and the auxiliary light shielding film 20.

In the aspects of Examples (1-4) to (1-6), since the auxiliary light shielding film and the etching mask film are divided as dedicated films, the etching mask 30 can be thinner than the Cr-based auxiliary light shielding film 20 (also serving as an etching mask) of Examples (1-1) to (1-3), thereby thinning a resist.

(Manufacture of a Transfer Mask)

Binary transfer masks of Examples (1-4) to (1-6) were manufactured using the binary mask blanks of Examples (1-4) to (1-6).

Figure 9A:
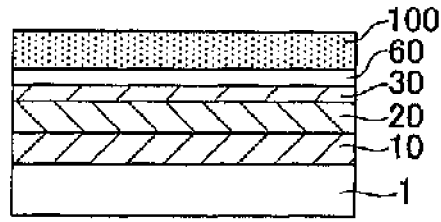
FIG. 9 is a schematic sectional view used to explain a process of manufacturing a transfer mask according to another example of the present invention.

Specifically, a chemically-amplified positive resist 100 (PRL009 available from Fuji Film Electronics Material Company) of thickness of 75 nm for electron beam drawing (exposure) was applied on the adhesion enhancement layer 60 of the mask blank using spin coating [FIG. 2 and FIG. 9A].

Figure 9B:
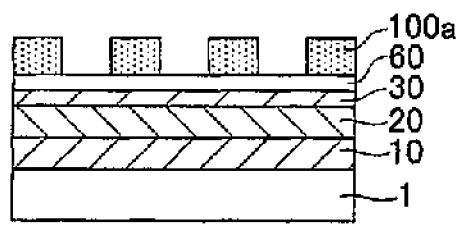

Next, the resist film 100 was drawn to have a desired pattern using an electron beam drawing apparatus and was developed with a developer to form a resist pattern 100a [FIG. 9B].

Figure 9C:
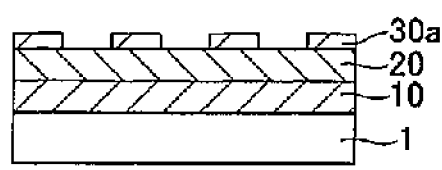

Next, an etching mask film pattern 30a was formed by dry etching the adhesion enhancement layer 60 and the etching mask film 30 using the resist pattern 100a as a mask [FIG. 9C]. A mixture gas of $SF_6$ and He was used as a dry etching gas.

Next, a pattern of residual resist pattern 100a and adhesion enhancement layer 60 was stripped away by a chemical solution.

Figure 9D:
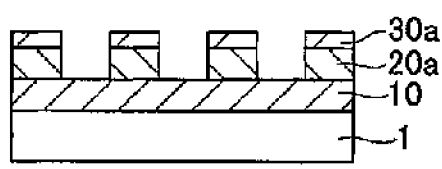

Next, using the etching mask film pattern 30a as a mask, the auxiliary light shielding film 20 is dry-etched to form an auxiliary light shielding film pattern 20a [FIG. 9D]. A mixture gas of $Cl_2$ and $O_2$ ($Cl_2:O_2$=4:1) was used as a dry etching gas.

Figure 9E:
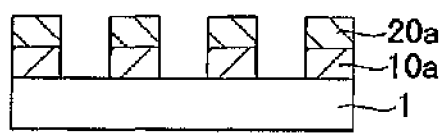
Figure 9F:
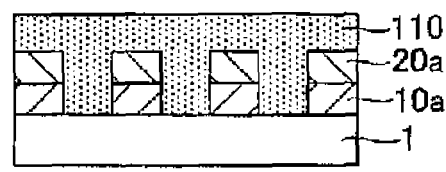
Figure 9G:
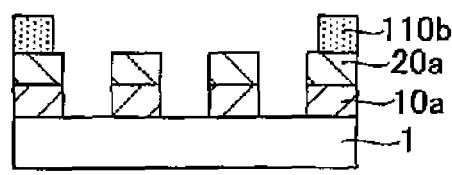
Figure 9H:
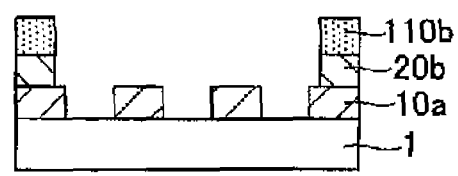
Figure 9I:
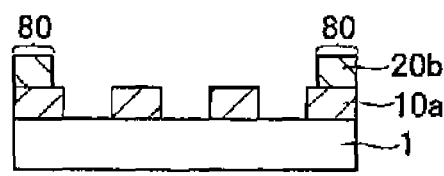

Next, using the etching mask film pattern 30a and the auxiliary light shielding film pattern 20a as a mask, the light shielding film 10 is dry-etched using a mixture gas of $SF_6$ and He to form a light shielding film pattern 10a [FIG. 9E]. At this time, the etching mask film pattern 30a was etched away together.

The subsequent steps are similar to the steps of FIGS. 8E to 8H in Examples (1-1) to (1-3) and therefore, explanation thereof will be omitted.

It was confirmed that the binary transfer masks of Examples (1-4) to (1-6) show an effect of sufficiently overcoming the problem of the electromagnetic field (EMF) effect, which can be a problem for the generation in which the DRAM half pitch (hp) is 32 nm specified in semiconductor device design specifications and the later generations, with ArF exposure light, and provide a practical transfer mask.

Examples (1-7) to (1-9)

Examples (1-7) to (1-9) are similar to Examples (1-4) to (1-6) except that an etching mask (hard mask) film 30 is formed on the auxiliary light shielding film 20 and a second etching mask (hard mask) film 40 is formed on the etching mask film 30, as shown in FIG. 3.

In Examples (1-7) to (1-9), a MoSiON film was formed as the etching mask film 30 on the auxiliary light shielding film 20 shown in each of Examples (1-1) to (1-3) and a CrOCN film was formed as the second etching mask film 40 thereon.

Specifically, the same MoSiON film used for the surface anti-reflection layer 12 was formed at a thickness of 10 nm to form the etching mask film 30.

Next, the same CrOCN film used for the auxiliary light shielding film 20 was formed at a thickness of 10 nm to form the second etching mask film 40.

In the binary mask blank of Example (1-7) shown in FIG. 3, the light shielding film 10 was made to have a multilayer structure including the light shielding layer 11 made of MoSiCH where the content of Mo of 19.8 atom % in the film and the surface anti-reflection layer 12 made of MoSiON including the content of Mo of 2.6 atom % in the film. The thickness of the light shielding film 10 is 30 nm and its optical density is 2.0.

The auxiliary light shielding film 20 is made of CrOCN where the content of Cr is 33 atom % in the film, its thickness is 30 nm and its optical density is 0.8.

Thereon is formed the etching mask film 30 made of MoSiON including the content of Mo of 2.6 atom % in the film and having the thickness of 10 nm.

Thereon is formed the second etching mask film 40 made of CrOCN including the content of Cr of 33 atom % in the film and having the thickness of 10 nm.

In the binary mask blank of Example (1-8) shown in FIG. 3, the light shielding film 10 was made to have a multilayer structure including the light shielding layer 11 made of MoSiCH where the content of Mo is 32.3 atom % in the film and the surface anti-reflection layer 12 made of MoSiON where the content of Mo is 2.6 atom % in the film. The thickness of the light shielding film 10 is 30 nm and its optical density is 2.0.

The auxiliary light shielding film 20 is made of CrOCN where the content of Cr is 33 atom % in the film, its thickness is 30 nm and its optical density is 0.8.

Thereon is formed the etching mask film 30 made of MoSiON where the content of Mo is 2.6 atom % in the film and having the thickness of 10 nm.

Thereon is formed the second etching mask film 40 made of CrOCN where the content of Cr is 33 atom % in the film and having the thickness of 10 nm.

In the binary mask blank of Example (1-9) shown in FIG. 3, the light shielding film 10 was made to have a multilayer structure including the light shielding layer 11 made of TaN where the content of N is 7 atom % in the film and the surface anti-reflection layer 12 made of TaO where the content of O is 58 atom % in the film. The thickness of the light shielding film 10 is 36 nm and its optical density is 2.0.

The auxiliary light shielding film 20 is made of CrOCN where the content of Cr is 33 atom % in the film, its thickness is 30 nm and its optical density is 0.8.

Thereon is formed the etching mask film 30 made of MoSiON where the content of Mo is 2.6 atom % in the film and having the thickness of 10 nm.

Thereon is formed the second etching mask film 40 made of CrOCN where the content of Cr is 33 atom % in the film and having the thickness of 10 nm.

In the aspects of Examples (1-7) to (1-9), the light shielding film 10 is thinned to the limit of transfer contrast. The optical density required for the light shielding band is obtained by stacking of the light shielding film 10 and the auxiliary light shielding film 20.

In the aspects of Examples (1-7) to (1-9), since the auxiliary light shielding film and the etching mask film are divided as dedicated films, the etching mask 30 can be thinner than the Cr-based auxiliary light shielding film 20 (also serving as an etching mask) of Examples (1-1) to (1-3), thereby thinning a resist.

In the aspects of Examples (1-7) to (1-9), employment of the chromium-based second etching mask film 40 achieves thinness and improved adhesion of a resist as compared to Examples (1-4) to (1-6).

(Manufacture of a Transfer Mask)

Binary transfer masks of Examples (1-7) to (1-9) were manufactured using the binary mask blanks of Examples (1-7) to (1-9).

Figure 10A:
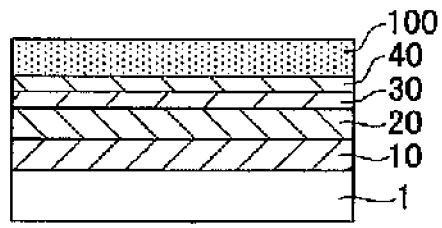
FIG. 10 is a schematic sectional view used to explain a process of manufacturing a transfer mask according to still another example of the present invention.

Specifically, a chemically-amplified positive resist 100 (PRL009 available from Fuji Film Electronics Material Company) of thickness of 50 nm for electron beam drawing (exposure) was applied on the second etching mask film 40 of the mask blank using spin coating [FIG. 3 and FIG. 10A].

Figure 10B:
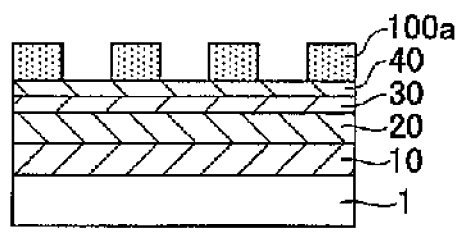

Next, the resist film 100 was drawn to have a desired pattern using an electron beam drawing apparatus and was developed with a developer to form a resist pattern 100a [FIG. 10B].

Figure 10C:
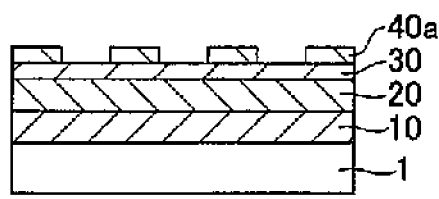

Next, a second etching mask film pattern 40a was formed by dry etching the second etching mask film 40 using the resist pattern 100a as a mask [FIG. 10C]. A mixture gas of $Cl_2$ and $O_2$ ($Cl_2:O_2=4:1$) was used as a dry etching gas.

Next, a residual resist pattern 100a was stripped away by a chemical solution.

Figure 10D:
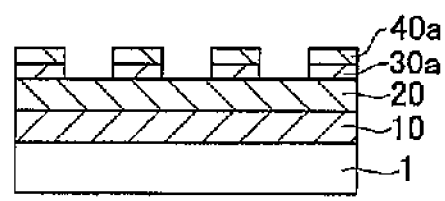

Next, using the second etching mask film pattern 40a as a mask, the etching mask film 30 is dry-etched to form an etching mask film pattern 30a [FIG. 10D]. A mixture gas of $SF_6$ and He was used as a dry etching gas.

Figure 10E:
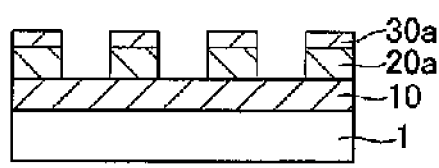

Next, using the second etching mask film pattern 40a and the etching mask film pattern 30a as a mask, the auxiliary light shielding film 20 is dry-etched to form an auxiliary light shielding film pattern 20a [FIG. 10E]. A mixture gas of $Cl_2$ and $O_2$ ($Cl_2:O_2=4:1$) was used as a dry etching gas. At this time, the second etching mask film pattern 40a was etched away together.

Figure 10F:
Figure 10G:
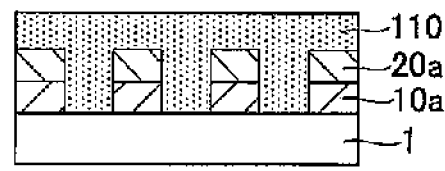
Figure 10H:
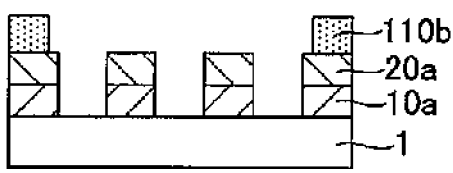
Figure 10I:
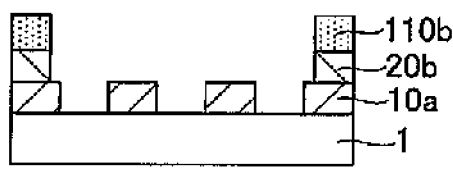
Figure 10J:
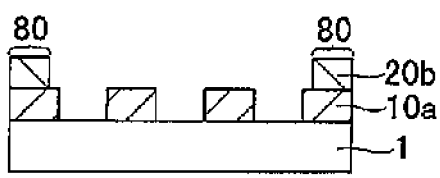

Next, using the etching mask film pattern 30a and the auxiliary light shielding film pattern 20a as a mask, the light shielding film 10 is dry-etched using a mixture gas of $SF_6$ and He to form a light shielding film pattern 10a [FIG. 10F]. At this time, the etching mask film pattern 30a was etched away together.

The subsequent steps are similar to the steps of FIGS. 8E to 8H in Examples (1-1) to (1-3) and therefore, explanation thereof will be omitted.

It was confirmed that the binary transfer masks of Examples (1-7) to (1-9) show an effect of sufficiently overcoming the problem of the electromagnetic field (EMF) effect, which can be a problem for the generation in which the DRAM half pitch (hp) is 32 nm specified in semiconductor device design specifications and the later generations, with ArF exposure light, and provide a practical transfer mask.

Examples (1-10) to (1-12)

Examples (1-10) to (1-12) are similar to Examples (1-1) to (1-3) except that an auxiliary light shielding film 20 having a multilayer structure including an etching stopper and mask layer 21 and an auxiliary light shielding layer 22 is formed on the light shielding film 10 (with a change in a structure of the auxiliary light shielding film 20, and formation position, material and thickness of the layers) and an adhesion enhancement layer 60 is formed thereon, as shown in FIG. 4.

In Examples (1-10) to (1-12), a CrOCN film was formed as the etching stopper and mask layer 21 on the light shielding film 10 shown in each of Examples (1-1) to (1-3), a MoSiCH film was formed as the auxiliary light shielding layer 22 thereon, and a HMDS layer was formed as the adhesion enhancement layer 60 thereon.

Specifically, the same CrOCN film used for the auxiliary light shielding film 20 of Example (1-1) was formed at a thickness of 10 nm to form the etching stopper and mask layer 21.

Next, the same MoSiCH film used for the light shielding layer 11 of Example (1-1) was formed at a thickness of 15 nm to form the auxiliary light shielding layer 22.

Next, a very thin adhesion enhancement layer 60 formed of a HMDS layer was formed on the auxiliary light shielding layer 22 by contacting the layer 22 to an HMDS (hexamethyldisilazane) that is evaporated and scattered using nitrogen gas. The HMDS layer is a hydrophobic surface layer to enhance adhesion of a resist.

In the binary mask blank of Example (1-10) shown in FIG. 4, the light shielding film 10 was made to have a multilayer structure including the light shielding layer 11 made of MoSiCH where the content of Mo is 19.8 atom % in the film and the surface anti-reflection layer 12 made of MoSiON where the content of Mo is 2.6 atom % in the film. The thickness of the light shielding film 10 is 30 nm and its optical density is 2.0.

Thereon was formed the etching stopper and mask layer 21 made of CrOCN where the content of Cr is 33 atom % in the film and having a thickness of 10 nm. Thereon was formed the auxiliary light shielding layer 22 made of MoSiCH where the content of Mo is 19.8 atom % in the film and having a thickness of 15 nm. The auxiliary light shielding film 20 having a thickness of 25 nm is formed by a multilayer structure including the etching stopper and mask layer 21 and the auxiliary light shielding layer 22, and the optical density of the multilayer structure is 0.8.

Thereon was formed a very thin HMDS layer as the adhesion enhancement layer 60.

In the binary mask blank of Example (1-11) shown in FIG. 4, the light shielding film 10 was made to have a multilayer structure including the light shielding layer 11 made of MoSiCH where the content of Mo is 32.3 atom % in the film and the surface anti-reflection layer 12 made of MoSiON where the content of Mo is 2.6 atom % in the film. The thickness of the light shielding film 10 is 30 nm and its optical density is 2.0.

Thereon was formed the etching stopper and mask layer 21 made of CrOCN where the content of Cr is 33 atom % in the film. Thereon was formed the auxiliary light shielding layer 22 made of MoSiCH where the content of Mo is 19.8 atom % in the film and having a thickness of 15 nm. The auxiliary light shielding film 20 having a thickness of 25 nm is formed by a multilayer structure including the etching stopper and mask layer 21 and the auxiliary light shielding layer 22, and the optical density of the multilayer structure is 0.8.

Thereon was formed a very thin HMDS layer as the adhesion enhancement layer 60.

In the binary mask blank of Example (1-12) shown in FIG. 4, the light shielding film 10 was made to have a multilayer structure including the light shielding layer 11 made of TaN where the content of N is 7 atom % in the film and the surface anti-reflection layer 12 is made of TaO where the content of O is 58 atom % in the film. The thickness of the light shielding film 10 is 36 nm and its optical density is 2.0.

Thereon was formed the etching stopper and mask layer 21 made of CrOCN where the content of Cr is 33 atom % in the film and having a thickness of 10 nm. Thereon was formed the auxiliary light shielding layer 22 made of MoSiCH where the content of Mo is 19.8 atom % in the film and having a thickness of 15 nm. The auxiliary light shielding film 20 having a thickness of 25 nm is formed by a multilayer structure including the etching stopper and mask layer 21 and the auxiliary light shielding layer 22, and the optical density of the multilayer structure is 0.8.

Thereon was formed a very thin HMDS layer as the adhesion enhancement layer 60.

In the aspects of Examples (1-10) to (1-12), the light shielding film 10 is thinned to the limit of transfer contrast. The optical density required for the light shielding band is obtained by stacking of the light shielding film 10 and the auxiliary light shielding film 20.

In the aspects of Examples (1-10) to (1-12), the etching stopper and mask layer 21 for the light shielding film 10 can be thinned as compared to the Cr-based auxiliary light shielding film 20 (also serving as an etching mask) of Examples (1-1) to (1-3), thereby obtaining the light shielding film 10 with higher etching precision.

In the aspects of Examples (1-10) to (1-12), the auxiliary light shielding film 20 can be thinned at the same optical density as compared to the Cr-based auxiliary light shielding film 20 of Examples (1-1) to (1-3). The auxiliary light shielding film 20 having this small thickness allows a resist to be thinned as compared to the aspects of Examples (1-1) to (1-3).

(Manufacture of a Transfer Mask)

Binary transfer masks of Examples (1-10) to (1-12) were manufactured using the binary mask blanks of Examples (1-10) to (1-12).

Figure 11A:
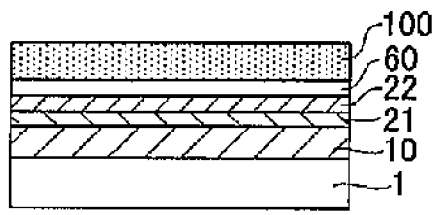
FIG. 11 is a schematic sectional view used to explain a process of manufacturing a transfer mask according to still another example of the present invention.

Specifically, a chemically-amplified positive resist 100 (PRL009 available from Fuji Film Electronics Material Company) having a thickness of 75 nm for electron beam drawing (exposure) was applied on the adhesion enhancement layer 60 of the mask blank using spin coating [FIG. 4 and FIG. 11A].

Figure 11B:
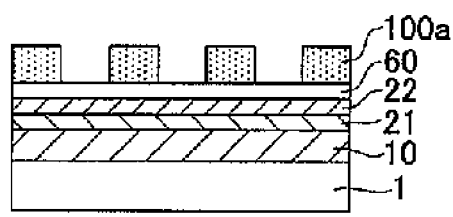

Next, the resist film 100 was drawn to have a desired pattern using an electron beam drawing apparatus and was developed with a developer to form a resist pattern 100a [FIG. 11B].

Figure 11C:
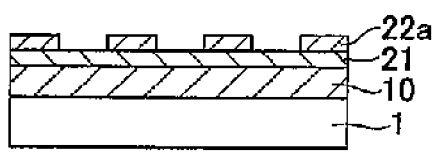

Next, an auxiliary light shielding layer pattern 22a was formed by dry etching the auxiliary light shielding layer 22 using the resist pattern 100a as a mask [FIG. 11C]. A mixture gas of $SF_6$ and He was used as a dry etching gas. In addition, the adhesion enhancement layer 60 was patterned together by dry etching.

Next, a residual resist pattern 100a was stripped away by a chemical solution. At this time, the adhesion enhancement layer 60 was stripped away together.

Figure 11D:
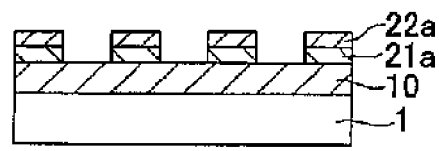

Next, using the auxiliary light shielding layer pattern 22a as a mask, the etching stopper and mask layer 21 was dry-etched to form an etching stopper and mask layer pattern 21a [FIG. 11D]. A mixture gas of $Cl_2$ and $O_2$ ($Cl_2:O_2=4:1$) was used as a dry etching gas.

Figure 11E:
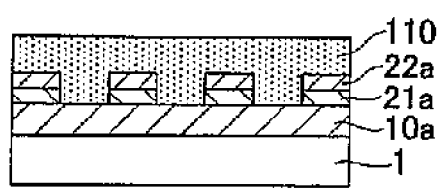

Next, a resist film 110 of a positive resist (FEP171 available from Fuji Film Electronics Material Company) having a thickness of 200 nm for electron beam drawing (exposure) was applied on the substrate using spin coating [FIG. 11E].

Figure 11F:
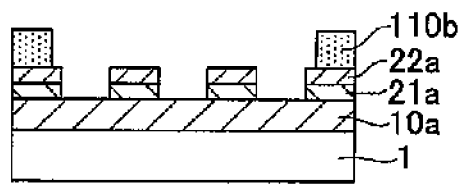

Next, the resist film 110 is drawn and exposed to form a light shielding portion (light shielding band) pattern using an electron beam drawing apparatus and was developed with a developer to form a resist pattern 110b [FIG. 11F].

Figure 11G:
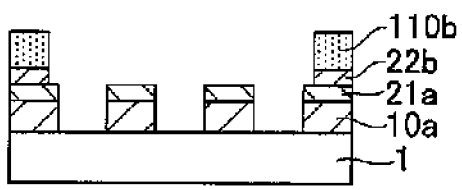

Next, using the etching stopper and mask layer 21a as a mask, the light shielding film 10 was dry-etched using a mixture gas of $SF_6$ and He to form a light shielding film pattern 10a [FIG. 11G]. At the same time, using the resist pattern 110a as a mask, the auxiliary light shielding layer pattern 22a is dry-etched to form an auxiliary light shielding layer pattern 22b [FIG. 11G].

Figure 11H:
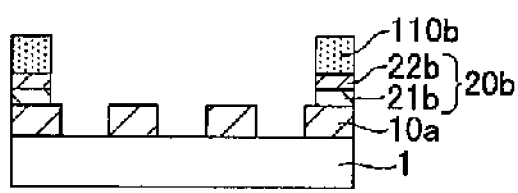

Next, using the resist pattern 110b and the auxiliary light shielding layer pattern 22b as a mask, the etching stopper and mask layer pattern 21a is dry-etched using a mixture gas of $Cl_2$ and $O_2$ ($Cl_2:O_2=4:1$) to form an etching stopper and mask layer pattern 21b [FIG. 11H].

Figure 11I:
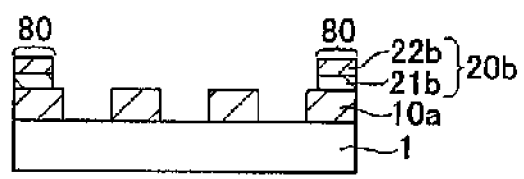

Next, the resist pattern 110b was stripped away and then a washing process was carried out to obtain a transfer mask having a light shielding portion (light shielding band) 80 including the auxiliary light shielding film pattern 20b and the underlying light shielding film pattern 10a [FIG. 11I].

Thus, the binary transfer masks of Examples (1-10) and (1-11) were manufactured.

Example (1-12) formed a light shielding film pattern 10a by dry etching the light shielding film 10 using the etching stopper and mask layer pattern 21a as a mask in FIG. 11G of Example (1-10). At this time, a tantalum oxide (TaO) layer 12 and a tantalum nitride (TaN) layer 11 were continuously etched using a mixture gas of $CHF_3$ and He as a dry etching gas. At the same time, using the resist pattern 110b as a mask, the auxiliary light shielding layer pattern 22a was dry-etched to form an auxiliary light shielding layer pattern 22b [FIG. 11G].

The binary transfer mask of Example (1-12) was manufactured in the same manner as Example (1-10) except for the above described further steps.

It was confirmed that the binary transfer masks of Examples (1-10) to (1-12) show an effect of sufficiently overcoming the problem of the electromagnetic field (EMF) effect, which can be a problem for the generation in which the DRAM half pitch (hp) is 32 nm specified in semiconductor device design specifications and the later generations, with ArF exposure light, and provide a practical transfer mask.

Examples (1-13) to (1-15)

Examples (1-13) to (1-15) are similar to Examples (1-4) to (1-6) except that an etching stopper and mask layer 21 is formed on the light shielding film 10, an auxiliary light shielding layer 22 is formed thereon (with a change in a structure of the auxiliary light shielding film 20, and formation position, material and thickness of the layers) and an etching mask film 70 is formed thereon, as shown in FIG. 5.

In Examples (1-13) to (1-15), a CrOCN film was formed as the etching stopper and mask layer 21 on the light shielding film 10 shown in each of Examples (1-1) to (1-3), a MoSiCH film was formed as the auxiliary light shielding layer 22 thereon, and a CrOCN film was formed as the etching mask film 70 thereon.

Specifically, the same CrOCN film used for the auxiliary light shielding film 20 of Example (1-1) was formed at a thickness of 10 nm to form the etching stopper and mask layer 21.

Next, the same MoSiCH film used for the light shielding layer 11 of Example (1-1) was formed at a thickness of 15 nm to form the auxiliary light shielding layer 22.

Next, the same CrOCN film for the auxiliary light shielding film 20 of Example (1-1) was formed at a thickness of 10 nm to form the etching mask film 70.

In the binary mask blank of Example (1-13) shown in FIG. 5, the light shielding film 10 was made to have a multilayer structure including the light shielding layer 11 made of MoSiCH where the content of Mo is 19.8 atom % in the film and the surface anti-reflection layer 12 made of MoSiON where the content of Mo is 2.6 atom % in the film. The thickness of the light shielding film 10 is 30 nm and its optical density is 2.0.

Thereon was formed the etching stopper and mask layer 21 made of CrOCN where the content of Cr is 33 atom % in the film and having a thickness of 10 nm. Thereon was formed the auxiliary light shielding layer 22 made of MoSiCH where the content of Mo is 19.8 atom % in the film and having a thickness of 15 nm. The auxiliary light shielding film 20 having a thickness of 25 nm is formed by a multilayer structure including the etching stopper and mask layer 21 and the auxiliary light shielding layer 22, and the optical density of the multilayer structure is 0.8.

Thereon was formed the etching mask film 70 made of CrOCN including the content of Cr of 33 atom % in the film and having a thickness of 10 nm.

In the binary mask blank of Example (1-14) shown in FIG. 5, the light shielding film 10 was made to have a multilayer structure including the light shielding layer 11 made of MoSiCH where the content of Mo is 33 atom % in the film and the surface anti-reflection layer 12 is made of MoSiON where the content of Mo is 2.6 atom % in the film. The thickness of the light shielding film 10 is 30 nm and its optical density is 2.0.

Thereon was formed the etching stopper and mask layer 21 made of CrOCN where the content of Cr is 33 atom % in the film and having a thickness of 10 nm. Thereon was formed the auxiliary light shielding layer 22 made of MoSiCH where the content of Mo is 19.8 atom % in the film and having a thickness of 15 nm. The auxiliary light shielding film 20 having a thickness of 25 nm is formed by a multilayer structure including the etching stopper and mask layer 21 and the auxiliary light shielding layer 22, and the optical density of the multilayer structure is 0.8.

Thereon was formed the etching mask film 70 made of CrOCN where the content of Cr is 33 atom % in the film and having a thickness of 10 nm.

In the binary mask blank of Example (1-15) shown in FIG. 5, the light shielding film 10 was made to have a multilayer structure including the light shielding layer 11 made of TaN where the content of N is 7 atom % in the film and the surface anti-reflection layer 12 is made of TaO where the content of O is 58 atom % in the film. The thickness of the light shielding film 10 is 36 nm and its optical density is 2.0.

Thereon was formed the etching stopper and mask layer 21 made of CrOCN where the content of Cr is 33 atom % in the film and having a thickness of 10 nm. Thereon was formed the auxiliary light shielding layer 22 made of MoSiCH where the content of Mo is 19.8 atom % in the film and having a thickness of 15 nm. The auxiliary light shielding film 20 having a thickness of 25 nm is formed by a multilayer structure including the etching stopper and mask layer 21 and the auxiliary light shielding layer 22, and the optical density of the multilayer structure is 0.8.

Thereon was formed the etching mask film 70 made of CrOCN where the content of Cr is 33 atom % in the film and having a thickness of 10 nm.

In the aspects of Examples (1-13) to (1-15), the light shielding film 10 is thinned to the limit of transfer contrast. The optical density required for the light shielding band is obtained by stacking of the light shielding film 10 and the auxiliary light shielding film 20.

In the aspects of Examples (1-13) to (1-15), the etching stopper and mask layer 21 for the light shielding film 10 can be thinned as compared to the Cr-based auxiliary light shielding film 20 (also serving as an etching mask) of Examples (1-1) to (1-3), thereby obtaining the light shielding film 10 with higher etching precision.

In the aspects of Examples (1-13) to (1-15), the auxiliary light shielding film 20 can be thinned at the same optical density as compared to the Cr-based auxiliary light shielding film 20 (also serving as an etching mask) of Examples (1-1) to (1-3). The auxiliary light shielding film 20 having this small thickness allows a resist to be thinned as compared to the aspects of Examples (1-1) to (1-3).

In addition, employment of the chromium-based etching mask film 70 achieves thinness and improved adhesion of a resist as compared to Examples (1-10) to (1-12).

(Manufacture of a Transfer Mask)

Binary transfer masks of Examples (1-13) to (1-15) were manufactured using the binary mask blanks of Examples (1-13) to (1-15).

Figure 12A:
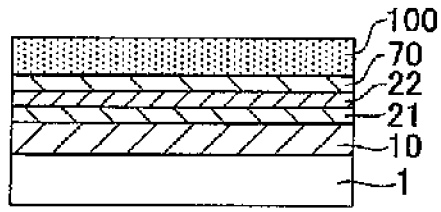
FIG. 12 is a schematic sectional view used to explain a process of manufacturing a transfer mask according to still another example of the present invention.

Specifically, a chemically-amplified positive resist 100 (PRL009 available from Fuji Film Electronics Material Company) of thickness of 50 nm for electron beam drawing (exposure) was applied on the etching mask film 70 of the mask blank using spin coating [FIG. 5 and FIG. 12A].

Figure 12B:
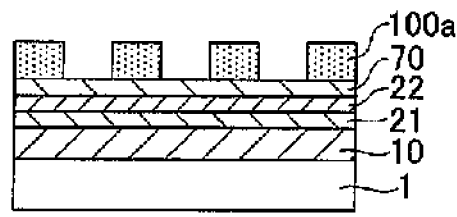

Next, the resist film 100 was drawn to have a desired pattern using an electron beam drawing apparatus and was developed with a developer to form a resist pattern 100a [FIG. 12B].

Figure 12C:
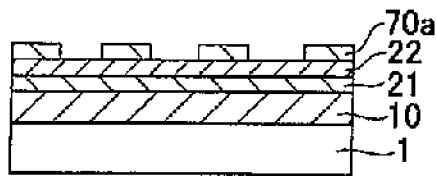

Next, an etching mask film pattern 70a was formed by dry etching the etching mask film 70 using the resist pattern 100a as a mask [FIG. 12C]. A mixture gas of $Cl_2$ and $O_2$ ($Cl_2:O_2$=4:1) was used as a dry etching gas.

Next, a residual resist pattern 100a was stripped away by a chemical solution.

Figure 12D:
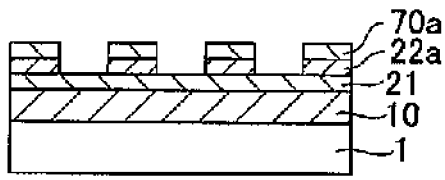

Next, using the etching mask film pattern 70a as a mask, the auxiliary light shielding layer 22 was dry-etched to form an auxiliary light shielding layer pattern 22a [FIG. 12D]. A mixture gas of $SF_6$ and He was used as a dry etching gas.

Figure 12E:
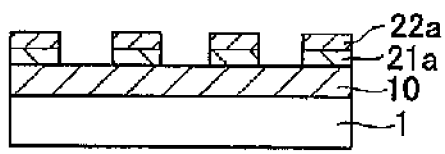

Next, using the auxiliary light shielding layer pattern 22a as a mask, the etching stopper and mask layer 21 was dry-etched to form an etching stopper and mask layer pattern 21a [FIG. 12E]. A mixture gas of $Cl_2$ and $O_2$ ($Cl_2$:$O_2$=4:1) was used as a dry etching gas. At this time, the etching mask film 70 was stripped away together by etching.

Figure 12F:
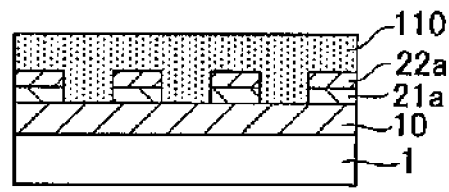

Next, a resist film 110 of a positive resist (FEP171 available from Fuji Film Electronics Material Company) of thickness of 200 nm for electron beam drawing (exposure) was applied on the substrate using spin coating [FIG. 12F].

Figure 12G:
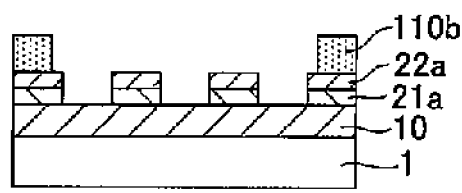

Next, the resist film 110 is drawn and exposed to form a light shielding portion (light shielding band) pattern using an electron beam drawing apparatus and was developed with a developer to form a resist pattern 110b [FIG. 12G].

Figure 12H:
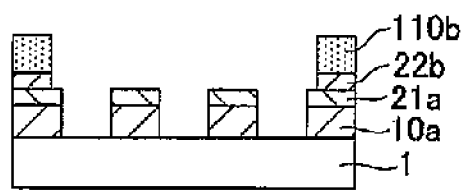

Next, using the etching stopper and mask layer 21a as a mask, the light shielding film 10 was dry-etched using a mixture gas of $SF_6$ and He to form a light shielding film pattern 10a [FIG. 12H]. At the same time, using the resist pattern 110b as a mask, the auxiliary light shielding layer pattern 22a is dry-etched to form an auxiliary light shielding layer pattern 22b [FIG. 12H].

Figure 12I:
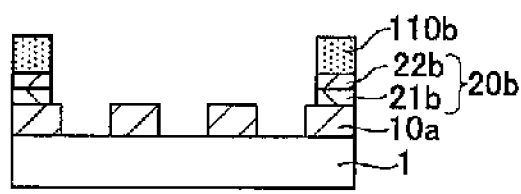

Next, using the resist pattern 110b and the auxiliary light shielding layer pattern 22b as a mask, the etching stopper and mask layer pattern 21a is dry-etched using a mixture gas of $Cl_2$ and $O_2$ ($Cl_2$:$O_2$=4:1) to form an etching stopper and mask layer pattern 21b [FIG. 12I].

Figure 12J:
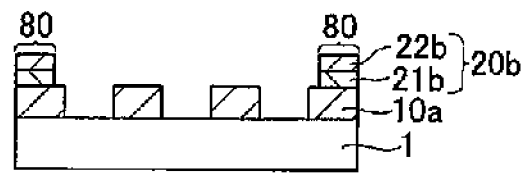

Next, the resist pattern 110b was stripped away and then a washing process was carried out to obtain a transfer mask having a light shielding portion (light shielding band) 80 including the auxiliary light shielding film pattern 20b and the underlying light shielding film pattern 10a [FIG. 12J].

Thus, the binary transfer masks of Examples (1-13) and (1-14) were manufactured.

Example (1-15) formed a light shielding film pattern 10a by dry etching the light shielding film 10 using the etching stopper and mask layer pattern 21a as a mask in FIG. 12H of Example (1-13). At this time, a tantalum oxide (TaO) layer 12 and a tantalum nitride (TaN) layer 11 were continuously etched using a mixture gas of $CHF_3$ and He as a dry etching gas. At the same time, using the resist pattern 110b as a mask, the auxiliary light shielding layer pattern 22a was dry-etched to form an auxiliary light shielding layer pattern 22b [FIG. 12H].

The binary transfer mask of Example (1-15) was manufactured in the same manner as Example (1-13) except for the above described further steps.

It was confirmed that the binary transfer masks of Examples (1-13) to (1-15) show an effect of sufficiently overcoming the problem of the electromagnetic field (EMF) effect, which can be a problem for the generation in which the DRAM half pitch (hp) is 32 nm specified in semiconductor device design specifications and the later generations, with ArF exposure light, and provide a practical transfer mask.

Examples (2-1) to (2-9)

(Manufacture of a Mask Blank)

Examples (2-1) to (2-9) are similar to Examples (1-1) to (1-9) except that the thickness of the auxiliary light shielding film 20 is 35 nm, the optical density of the auxiliary light shielding film 20 is 1.1, and the binary mask blank is used for double exposure.

(Manufacture of a Transfer Mask)

Binary transfer masks of Examples (2-1) to (2-9) were manufactured using the binary mask blanks of Examples (2-1) to (2-9), like Examples (1-1) to (1-9).

It was confirmed that the binary transfer masks of Examples (2-1) to (2-9) show an effect of sufficiently overcoming the problem of the electromagnetic field (EMF) effect, which can be a problem for the generation in which the DRAM half pitch (hp) is 32 nm specified in semiconductor device design specifications and the later generations, with ArF exposure light, and provide a practical transfer mask.

Examples (2-10) to (2-15)

(Manufacture of a Mask Blank)

Examples (2-10) to (2-15) are similar to Examples (1-10) to (1-15) except that the thickness of the auxiliary light shielding layer 22 using a MoSiCH film where the content of Mo is 32.3 atom % in the film, the thickness is 20 nm, the optical density of the auxiliary light shielding film 20 is 1.1, and the binary mask blank is used for double exposure.

(Manufacture of a Transfer Mask)

Binary transfer masks of Examples (2-10) to (2-15) were manufactured using the binary mask blanks of Examples (2-10) to (2-15), like Examples (1-10) to (1-15).

It was confirmed that the binary transfer masks of Examples (2-10) to (2-15) show an effect of sufficiently overcoming the problem of the electromagnetic field (EMF) effect, which can be a problem for the generation in which the DRAM half pitch (hp) is 32 nm specified in semiconductor device design specifications and the later generations, with ArF exposure light, and provide a practical transfer mask.

Examples (3-1), (3-2), (3-4), (3-5), (3-7), (3-8), (3-10), (3-11), (3-13) and (3-14)

(Manufacture of a Mask Blank)

Examples (3-1), (3-2), (3-4), (3-5), (3-7), (3-8), (3-10), (3-11), (3-13) and (3-14) are similar to Examples (1-1), (1-2), (1-4), (1-5), (1-7), (1-8), (1-10), (1-11), (1-13) and (1-14) except that the thickness of the light shielding film 10 is 35 nm (the thickness of the light shielding layer 11 is 20 nm), the optical density of the light shielding film 10 is 2.3, and the binary mask blank is used for double exposure.

(Manufacture of a Transfer Mask)

Binary transfer masks of Examples (3-1) to (3-14) were manufactured using the binary mask blanks of Examples (3-1) to (3-14), like Examples (1-1) to (1-14).

It was confirmed that the binary transfer masks of Examples (3-1) to (3-14) show an effect of sufficiently overcoming the problem of the electromagnetic field (EMF) effect, which can be a problem for the generation in which the DRAM half pitch (hp) is 32 nm specified in semiconductor device design specifications and the later generations, with ArF exposure light, and provide a practical transfer mask.

Examples (3-3), (3-6), (3-9), (3-12) and (3-15)

(Manufacture of a Mask Blank)

Examples (3-3), (3-6), (3-9), (3-12) and (3-15) are similar to Examples (1-3), (1-6), (1-9), (1-12) and (1-15) except that the thickness of the light shielding film 10 is 40 nm (the thickness of the light shielding layer 11 is 30 nm), the optical density of the light shielding film 10 is 2.3, and the binary mask blank is used for double exposure.

(Manufacture of a Transfer Mask)

Binary transfer masks of Examples (3-3) to (3-15) were manufactured using the binary mask blanks of Examples (3-3) to (3-15), like Examples (1-1) to (1-15).

It was confirmed that the binary transfer masks of Examples (3-3) to (3-15) show an effect of sufficiently overcoming the problem of the electromagnetic field (EMF) effect, which can be a problem for the generation in which the DRAM half pitch (hp) is 32 nm specified in semiconductor device design specifications and the later generations, with ArF exposure light, and provide a practical transfer mask.

Example (4-1)

(Design of a Light Shielding Film)

Among many MoSi-based materials with refractive indexes (n) and extinction coefficients (k) measured beforehand, a MoSi film (n=2.4, k=2.9) for a light shielding layer 11 and a MoSiON film (n=2.1, k=0.3) for a surface anti-reflection layer 12 were selected as material of a light shielding film 10 and an optical simulation was performed as follows.

In the optical simulation, while varying the condition of thickness of the light shielding layer 11 within a range of 10 nm to 40 nm and the condition of thickness of the surface anti-reflection layer 12 within a range of 4 nm to 20 nm for the selected materials, the total optical density (OD) and surface reflectivity (R %) of the light shielding film 10 were calculated for each thickness condition. A graph plotting a result of the calculation is shown in FIG. 13.

Figure 13:
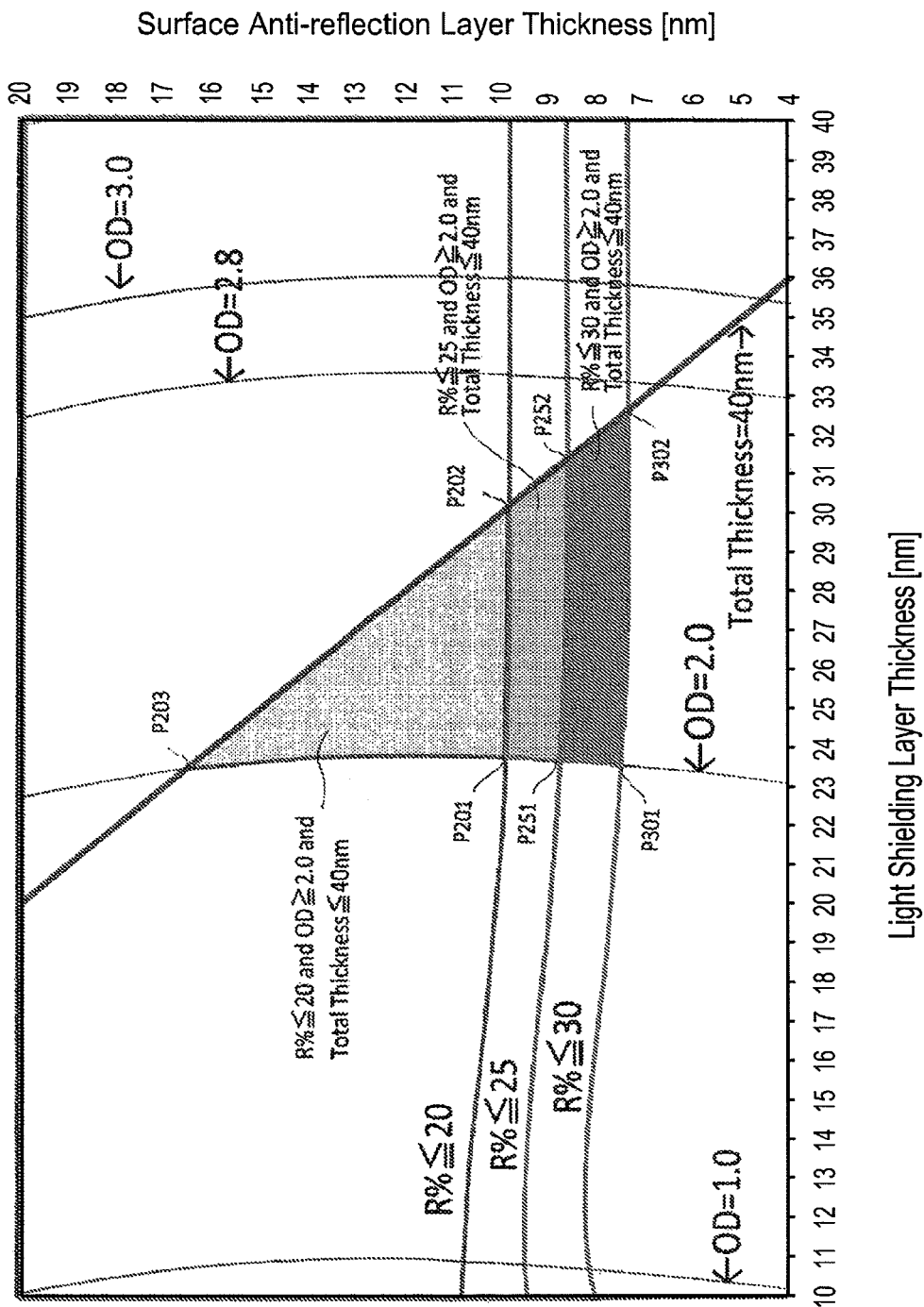
FIG. 13 is a view showing a result of optical simulation on calculation of optical density and surface reflectivity in film thickness of the light shielding film and the surface anti-reflection layer according to Example (4-1) of the present invention.

In the graph of FIG. 13, the horizontal axis represents thickness of the light shielding layer 11 and the vertical axis represents thickness of the surface anti-reflection layer 12. The optical density is divided by 2.0, 2.8 and 3.0 boundaries, and the surface reflectivity is divided by 30%, 25% and 20% boundaries. In addition, from a point where the thickness of the light shielding layer 11 is 36 nm and the thickness of the surface anti-reflection layer 12 is 4 nm to a point where the thickness of the light shielding layer 11 is 20 nm and the thickness of the surface anti-reflection layer 12 is 20 nm, a boundary defining the total thickness of 40 nm of the light shielding film 10 is drawn.

It can be said that the optical density of the light shielding film 10 tends to increase from left to right in the graph, that is, with an increase in the thickness of the light shielding layer 11. It can be said that the surface reflectivity of the light shielding film 10 tends to decrease from bottom to top in the graph, that is, with an increase in the thickness of the surface anti-reflection layer 12. However, since both of the optical density and surface reflectivity are affected by optical interference due to multi-reflection between the light shielding layer 11 and the surface anti-reflection layer 12, there may be a need to strictly examine the optical density and surface reflectivity with optical simulation or the like rather than a simple linear relationship. A region in which the total thickness of the light shielding film 10 in the graph is 40 nm or less corresponds to a region in the left side of the boundary.

In addition, in Example (4-1), a threshold of the surface reflectivity that is one of the conditions of selection of the light shielding film 10 is set to 30% or less. In some cases, normal exposure and transfer may be achieved even with a surface reflectivity of 30% or more to 40% or less. However, depending on the specification of an exposurer, a characteristic of a resist on a wafer of an object to be transferred, and so on, precision of exposure and transfer may be lowered if the surface reflectivity is greater than 30%. In consideration of this, the threshold of the surface reflectivity is set to 30% or less. This is equally applied to other Examples.

Here, a condition to allow preparation of the light shielding film 10 having the optical density of 2.0 or more, the total thickness of 40 nm or less and the surface reflectivity of 30% or less corresponds to an inner side of a region having three apexes P203, P301 and P302 in FIG. 13. In addition, a condition to allow preparation of the light shielding film 10 having the optical density of 2.0 or more, the total thickness of 40 nm or less and the surface reflectivity of 25% or less corresponds to an inner side of a region having three apexes P203, P251 and P252 in FIG. 13. In addition, a condition to allow preparation of the light shielding film 10 having the optical density of 2.0 or more, the total thickness of 40 nm or less and the surface reflectivity of 20% or less corresponds to an inner side of a region having three apexes P203, P201 and P202 in FIG. 13. In Example (4-1), from the result of the optical simulation of FIG. 13, the thickness of the light shielding layer 11 was selected as 24 nm, the thickness of the surface anti-reflection layer was selected as 10 nm, and the light shielding film 10 was designed to have the optical density of 2.0 or more and the surface reflectivity of 20% or less.

Figure 14:
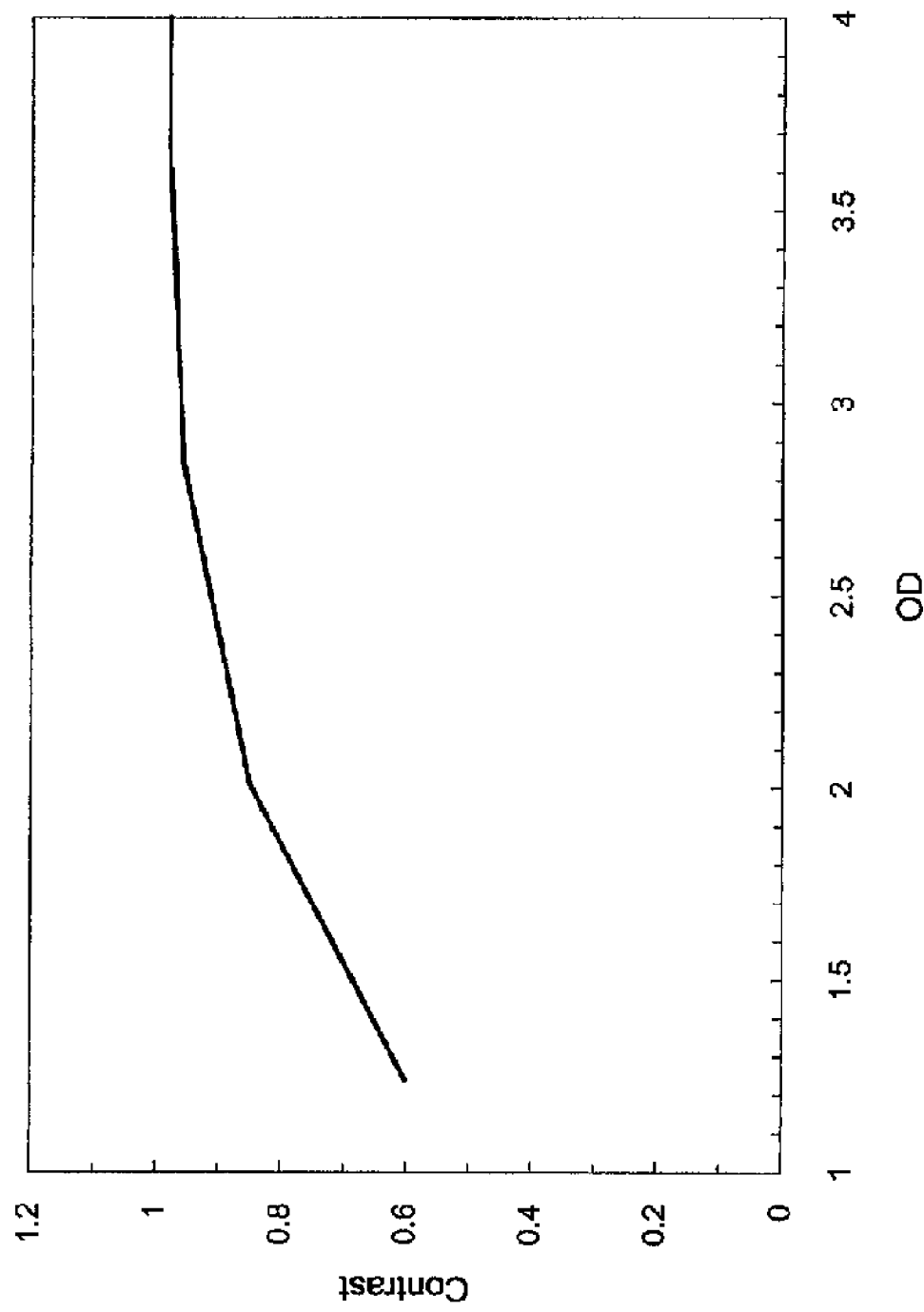
FIG. 14 is a view showing a result of optical simulation on calculation of a relationship between optical density and contrast of the light shielding film according to Example (4-1) of the present invention.

Next, a transfer mask was manufactured with the mask blank using the selected light shielding film 10 and it was checked through optical simulation to determine whether or not sufficient contrast was obtained when the manufactured transfer mask was exposed and transferred onto a resist on a wafer. A result of the check is shown in FIG. 14. The optical simulation of FIG. 14 calculates a contrast when light shielding films 10 having different optical densities (with the thickness of the surface anti-reflection layer 12 fixed to 10 nm) were made of the materials of the light shielding layer 11 and surface anti-reflection layer 12 used in Example (4-1). On the presumption that double patterning as the DRAM hp 32 nm generation is applied to a transfer pattern formed in the light shielding film, a simulation was performed with application of a line & space pattern (line:space=3:1=384 nm:128 nm). The simulation showed that a good contrast of 0.8 or more was achieved even with the optical density of 2.0 although it is not as high as that for the optical density of 2.8. That is, a sufficient contrast can be obtained even in the designed light shielding film 10 having the optical density of 2.0.

As used herein, a contrast refers to a relationship between the maximum value (Imax) and minimum value (Imin) of a light intensity distribution when exposure light passing through a light transmitting portion of a transfer mask is focused on a resist of a wafer, which is expressed by (Imax−Imin)/(Imax+Imin). This is equally applied to other Examples.

Figure 15:
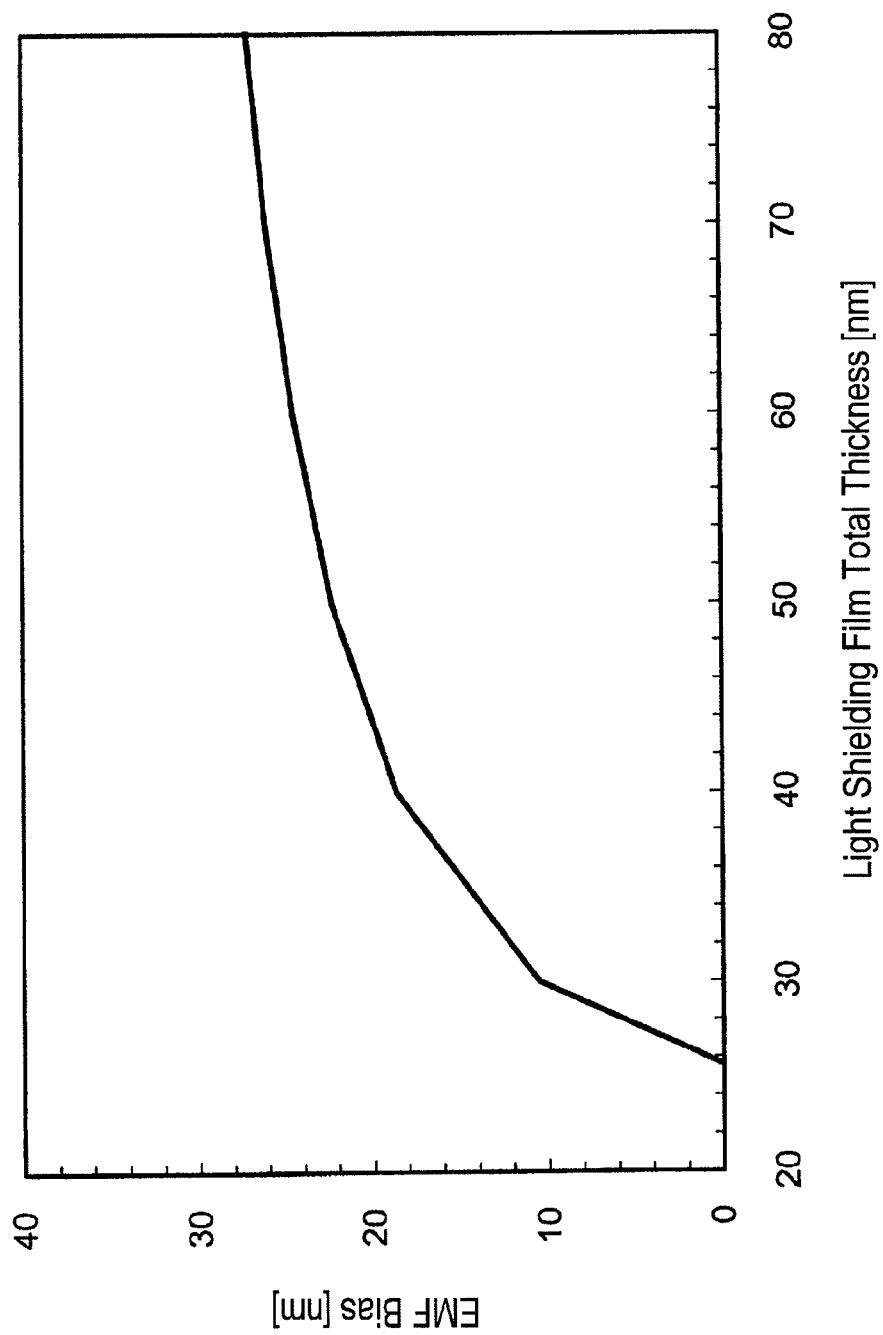
FIG. 15 is a view showing a result of optical simulation on calculation of an EMF bias in film thickness of the light shielding film according to Example (4-1) of the present invention.

Next, for the mask blank using the selected light shielding film 10, it was checked through optical simulation to determine whether or not an EMF bias was sufficiently reduced. A result of the check is shown in FIG. 15. The optical simulation of FIG. 15 calculates an EMF bias when light shielding films 10 having different optical densities were made of the materials of the light shielding layer 11 and surface anti-reflection layer 12 used in Example (4-1). An EMF bias represented by a vertical axis in FIG. 15 corresponds to a subtraction of a bias calculated by an EMF simulation from a bias calculated by a TMA optical simulation. That is, a bias related to an EMF effect is calculated by subtracting a simulation result considering the EMF effect from a simulation result considering no EMF effect. A horizontal axis in FIG. 15 represents the total thickness of the light shielding film 10. The total thickness of the light shielding film 10 is changed by changing the thickness of the light shielding layer 11 with the thickness of the surface anti-reflection layer 12 fixed to 10 nm as designed. In addition, as a design pattern applied to the optical simulation, the same line & space used for the contrast simulation is applied to calculate a bias.

As a result, it has been found that the light shielding film 10 having the total thickness of 40 nm or less is little sensitive to the EMF effect as compared to the conventional light shielding film having the total thickness of 60 nm or so.

(Manufacture of a Mask Blank)

In Example (4-1), the same mask blank as Example (1-1) was manufactured except that the light shielding film 10 is replaced with the light shielding film 10 designed according to the result of the optical simulation of FIG. 13.

In Example (4-1), a MoSi film (the light shielding layer 11) and a MoSiON film (the surface anti-reflection layer 12) were formed as the light shielding film 10 on the transparent substrate 1.

Specifically, a DC magnetron sputter was used, and a target of Mo:Si=21 atom %:79 atom % was used to form a film comprising molybdenum and silicon (Mo:21 atom %, Si:79 atom %) at a film thickness of 24 nm under an Ar gas atmosphere, thereby forming the MoSi film (the light shielding layer 11).

Next, a target of Mo:Si=4 atom %:96 atom % was used to form a film comprising molybdenum, silicon, oxygen and nitrogen (Mo:2 atom %, Si:37 atom %, O:23 atom % and N:38 atom %) at a film thickness of 10 nm under a mixture gas atmosphere of Ar, $O_2$, $N_2$ and He, thereby forming the MoSiON film (the surface anti-reflection layer 12).

Next, the substrate was heated (annealed) at 450° C. for 30 minutes.

A refractive index (n) and an extinction coefficient (k) of the light shielding film 10 formed on the transparent substrate 1 were measured using an optical film characteristic measuring apparatus n&k 1280 (available from n&k Technologies). A result of the measurement showed that, in the light shielding film 10, the light shielding layer 11 has n=2.4 and k=2.9 and the surface anti-reflection layer 12 has n=2.1 and k=0.3. In addition, the optical density (OD) and the surface reflectivity for the light shielding film 10 were measured using a spectrophotometer U-4100 (available from Hitachi High-technologies). A result of the measurement showed that the optical density for ArF exposure light (having a wavelength of 193 nm) is 2.0 and the surface reflectivity is 19.8%. In addition, optical density was measured after the auxiliary light shielding film 20 was formed and a result of the measurement showed that the optical density of a multilayer structure of the light shielding film 10 and the auxiliary light shielding film 20 for ArF exposure light (having a wavelength of 193 nm) is 2.8.

Thus, a binary mask blank formed with the auxiliary light shielding film 20 and the light shielding film 10 for ArF excimer laser exposure and single exposure was obtained.

(Manufacture of a Transfer Mask)

A binary transfer mask of Example (4-1) was manufactured using the binary mask blank of Example (4-1) in the same manner as Example (1-1).

Here, for a mask design pattern, a transfer pattern generated with strict correction calculation in an EMF simulation as conventional and a transfer pattern generated with correction calculation with a small computational load in a TMA simulation were prepared and the prepared transfer patterns were drawn to resist films 100 of the two manufactured binary mask blanks, respectively, thereby manufacturing two binary transfer masks.

For the two binary transfer masks, the transfer patterns were exposed and transferred onto resist films of a wafer using an exposurer, respectively, and a result showed that both patterns are transferred with high precision. It could be confirmed that the mask blank of Example (4-1) can be used to manufacture a transfer mask having sufficient transferability even in the transfer pattern generated with correction calculation with a small computational load in a TMA simulation. In addition, it could be confirmed that sensitization of resist films on a wafer can be suppressed by a light shielding portion (light shielding band) 80 consisting of an auxiliary light shielding film pattern 20b and a light shielding film pattern 10a even for superimposing exposure up to four times due to light leakage into peripheral regions.

Example (4-2)

(Design of a Light Shielding Film)

Like Example (4-1), among many MoSi-based materials with refractive indexes (n) and extinction coefficients (k) measured beforehand, a MoSi film (n=2.4, k=1.9) for a light shielding layer 11 and a MoSiON film (n=2.3, k=1.0) for a surface anti-reflection layer 12 were selected as material of a light shielding film 10 and the optical simulation on the total optical density (OD) and surface reflectivity (R %) of the light shielding film 10 was performed. A graph plotting a result of the optical simulation is shown in FIG. 16.

Figure 16:
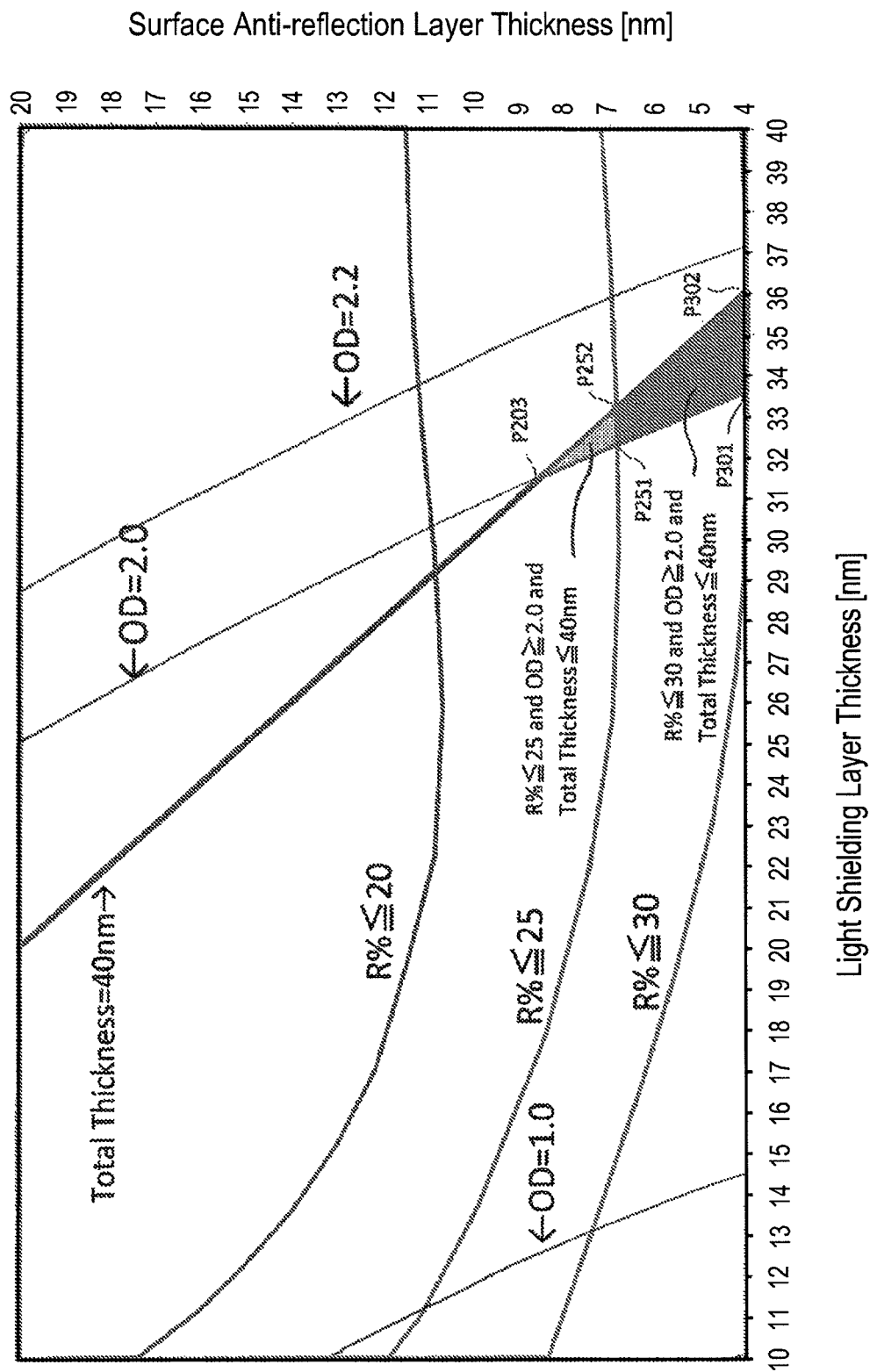
FIG. 16 is a view showing a result of optical simulation on calculation of optical density and surface reflectivity in film thickness of the light shielding film and the surface anti-reflection layer according to Example (4-2) of the present invention.

In Example (4-2), from the result of the optical simulation of FIG. 16, the thickness of the light shielding layer 11 was selected as 33 nm, the thickness of the surface anti-reflection layer was selected as 6 nm, and the light shielding film 10 was designed to have the optical density of 2.0 or more and the surface reflectivity of 30% or less.

Figure 17:
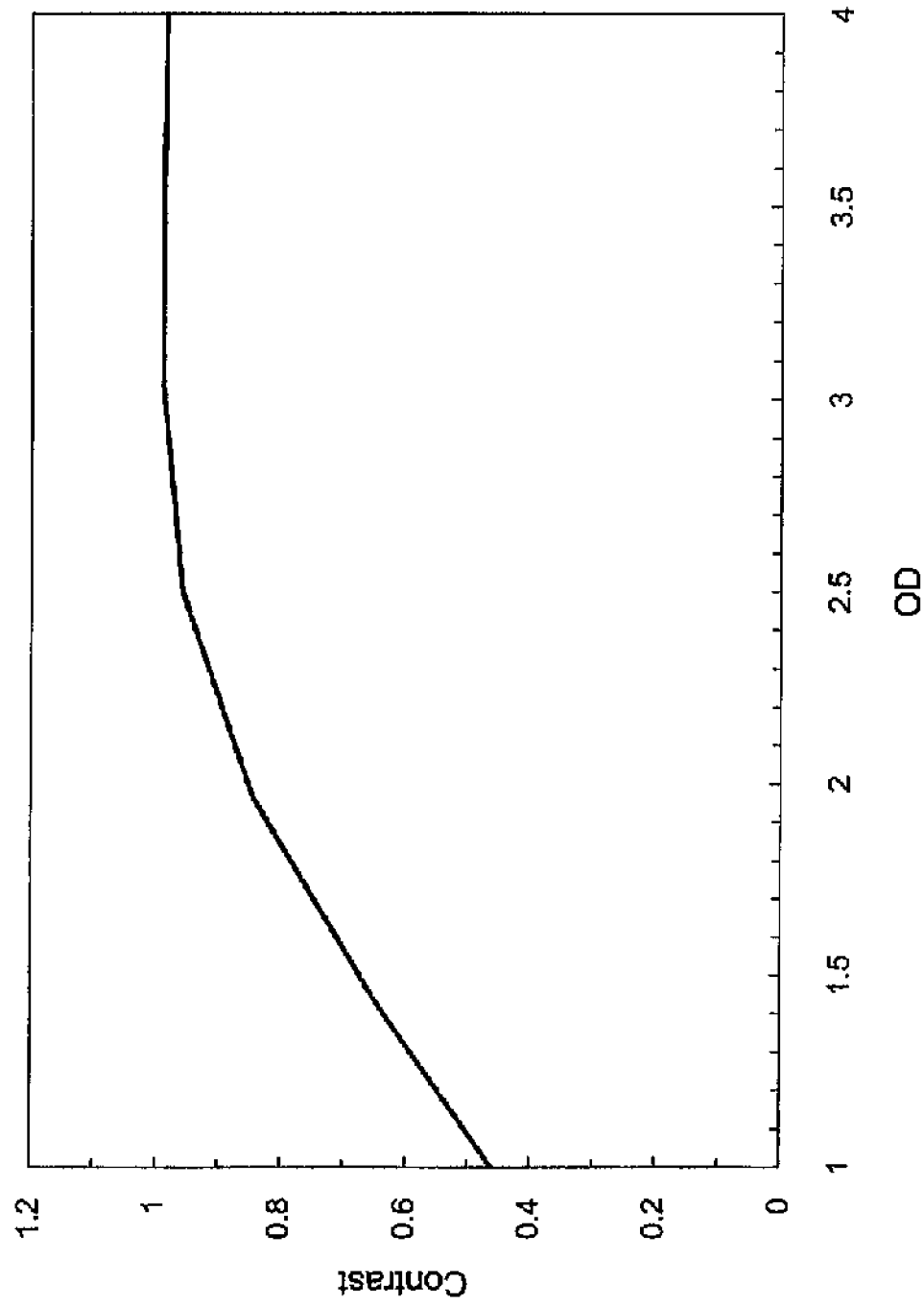
FIG. 17 is a view showing a result of optical simulation on calculation of a relationship between optical density and contrast of the light shielding film according to Example (4-2) of the present invention.

Next, a transfer mask was manufactured with the mask blank using the selected light shielding film 10 and it was checked through the optical simulation whether or not a sufficient contrast was obtained when the manufactured transfer mask was exposed and transferred onto a resist on a wafer, like Example (4-1). A result of the check is shown in FIG. 17. It could be seen from FIG. 17 that a good contrast of 0.8 or more can be achieved even for the optical density of 2.0.

Figure 18:
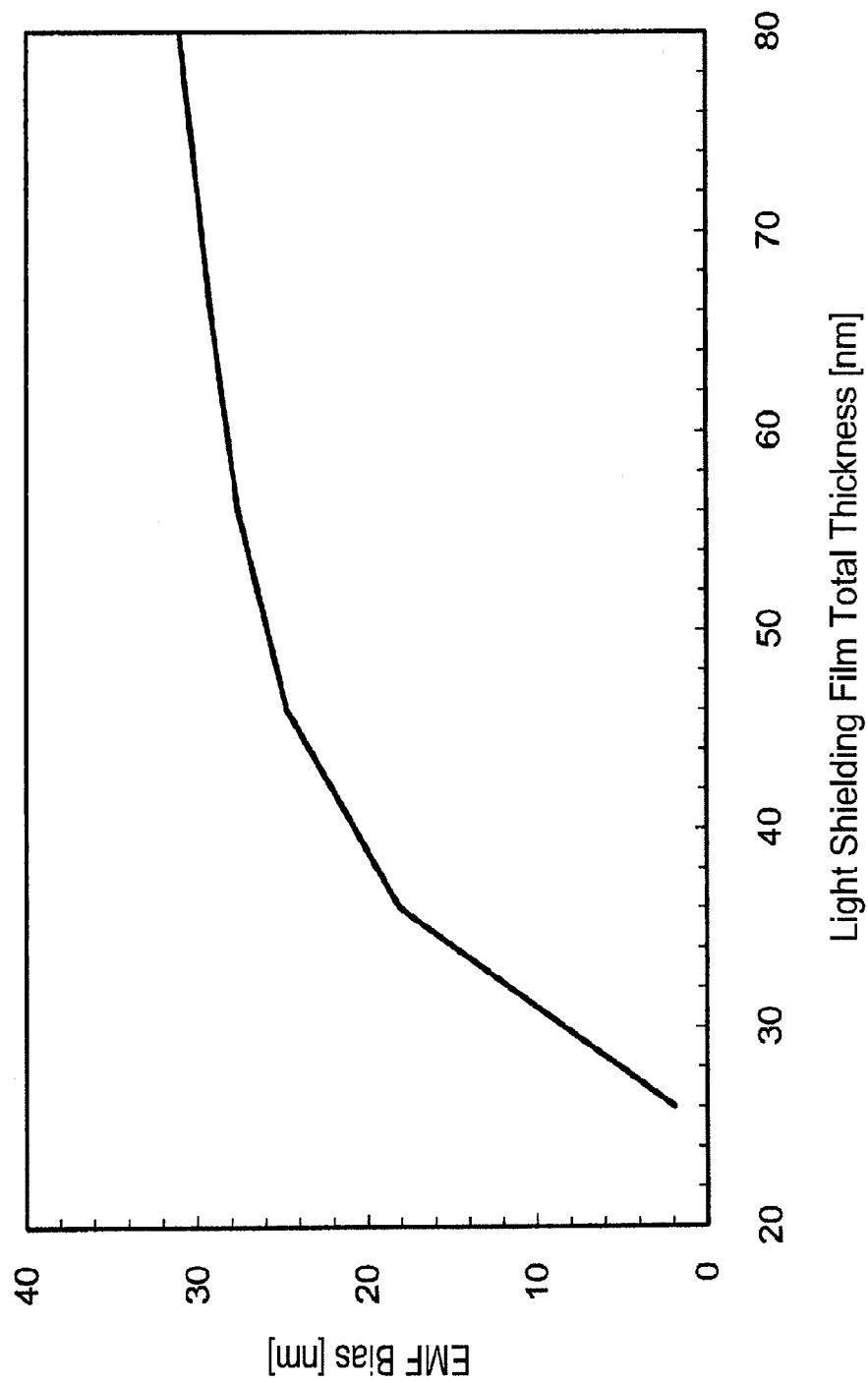
FIG. 18 is a view showing a result of optical simulation on calculation of an EMF bias in film thickness of the light shielding film according to Example (4-2) of the present invention.

Next, for the mask blank using the selected light shielding film 10, it was checked through the optical simulation whether or not an EMF bias was sufficiently reduced, like Example (4-1). However, the optical simulation was performed with the thickness of the surface anti-reflection layer fixed to 6 nm. A result of the check is shown in FIG. 18. From FIG. 18, it has been found that the light shielding film 10 having the total thickness of 40 nm or less is little sensitive to the EMF effect as compared to the conventional light shielding film having the total thickness of 60 nm or so.

(Manufacture of a Mask Blank)

In Example (4-2), the same mask blank as Example (4-1) was manufactured except that the light shielding film 10 is replaced with the light shielding film 10 designed according to the result of the optical simulation of FIG. 16.

In Example (4-2), a MoSiN film (the light shielding layer 11) and a MoSiON film (the surface anti-reflection layer 12) were formed as the light shielding film 10 on the transparent substrate 1.

Specifically, a DC magnetron sputter was used, and a target of Mo:Si=21 atom %:79 atom % was used to form a film comprising molybdenum, silicon and nitrogen (Mo:15 atom %, Si:56 atom % and N:29 atom %) at a film thickness of 33 nm under a mixture gas atmosphere of Ar and $N_2$, thereby forming the MoSiN film (the light shielding layer 11).

Next, a target of Mo:Si=4 atom %:96 atom % was used to form a film comprising molybdenum, silicon, oxygen and nitrogen (Mo:3 atom %, Si:56 atom %, O:16 atom % and N:25 atom %) at a film thickness of 6 nm under a mixture gas atmosphere of Ar, $O_2$, $N_2$ and He, thereby forming the MoSiON film (the surface anti-reflection layer 12).

Next, the substrate was heated (annealed) at 450° C. for 30 minutes.

A refractive index (n) and an extinction coefficient (k) of the light shielding film 10 formed on the transparent substrate 1 were measured using an optical film characteristic measuring apparatus n&k 1280 (available from n&k Technologies). A result of the measurement showed that, in the light shielding film 10, the light shielding layer 11 has n=2.4 and k=1.9 and the surface anti-reflection layer 12 has n=2.3 and k=1.0. In addition, the optical density (OD) and the surface reflectivity for the light shielding film 10 were measured using a spectrophotometer U-4100 (available from Hitachi High-technologies). A result of the measurement showed that the optical density for ArF exposure light (having a wavelength of 193 nm) is 2.0 and the surface reflectivity is 26.7%. In addition, optical density was measured after the auxiliary light shielding film 20 was formed and a result of the measurement showed that the optical density of a multilayer structure of the light shielding film 10 and the auxiliary light shielding film 20 for ArF exposure light (having a wavelength of 193 nm) is 2.8.

Thus, a binary mask blank formed with the auxiliary light shielding film 20 and the light shielding film 10 for ArF excimer laser exposure and single exposure was obtained.

(Manufacture of a Transfer Mask)

A binary transfer mask of Example (4-2) was manufactured using the binary mask blank of Example (4-2) in the same manner as Example (4-1).

Here, for a mask design pattern, a transfer pattern generated with strict correction calculation in an EMF simulation as conventional and a transfer pattern generated with correction calculation with a small computational load in a TMA simulation were prepared and the prepared transfer patterns were drawn to resist films 100 of the two manufactured binary mask blanks, respectively, thereby manufacturing two binary transfer masks.

For the two binary transfer masks, the transfer patterns were exposed and transferred onto resist films of a wafer using an exposurer, respectively, and a result showed that both patterns are transferred with high precision. It could be confirmed that the mask blank of Example (4-2) can be used to manufacture a transfer mask having sufficient transferability even in the transfer pattern generated with correction calculation with a small computational load in a TMA simulation. In addition, it could be confirmed that sensitization of resist films on a wafer can be suppressed by a light shielding portion (light shielding band) 80 consisting of an auxiliary light shielding film pattern 20b and a light shielding film pattern 10a even for superimposing exposure up to four times due to light leakage into peripheral regions.

Example (4-3)

(Design of a Light Shielding Film)

Like Example (4-1), among many MoSi-based materials with refractive indexes (n) and extinction coefficients (k) measured beforehand, a MoSiN film (n=1.8, k=2.1) for a light shielding layer 11 and a MoSiN film (n=2.0, k=0.9) for a surface anti-reflection layer 12 were selected as material of a light shielding film 10 and the optical simulation on the total optical density (OD) and surface reflectivity (R %) of the light shielding film 10 was performed. A graph plotting a result of the optical simulation is shown in FIG. 19.

Figure 19:
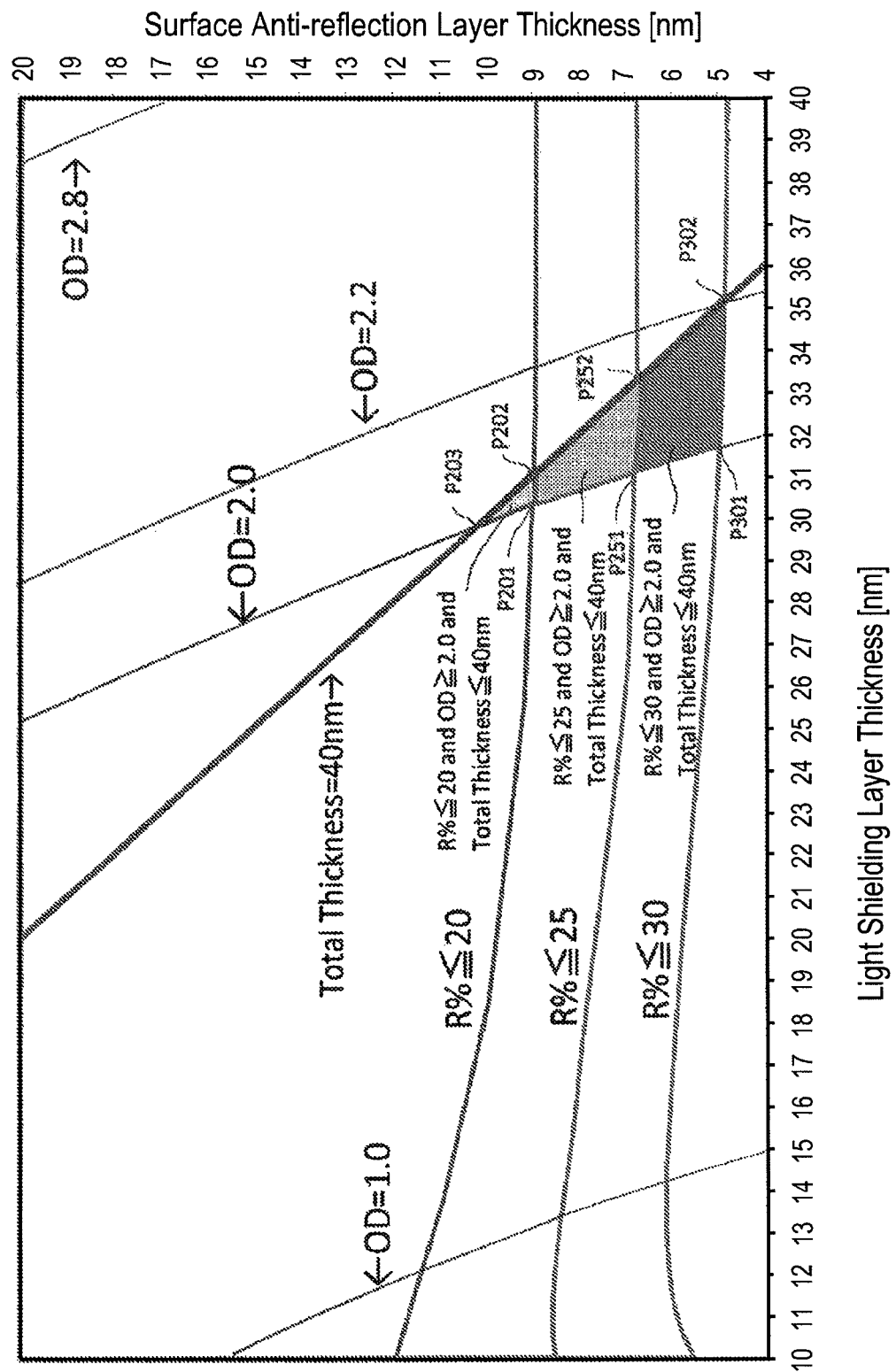
FIG. 19 is a view showing a result of optical simulation on calculation of optical density and surface reflectivity in film thickness of the light shielding film and the surface anti-reflection layer according to Example (4-3) of the present invention.

In Example (4-3), from the result of the optical simulation of FIG. 19, the thickness of the light shielding layer 11 was selected as 30 nm, the thickness of the surface anti-reflection layer was selected as 10 nm, and the light shielding film 10 was designed to have the optical density of 2.0 or more and the surface reflectivity of 20% or less.

Figure 20:
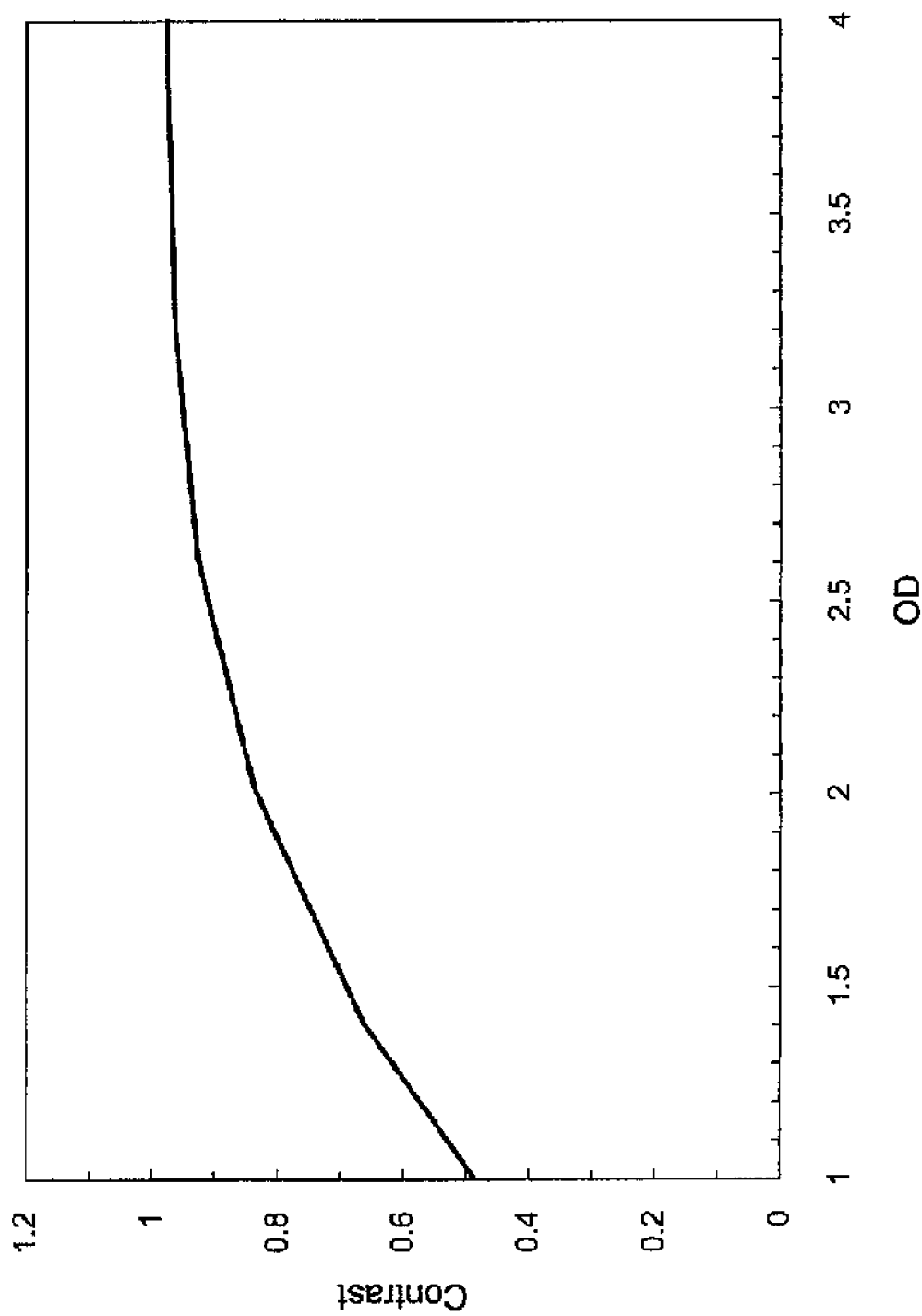
FIG. 20 is a view showing a result of optical simulation on calculation of a relationship between optical density and contrast of the light shielding film according to Example (4-3) of the present invention.

Next, a transfer mask was manufactured with the mask blank using the selected light shielding film 10 and it was checked through the optical simulation whether or not a sufficient contrast was obtained when the manufactured transfer mask was exposed and transferred onto a resist on a wafer, like Example (4-1). A result of the check is shown in FIG. 20. It could be seen from FIG. 20 that a good contrast of 0.8 or more can be achieved even for the optical density of 2.0.

Figure 21:
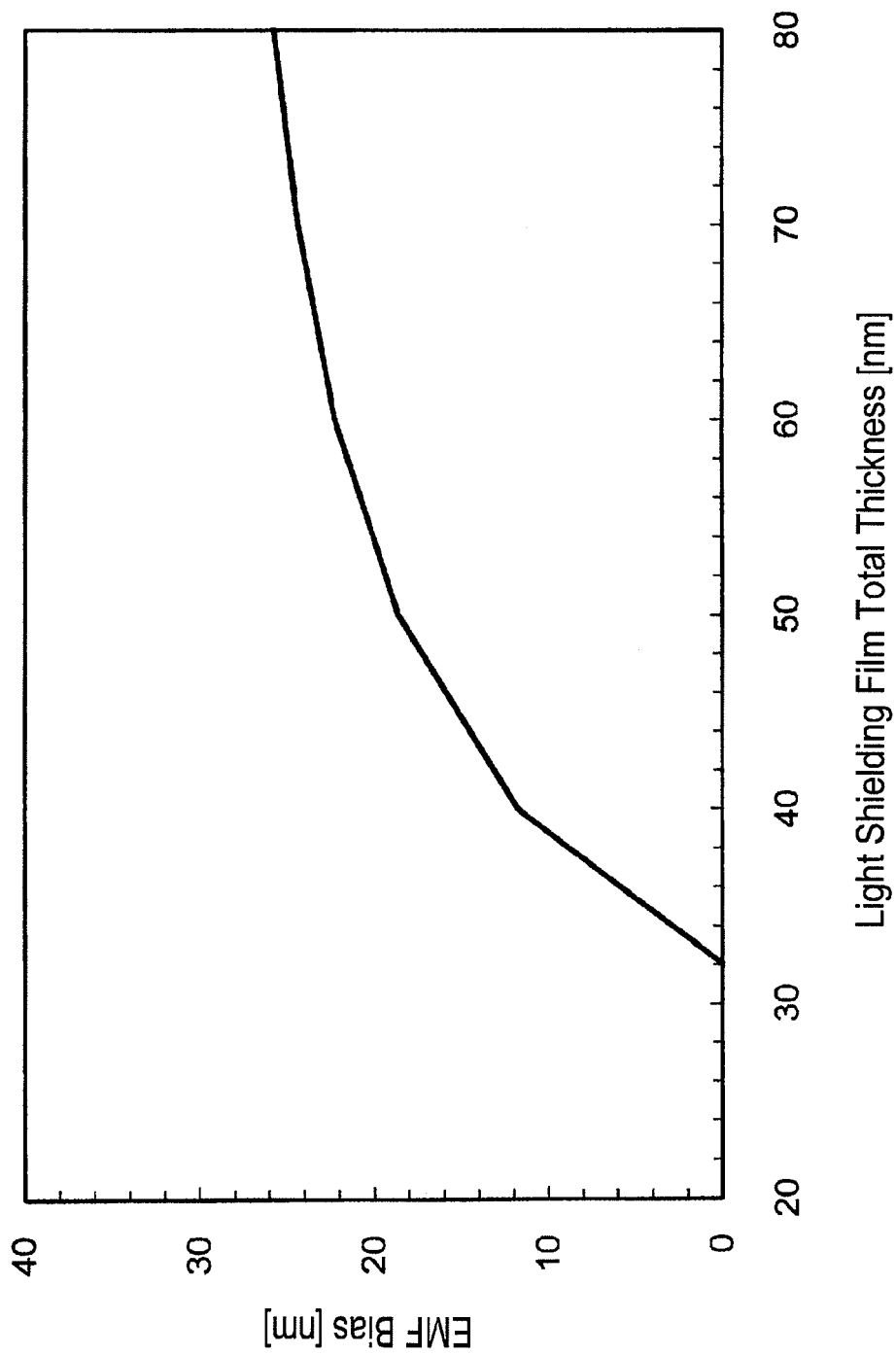
FIG. 21 is a view showing a result of optical simulation on calculation of an EMF bias in film thickness of the light shielding film according to Example (4-3) of the present invention.

Next, for the mask blank using the selected light shielding film 10, it was checked through the optical simulation whether or not to sufficiently reduce an EMF bias, like Example (4-1). However, the optical simulation was performed with the thickness of the surface anti-reflection layer fixed to 10 nm. A result of the check is shown in FIG. 21. From FIG. 21, it has been found that the light shielding film 10 having the total thickness of 40 nm or less has little sensitivity to the EMF effect as compared to the conventional light shielding film having the total thickness of 60 nm or so.

(Manufacture of a Mask Blank)

In Example (4-3), the same mask blank as Example (4-1) was manufactured except that the light shielding film 10 is replaced with the light shielding film 10 designed according to the result of the optical simulation of FIG. 19.

In Example (4-3), a MoSiN film (the light shielding layer 11) and a MoSiN film (the surface anti-reflection layer 12) were formed as the light shielding film 10 on the transparent substrate 1.

Specifically, a DC magnetron sputter was used, and a film comprising molybdenum, silicon and nitrogen (Mo:9 atom %, Si:64 atom % and N:27 atom %) was formed at a film thickness of 30 nm, thereby forming the MoSiN film (the light shielding layer 11).

Next, a DC magnetron sputter was used, and a film comprising molybdenum, silicon and nitrogen (Mo:8 atom %, Si:48 atom %, and N:44 atom %) was formed at a film thickness of 10 nm, thereby forming the MoSiON film (the surface anti-reflection layer 12).

A refractive index (n) and an extinction coefficient (k) of the light shielding film 10 formed on the transparent substrate 1 were measured using an optical film characteristic measuring apparatus n&k 1280 (available from n&k Technologies). A result of the measurement showed that, in the light shielding film 10, the light shielding layer 11 has n=1.8 and k=2.1 and the surface anti-reflection layer 12 has n=2.0 and k=0.9. In addition, the optical density (OD) and the surface reflectivity for the light shielding film 10 were measured using a spectrophotometer U-4100 (available from Hitachi High-technologies). A result of the measurement showed that the optical density for ArF exposure light (having a wavelength of 193 nm) is 2.0 and the surface reflectivity is 17.9%. In addition, optical density was measured after the auxiliary light shielding film 20 was formed and a result of the measurement showed that the optical density of a multilayer structure of the light shielding film 10 and the auxiliary light shielding film 20 for ArF exposure light (having a wavelength of 193 nm) is 2.8.

Thus, a binary mask blank formed with the auxiliary light shielding film 20 and the light shielding film 10 for ArF excimer laser exposure and single exposure was obtained.

(Manufacture of a Transfer Mask)

A binary transfer mask of Example (4-3) was manufactured using the binary mask blank of Example (4-3) in the same manner as Example (4-1).

Here, for a mask design pattern, a transfer pattern generated with strict correction calculation in an EMF simulation as conventional and a transfer pattern generated with correction calculation with a small computational load in a TMA simulation were prepared and the prepared transfer patterns were drawn to resist films 100 of the two manufactured binary mask blanks, respectively, thereby manufacturing two binary transfer masks.

For the two binary transfer masks, the transfer patterns were exposed and transferred onto resist films of a wafer using an exposurer, respectively, and a result showed that both patterns are transferred with high precision. It could be confirmed that the mask blank of Example (4-3) can be used to manufacture a transfer mask having sufficient transferability even in the transfer pattern generated with correction calculation with a small computational load in a TMA simulation. In addition, it could be confirmed that sensitization of resist films on a wafer can be suppressed by a light shielding portion (light shielding band) 80 consisting of an auxiliary light shielding film pattern 20b and a light shielding film pattern 10a even for superimposing exposure up to four times due to light leakage into peripheral regions.

Examples (4-4) to (4-6)

Examples (4-4) to (4-6) are similar to Examples (4-1) to (4-3) except that an etching mask (hard mask) film 30 and an adhesion enhancement layer 60, which are shown in Examples (1-4) to (1-6), are formed on the auxiliary light shielding film 20, as shown in FIG. 2.

In the aspects of Examples (4-4) to (4-6), since the auxiliary light shielding film and the etching mask film are divided as dedicated films, the etching mask film 30 can be thinner than the Cr-based auxiliary light shielding film 20 (also serving as an etching mask) of Examples (4-1) to (4-3), thereby thinning a resist.

Examples (4-7) to (4-9)

Examples (4-7) to (4-9) are similar to Examples (4-1) to (4-3) except that an etching mask (hard mask) film 30 and a second etching mask film 40, which are shown in Examples (1-7) to (1-9), are formed on the auxiliary light shielding film 20, as shown in FIG. 3.

In the aspects of Examples (4-7) to (4-9), employment of the chromium-based second etching mask film 40 achieves thinness and improved adhesion of a resist as compared to Examples (4-4) to (4-6).

Examples (4-10) to (4-12)

Examples (4-10) to (4-12) are similar to Examples (4-1) to (4-3) except that an auxiliary light shielding film 20 having a multilayer structure including an etching stopper and mask layer 21 and an auxiliary light shielding layer 22 is formed and an adhesion enhancement layer 60 is formed thereon, as shown in FIG. 4 and Examples (1-10) to (1-12).

In the aspects of Examples (4-10) to (4-12), the etching stopper and mask layer 21 for the light shielding film 10 can be thinned as compared to the Cr-based auxiliary light shielding film 20 (also serving as an etching mask) of Examples (4-1) to (4-3), thereby obtaining the light shielding film 10 with higher etching precision.

In the aspects of Examples (4-10) to (4-12), the auxiliary light shielding film 20 can be thinned at the same optical density as compared to the Cr-based auxiliary light shielding film 20 of Examples (4-1) to (4-3). The auxiliary light shielding film 20 having this small thickness allows a resist to be thinned as compared to the aspects of Examples (4-1) to (4-3).

Examples (4-13) to (4-15)

Examples (4-13) to (4-15) are similar to Examples (4-10) to (4-12) except that an etching mask film 70 is replaced with the adhesion enhancement layer 60, as shown in FIG. 5 and Examples (1-13) to (1-15).

In the aspects of Examples (4-13) to (4-15), employment of the chromium-based etching mask film 70 achieves thinness and improved adhesion of a resist as compared to Examples (4-10) to (4-12).

Examples (5-1) to (5-15)

Examples (5-1) to (5-15) are similar to Examples (4-1) to (4-15) except that the optical density of the auxiliary light shielding film 20 is 1.1, and the binary mask blank is used for double exposure, as shown in Examples (2-1) to (2-15).

In the aspects of Examples (5-1) to (5-15), when a binary transfer mask set corresponding to double exposure is manufactured from two binary mask blanks, it is possible to suppress sensitization of resist films on a wafer by a light shielding portion (light shielding band) 80 consisting of an auxiliary light shielding film pattern 20b and a light shielding film pattern 10a even for superimposing exposure up to eight times due to light leakage into peripheral regions.

Example (6-1)

(Design of a Light Shielding Film)

Like Example (4-1), among many MoSi-based materials with refractive indexes (n) and extinction coefficients (k) measured beforehand, a MoSi film (n=2.4, k=2.9) for a light shielding layer 11 and a MoSiON film (n=2.1, k=0.6) for a surface anti-reflection layer 12 were selected as material of a light shielding film 10 and the optical simulation on the total optical density (OD) and surface reflectivity (R %) of the light shielding film 10 was performed. A graph plotting a result of the optical simulation is shown in FIG. 22.

Figure 22:
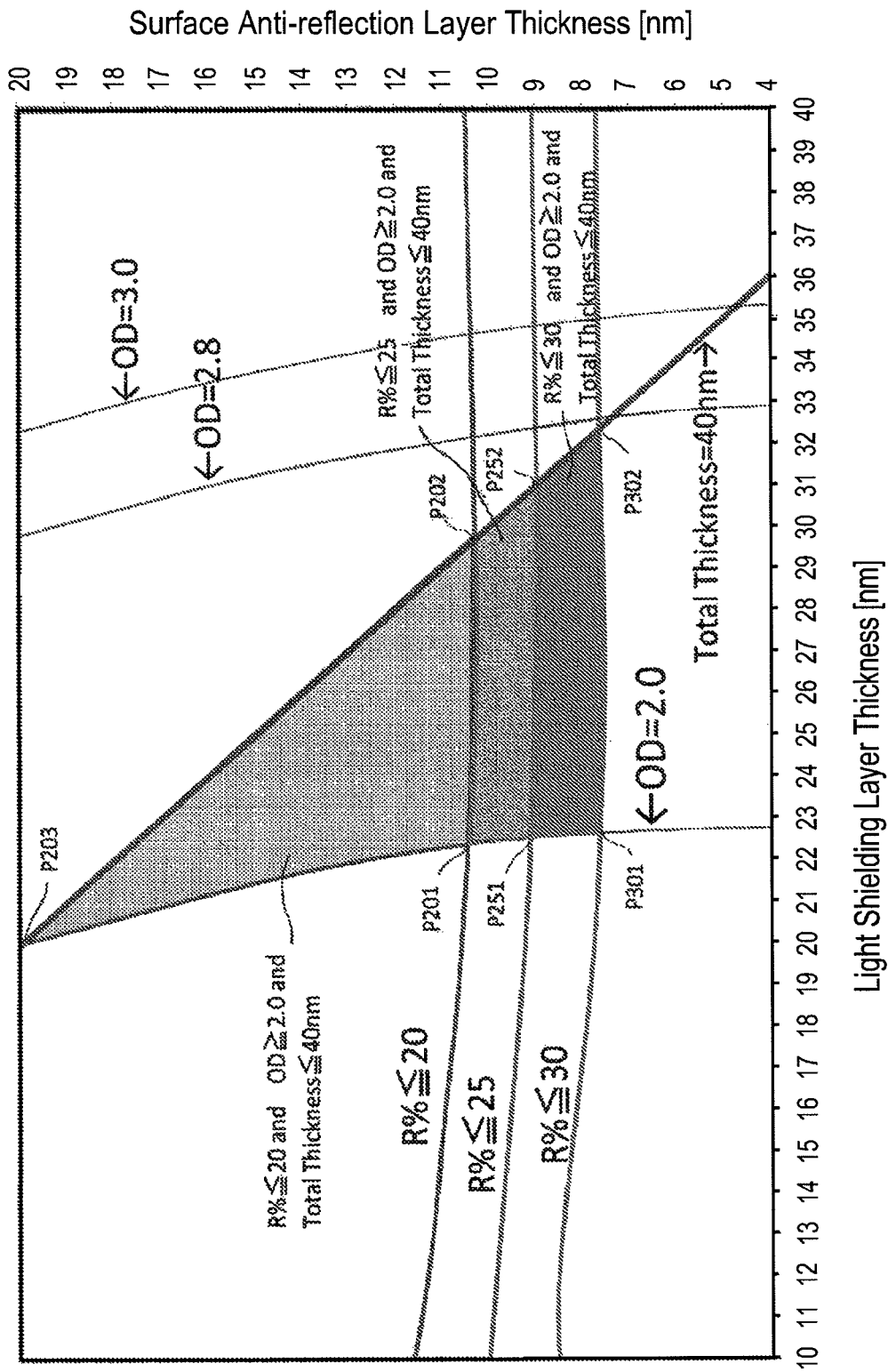
FIG. 22 is a view showing a result of optical simulation on calculation of optical density and surface reflectivity in film thickness of the light shielding film and the surface anti-reflection layer according to Example (6-1) of the present invention.

In Example (6-1), from the result of the optical simulation of FIG. 22, the thickness of the light shielding layer 11 was selected as 26 nm, the thickness of the surface anti-reflection layer was selected as 14 nm, and the light shielding film 10 was designed to have the optical density of 2.3 or more and the surface reflectivity of 20% or less.

Next, a transfer mask was manufactured with the mask blank using the selected light shielding film 10 and it was checked through optical simulation whether or not a sufficient contrast was obtained when the manufactured transfer mask was exposed and transferred onto a resist on a wafer, like Example (4-1). A result of the check showed that a good contrast of 0.8 or more can be achieved even for the optical density of 2.3.

Figure 23:
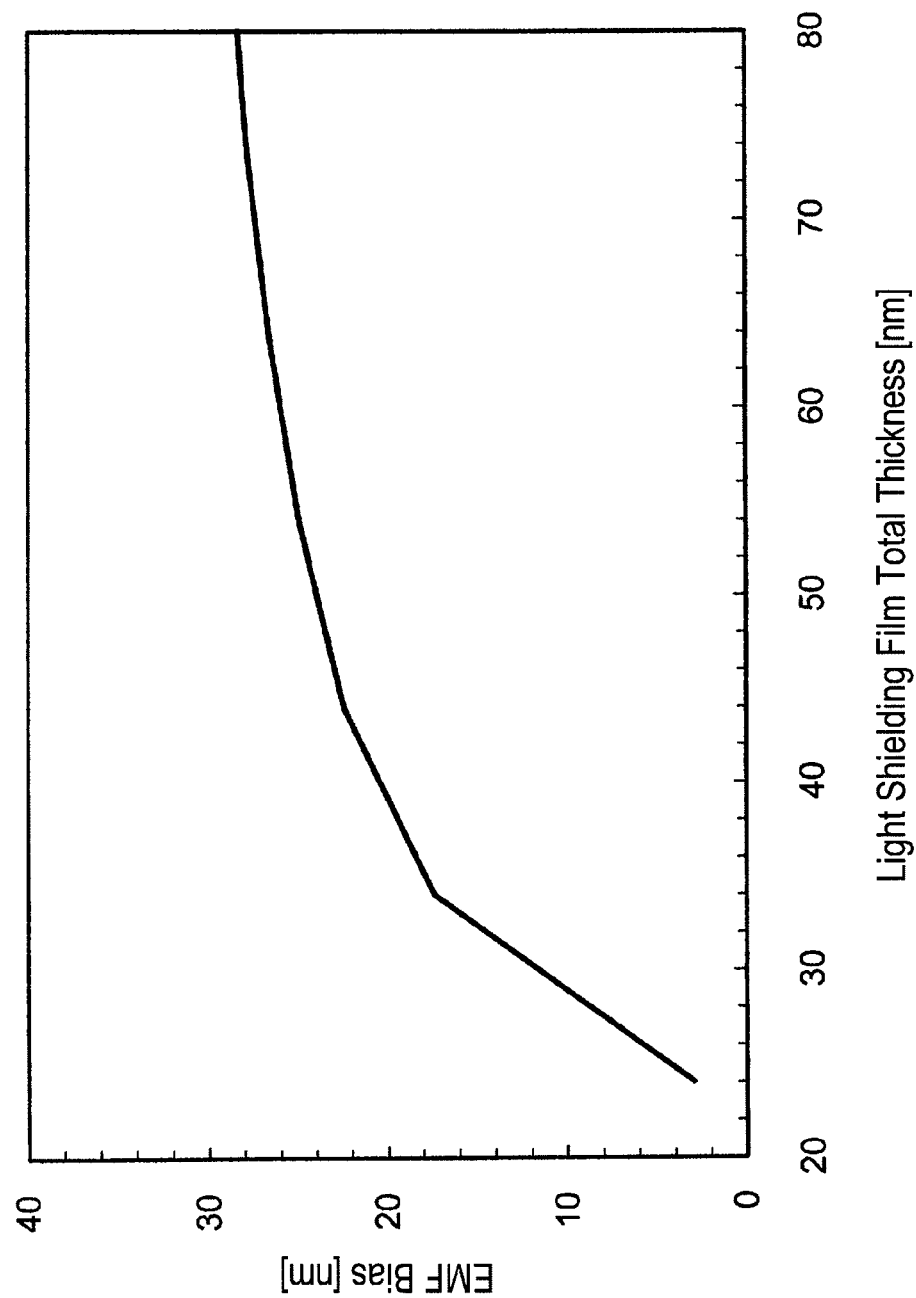
FIG. 23 is a view showing a result of optical simulation on calculation of an EMF bias in film thickness of the light shielding film according to Example (6-1) of the present invention.

Next, for the mask blank using the selected light shielding film 10, it was checked through the optical simulation whether or not an EMF bias was sufficiently reduced, like Example (4-1). However, the optical simulation was performed with the thickness of the surface anti-reflection layer fixed to 14 nm. A result of the check is shown in FIG. 23. From FIG. 23, it has been found that the light shielding film 10 having the total thickness of 40 nm or less has little sensitivity to the EMF effect as compared to the conventional light shielding film having the total thickness of 60 nm or so.

(Manufacture of a Mask Blank)

In Example (6-1), the same mask blank as Example (3-1) used for double exposure was manufactured except that the light shielding film 10 is replaced with the light shielding film 10 designed according to the result of the optical simulation of FIG. 22.

In Example (6-1), a MoSi film (the light shielding layer 11) and a MoSiON film (the surface anti-reflection layer 12) were formed as the light shielding film 10 on the transparent substrate 1.

Specifically, the MoSi film (the light shielding layer 11) having a thickness of 26 nm was formed under the same film formation conditions as Example (4-1).

Next, a target of Mo:Si=4 atom %:96 atom % was used to form a film comprising molybdenum, silicon, oxygen and nitrogen (Mo:2 atom %, Si:39 atom %, O:18 atom % and N:41 atom %) at a film thickness of 14 nm under a mixture gas atmosphere of Ar, $O_2$, $N_2$ and He, thereby forming the MoSiON film (the surface anti-reflection layer 12).

Next, the substrate was heated (annealed) at 450° C. for 30 minutes.

A refractive index (n) and an extinction coefficient (k) of the light shielding film 10 formed on the transparent substrate 1 were measured using an optical film characteristic measuring apparatus n&k 1280 (available from n&k Technologies). A result of the measurement showed that, in the light shielding film 10, the light shielding layer 11 has n=2.4 and k=2.9 and the surface anti-reflection layer 12 has n=2.1 and k=0.6. In addition, the optical density (OD) and the surface reflectivity for the light shielding film 10 were measured using a spectrophotometer U-4100 (available from Hitachi Hightechnologies). A result of the measurement showed that the optical density for ArF exposure light (having a wavelength of 193 nm) is 2.3 and the surface reflectivity is 9.4%. In addition, optical density was measured after the auxiliary light shielding film 20 was formed and a result of the measurement showed that the optical density of a multilayer structure of the light shielding film 10 and the auxiliary light shielding film 20 for ArF exposure light (having a wavelength of 193 nm) is 3.1.

Thus, a binary mask blank formed with the auxiliary light shielding film 20 and the light shielding film 10 for ArF excimer laser exposure and double exposure was obtained.

(Manufacture of a Transfer Mask)

A binary transfer mask set of Example (6-1) for double exposure was manufactured using the binary mask blank of Example (6-1) in the same manner as Example (3-1).

Here, for a set of two mask design patterns generated by application of a double patterning technique to a design pattern of the DRAM hp 32 nm generation, a transfer pattern set generated with strict correction calculation in an EMF simulation as conventional and a transfer pattern set generated with correction calculation with a small computational load in a TMA simulation were prepared and the prepared transfer pattern sets were drawn to resist films 100 of the four manufactured binary mask blanks, respectively, thereby manufacturing a binary transfer mask set.

For the manufactured binary transfer mask set, the transfer patterns were exposed and transferred onto resist films of a wafer using an exposurer, respectively, and a result showed that all patterns are transferred with high precision. It could be confirmed that the mask blank of Example (6-1) can be used to manufacture a transfer mask having sufficient transferability even in the transfer patterns generated with correction calculation with a small computational load in a TMA simulation. In addition, it could be confirmed that sensitization of resist films on a wafer can be suppressed by a light shielding portion (light shielding band) 80 consisting of an auxiliary light shielding film pattern 20b and a light shielding film pattern 10a even for superimposing exposure up to eight times due to light leakage into peripheral regions.

Example (6-2)

(Design of a Light Shielding Film)

Like Example (4-1), among many Ta-based materials with refractive indexes (n) and extinction coefficients (k) measured beforehand, a TaN film (n=1.8, k=2.4) for a light shielding layer 11 and a TaO film (n=2.2, k=1.1) for a surface anti-reflection layer 12 were selected as material of a light shielding film 10 and the optical simulation on the total optical density (OD) and surface reflectivity (R %) of the light shielding film 10 was performed. A graph plotting a result of the optical simulation is shown in FIG. 24.

Figure 24:
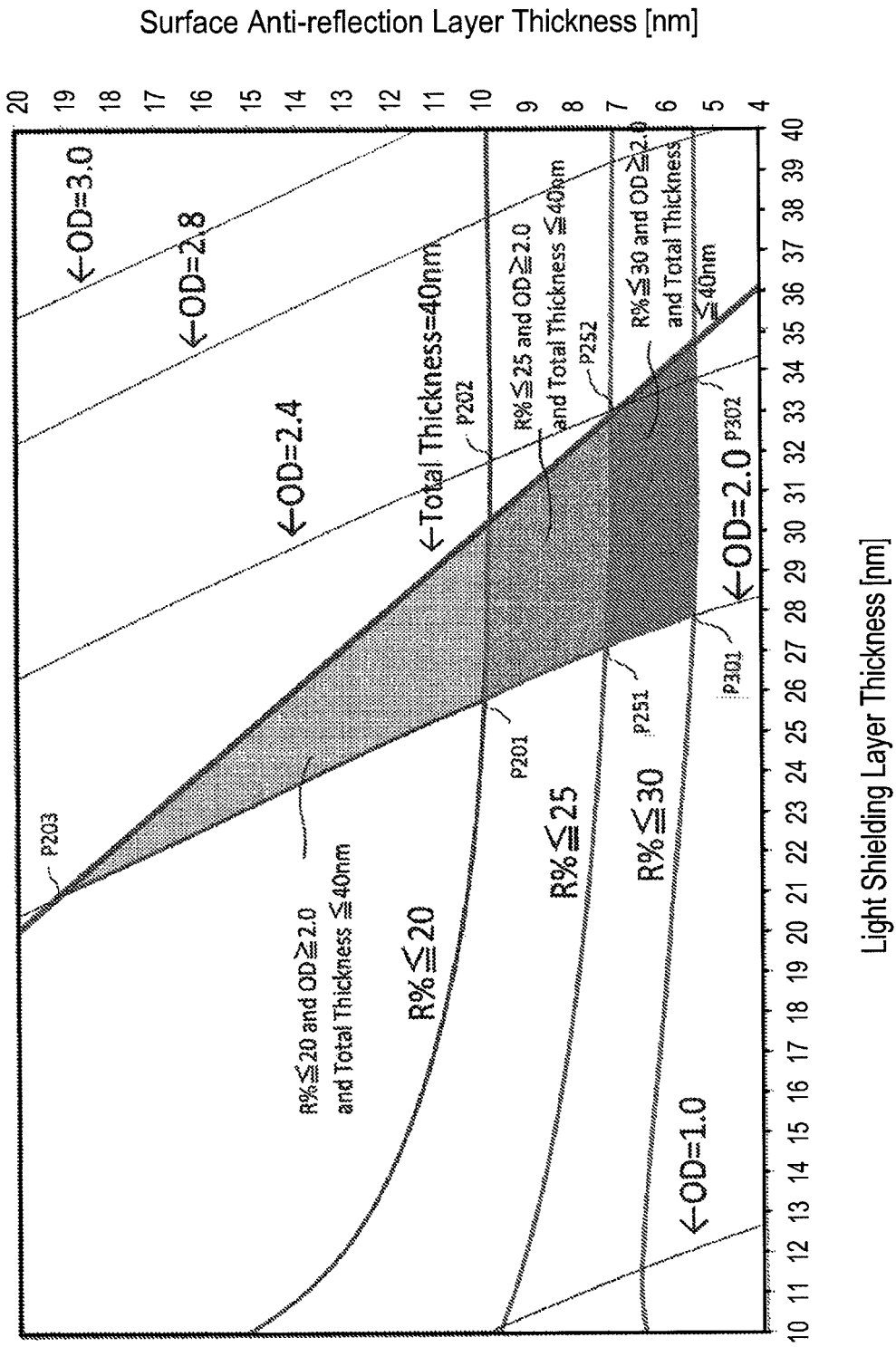
FIG. 24 is a view showing a result of optical simulation on calculation of optical density and surface reflectivity in film thickness of the light shielding film and the surface anti-reflection layer according to Example (6-2) of the present invention.

In Example (6-2), from the result of the optical simulation of FIG. 24, the thickness of the light shielding layer 11 was selected as 33 nm, the thickness of the surface anti-reflection layer was selected as 6 nm, and the light shielding film 10 was designed to have an optical density of 2.3 or more and the surface reflectivity of 30% or less.

Figure 25:
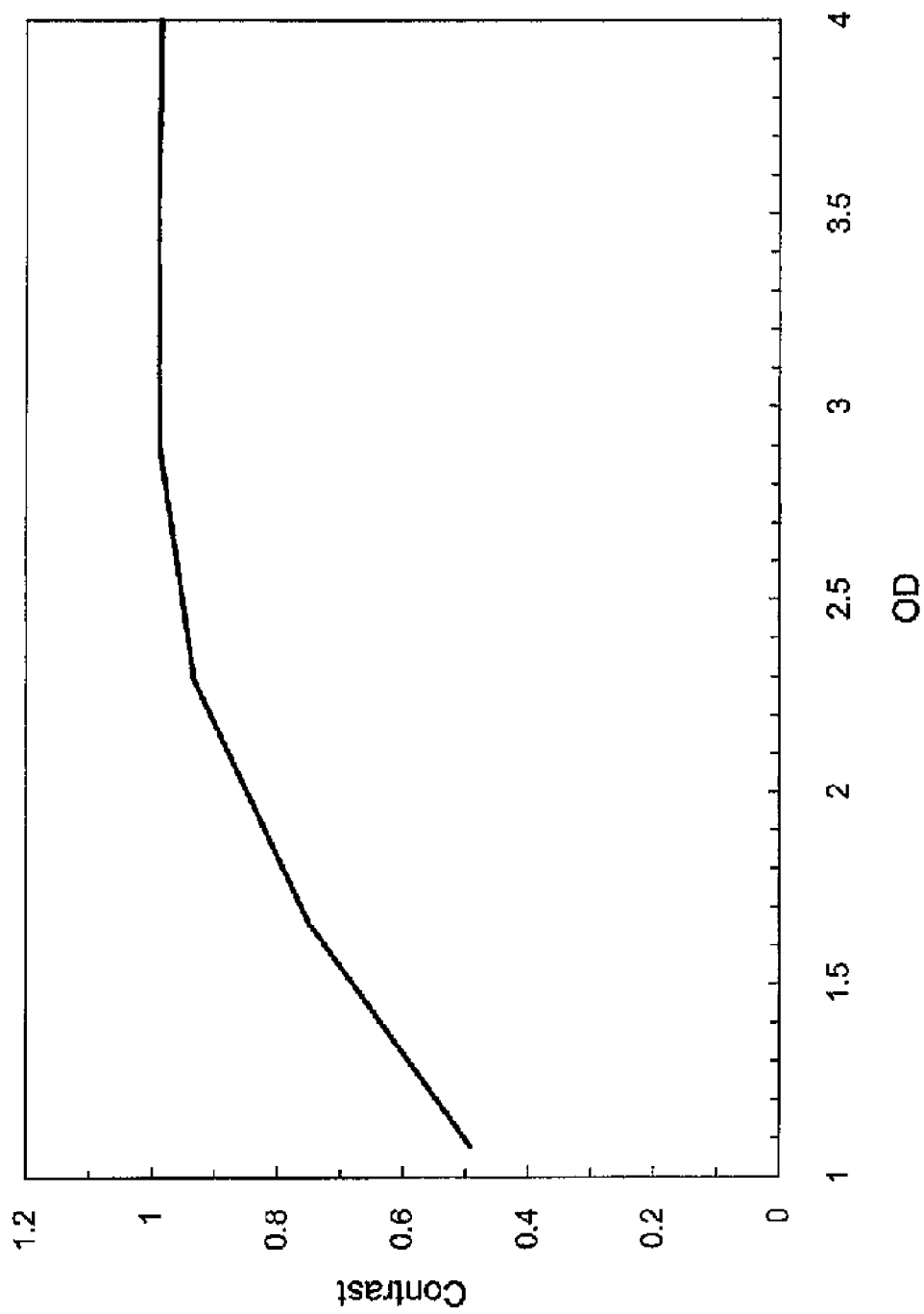
FIG. 25 is a view showing a result of optical simulation on calculation of a relationship between optical density and contrast of the light shielding film according to Example (6-2) of the present invention.

Next, a transfer mask was manufactured with the mask blank using the selected light shielding film 10 and it was checked through optical simulation whether or not a sufficient contrast was obtained when the manufactured transfer mask was exposed and transferred onto a resist on a wafer, like Example (4-1). A result of the check is shown in FIG. 25. From FIG. 25, it has been found that a good contrast of 0.8 or more can be achieved even for the optical density of 2.3.

Figure 26:
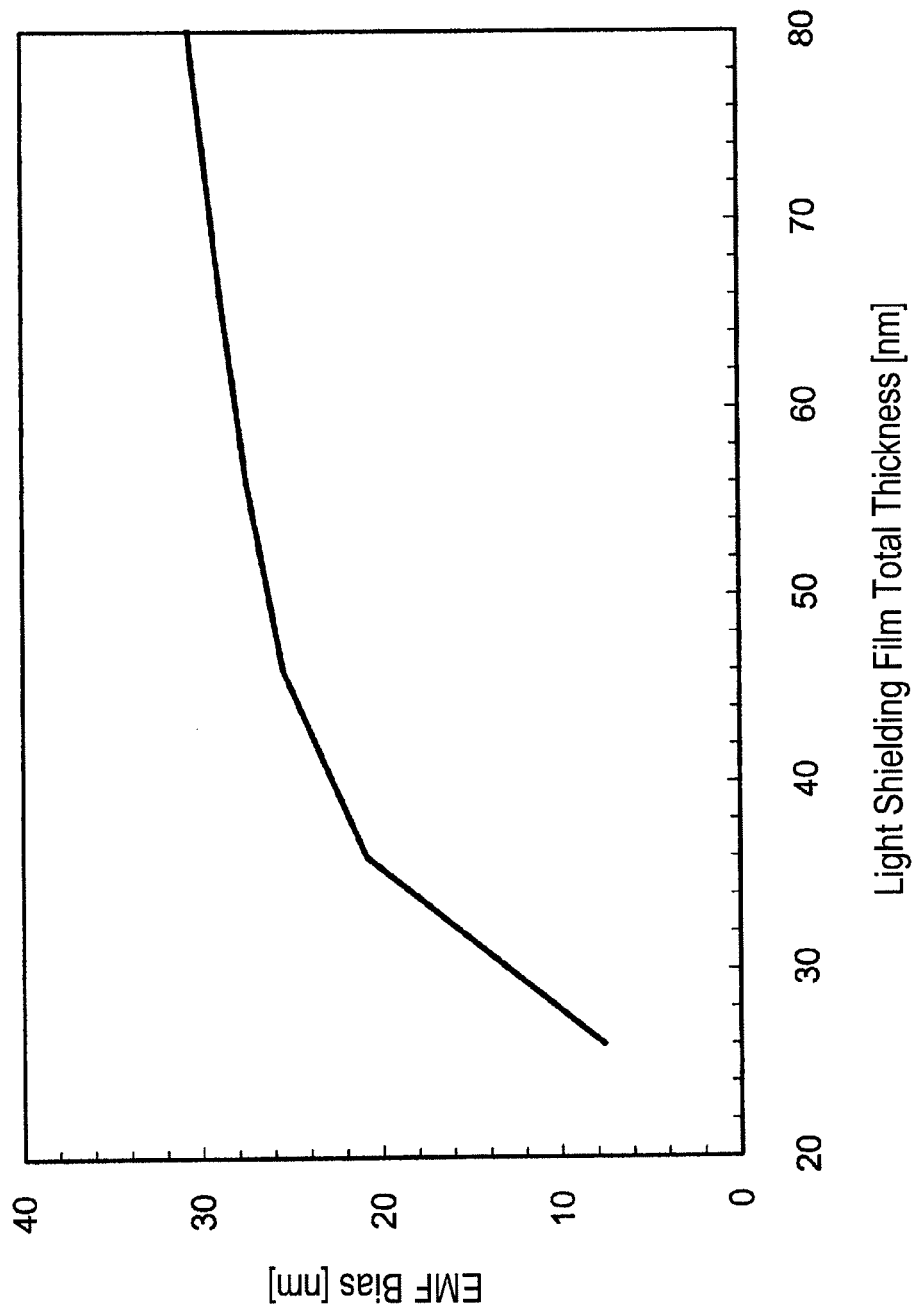
FIG. 26 is a view showing a result of optical simulation on calculation of an EMF bias in film thickness of the light shielding film according to Example (6-2) of the present invention.

Next, for the mask blank using the selected light shielding film 10, it was checked through the optical simulation whether or not an EMF bias was sufficiently reduced, like Example (4-1). However, the optical simulation was performed with the thickness of the surface anti-reflection layer fixed to 6 nm. A result of the check is shown in FIG. 26. From FIG. 26, it has been found that the light shielding film 10 having the total thickness of 40 nm or less has little sensitivity to the EMF effect as compared to the conventional light shielding film having the total thickness of 60 nm or so.

(Manufacture of a Mask Blank)

In Example (6-2), the same mask blank as Example (6-1) was manufactured except that the light shielding film 10 is replaced with the light shielding film 10 designed according to the result of the optical simulation of FIG. 24.

In Example (6-2), a TaN film (the light shielding layer 11) and a TaO film (the surface anti-reflection layer 12) were formed as the light shielding film 10 on the transparent substrate 1.

Specifically, a DC magnetron sputter was used and a Ta target was used to form a film c omprising tantalum nitride (Ta:93 atom % and N:7 atom %) at a film thickness of 33 nm under a mixture gas atmosphere of Ar and $N_2$, thereby forming the light shielding layer 11.

Next, a Ta target was used to form a film comprising tantalum oxide (Ta:42 atom % and O:58 atom %) at a film thickness of 6 nm under a mixture gas atmosphere of Ar and $O_2$, thereby forming the surface anti-reflection layer 12.

A refractive index (n) and an extinction coefficient (k) of the light shielding film 10 formed on the transparent substrate 1 were measured using an optical film characteristic measuring apparatus n&k 1280 (available from n&k Technologies). A result of the measurement showed that, in the light shielding film 10, the light shielding layer 11 has n=1.8 and k=2.4 and the surface anti-reflection layer 12 has n=2.2 and k=1.1. In addition, the optical density (OD) and the surface reflectivity for the light shielding film 10 were measured using a spectrophotometer U-4100 (available from Hitachi Hightechnologies). A result of the measurement showed that the optical density for ArF exposure light (having a wavelength of 193 nm) is 2.3 and the surface reflectivity is 27.9%. In addition, optical density was measured after the auxiliary light shielding film 20 was formed and a result of the measurement showed that the optical density of a multilayer structure of the light shielding film 10 and the auxiliary light shielding film 20 for ArF exposure light (having a wavelength of 193 nm) is 3.1.

Thus, a binary mask blank formed with the auxiliary light shielding film 20 and the light shielding film 10 for ArF excimer laser exposure and double exposure was obtained.

(Manufacture of a Transfer Mask)

A binary transfer mask set of Example (6-2) was manufactured using the binary mask blank of Example (6-2) in the same manner as Example (1-3).

Here, for a set of two mask design patterns generated by application of a double patterning technique to a design pattern of the DRAM hp 32 nm generation, a transfer pattern set generated with strict correction calculation in an EMF simulation as conventional and a transfer pattern set generated with correction calculation with a small computational load in a TMA simulation were prepared and the prepared transfer pattern sets were drawn to resist films 100 of the four manufactured binary mask blanks, respectively, thereby manufacturing a binary transfer mask set.

For the manufactured binary transfer mask set, the transfer patterns were exposed and transferred onto resist films of a wafer using an exposurer, respectively, and a result showed that all patterns are transferred with high precision. It could be confirmed that the mask blank of Example (6-2) can be used to manufacture a transfer mask having sufficient transferability even in the transfer patterns generated with correction calculation with a small computational load in a TMA simulation. In addition, it could be confirmed that sensitization of resist films on a wafer can be suppressed by a light shielding portion (light shielding band) 80 consisting of an auxiliary light shielding film pattern 20b and a light shielding film pattern 10a even for superimposing exposure up to eight times due to light leakage into peripheral regions.

Examples (6-3) and (6-4)

Examples (6-3) and (6-4) are similar to Examples (6-1) and (6-2) except that an etching mask (hard mask) film 30 and an adhesion enhancement layer 60, which are shown in Examples (1-4) and (1-6), are formed on the auxiliary light shielding film 20, as shown in FIG. 2.

In the aspects of Examples (6-3) and (6-4), since the auxiliary light shielding film and the etching mask film are divided as dedicated films, the etching mask film 30 can be thinner than the Cr-based auxiliary light shielding film 20 (also serving as an etching mask) of Examples (6-1) and (6-2), thereby thinning a resist.

Examples (6-5) and (6-6)

Examples (6-5) and (6-6) are similar to Examples (6-1) and (6-2) except that an etching mask (hard mask) film 30 and a second etching mask film 40, which are shown in Examples (1-7) and (1-9), are formed on the auxiliary light shielding film 20, as shown in FIG. 3.

In the aspects of Examples (6-5) and (6-6), employment of the chromium-based second etching mask film 40 achieves thinness and improved adhesion of a resist as compared to Examples (6-3) and (6-4).

Examples (6-7) and (6-8)

Examples (6-7) and (6-8) are similar to Examples (6-1) and (6-2) except that an auxiliary light shielding film 20 having a multilayer structure including an etching stopper and mask layer 21 and an auxiliary light shielding layer 22 is formed and an adhesion enhancement layer 60 is formed thereon, as shown in FIG. 4 and Examples (1-10) and (1-12).

In the aspects of Examples (6-7) and (6-8), the etching stopper and mask layer 21 for the light shielding film 10 can be thinned as compared to the Cr-based auxiliary light shielding film 20 (also serving as an etching mask) of Examples (6-1) and (6-2), thereby obtaining the light shielding film 10 with higher etching precision.

In the aspects of Examples (6-7) to (6-8), the auxiliary light shielding film 20 can be thinned at the same optical density as compared to the Cr-based auxiliary light shielding film 20 of Examples (6-1) and (6-2). The auxiliary light shielding film 20 having this small thickness allows a resist to be thinned as compared to the aspects of Examples (6-1) and (6-2).

Examples (6-9) and (6-10)

Examples (6-9) and (6-10) are similar to Examples (6-7) and (6-8) except that an etching mask film 70 is replaced with the adhesion enhancement layer 60, as shown in FIG. 5 and Examples (1-13) and (1-15).

In the aspects of Examples (6-9) and (6-10), employment of the chromium-based etching mask film 70 achieves thinness and improved adhesion of a resist as compared to Examples (6-7) and (6-8).

According to the present disclosure in some embodiments, it is possible to provide a mask blank and transfer mask manufactured using lithography applying ArF exposure light, which is capable of sufficiently overcoming many problems of the electromagnetic field (EMF) effect, which can be a problem for the generation in which the DRAM half pitch (hp) specified in semiconductor device design specifications is 32 nm and the later generations, and further problems of light leakage due to superimposing exposure, by securing a minimal optical density of a light shielding film to be thinned, the minimal optical density being required to form a transfer pattern in an object to be transferred (for example, a resist on a wafer, etc.), and securing an optical density of a light shielding band required to reduce an effect of light leakage due to superimposing exposure, the optical density being required depending on a multilayer structure of a light shielding film and an auxiliary light shielding film.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A mask blank for use in manufacturing a transfer mask to which ArF exposure light is applied, the mask blank comprising:
　　a light shielding film including a multilayer structure, the multilayer structure including a light shielding layer and a surface anti-reflection layer formed on a transparent substrate;
　　an auxiliary light shielding film formed on the light shielding film; and
　　an etching mask film formed on the auxiliary light shielding film,
　　wherein the light shielding film is made of material containing transition metal silicide or tantalum-based material,
　　wherein the auxiliary light shielding film is made of material containing chromium,
　　wherein the etching mask film is made of silicon oxide, silicon nitride or silicon oxynitride,
　　wherein the light shielding film has a thickness of 40 nm or less and an optical density of 2.0 or more to 2.7 or less for exposure light, and
　　wherein the auxiliary light shielding film has an optical density of 0.8 or more for exposure light.

2. The mask blank according to claim 1, wherein the surface anti-reflection layer has a thickness of 5 nm or more to 20 nm or less and a surface reflectivity of 30% or less for exposure light.

3. The mask blank according to claim 1, wherein the optical density is 3.1 or more for exposure light in the multilayer structure of the light shielding film and the auxiliary light shielding film.

4. The mask blank according to claim 1, wherein the light shielding layer contains transition metal silicide of 90% or more.

5. The mask blank according to claim 4, wherein the transition metal silicide in the light shielding layer is molybdenum silicide and a content of molybdenum is 9 atom % or more to 40 atom % or less.

6. The mask blank according to claim 1, wherein the auxiliary light shielding film is resistant to an etching gas used to etch the light shielding film.

7. The mask blank according to claim 1, wherein the auxiliary light shielding film contains at least one of nitrogen and oxygen in addition to chromium, a content of the chromium in the auxiliary light shielding film is 50 atom % or less, and a thickness of the auxiliary light shielding film is 20 nm or more.

8. A transfer mask manufactured using the mask blank according to claim 1.

9. The mask blank according to claim 1, wherein the etching mask film has a thickness of 5 nm or more to 20 nm or less.

10. The mask blank according to claim 1,
wherein the auxiliary light shielding film includes an auxiliary light shielding layer and an etching stopper and mask layer,
wherein the etching stopper and mask layer is interposed between the light shielding film and the auxiliary light shielding layer, and
wherein the etching stopper and mask layer is resistant to both of a first etching gas used to etch the light shielding film and a second etching gas used to etch the auxiliary light shielding layer.

11. The mask blank according to claim 1, wherein the etching stopper and mask layer contains at least one of nitrogen and oxygen in addition to chromium, a content of the chromium is 50 atom % or less in the etching stopper and mask layer, and a thickness of the etching stopper and mask layer is 5 nm or more to 20 nm or less.

12. The transfer mask according to claim 8,
wherein the light shielding film has a transfer pattern in a transfer pattern area, and
wherein the auxiliary light shielding film has a pattern of a light shielding band in a peripheral region of the transfer pattern area.

13. The mask blank according to claim 1, wherein the light shielding layer has a thickness of 15 nm or more to 35 nm or less.

14. The mask blank according to claim 1, wherein the auxiliary light shielding layer has a thickness of 20 nm or more to 40 nm or less.

* * * * *